(12) United States Patent
Epple et al.

(10) Patent No.: US 8,345,350 B2
(45) Date of Patent: Jan. 1, 2013

(54) CHROMATICALLY CORRECTED OBJECTIVE WITH SPECIFICALLY STRUCTURED AND ARRANGED DIOPTRIC OPTICAL ELEMENTS AND PROJECTION EXPOSURE APPARATUS INCLUDING THE SAME

(75) Inventors: Alexander Epple, Aalen (DE); Heiko Feldmann, Aalen (DE); Hans-Juergen Rostalski, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 535 days.

(21) Appl. No.: 12/621,239

(22) Filed: Nov. 18, 2009

(65) Prior Publication Data
US 2010/0128240 A1 May 27, 2010

Related U.S. Application Data

(63) Continuation-in-part of application No. 12/143,598, filed on Jun. 20, 2008, now abandoned.

(51) Int. Cl.
*G02B 17/00* (2006.01)
(52) U.S. Cl. ........ 359/364; 359/355; 359/648; 359/726; 355/67
(58) Field of Classification Search .................. None
See application file for complete search history.

(56) References Cited

U.S. PATENT DOCUMENTS

| | | | | |
|---|---|---|---|---|
| 5,329,363 A | * | 7/1994 | Moskovich | 348/781 |
| 5,638,475 A | * | 6/1997 | Gaebe | 385/93 |
| 6,088,171 A | * | 7/2000 | Kudo | 359/754 |
| 6,252,647 B1 | | 6/2001 | Shiraishi | |
| 6,636,350 B2 | | 10/2003 | Shafer et al. | |
| 6,665,126 B2 | | 12/2003 | Shafer et al. | |
| 6,909,492 B2 | | 6/2005 | Omura | |
| 6,995,833 B2 | | 2/2006 | Kato et al. | |
| 6,995,918 B2 | | 2/2006 | Terasawa et al. | |
| 7,362,508 B2 | | 4/2008 | Omura et al. | |
| 2003/0011755 A1 | | 1/2003 | Omura et al. | |
| 2004/0160677 A1 | | 8/2004 | Epple et al. | |
| 2006/0007532 A1 | * | 1/2006 | Shafer | 359/365 |
| 2006/0050261 A1 | | 3/2006 | Brotsack | |
| 2008/0165336 A1 | | 7/2008 | Omura et al. | |

(Continued)

FOREIGN PATENT DOCUMENTS

EP  1 069 448 A1  1/2001

(Continued)

*Primary Examiner* — Arnel C Lavarias
(74) *Attorney, Agent, or Firm* — Sughrue Mion, PLLC

(57) ABSTRACT

An objective having a plurality of optical elements arranged to image a pattern from an object field to an image field at an image-side numerical aperture NA>0.8 with electromagnetic radiation from a wavelength band around a wavelength $\lambda$ includes a number N of dioptric optical elements, each dioptric optical element i made from a transparent material having a normalized optical dispersion $$\Delta n_i = n_i(\lambda_0) - n_i(\lambda_0 + 1 \text{ pm})$$

for a wavelength variation of 1 pm from a wavelength $\lambda_0$. The objective satisfies the relation $$\frac{\left| \sum_{i=1}^{N} \Delta n_i (s_i - d_i) \right|}{\lambda_0 NA^4} \leq A$$

for any ray of an axial ray bundle originating from a field point on an optical axis in the object field, where $s_i$ is a geometrical path length of a ray in an ith dioptric optical element having axial thickness $d_i$ and the sum extends on all dioptric optical elements of the objective. Where A=0.2 or below, spherochromatism is sufficiently corrected.

42 Claims, 25 Drawing Sheets

U.S. PATENT DOCUMENTS

2009/0316256 A1* 12/2009 Epple et al. .................. 359/364

FOREIGN PATENT DOCUMENTS

| | | |
|---|---|---|
| EP | 1 480 065 A2 | 11/2004 |
| GB | 2428491 A | 1/2007 |
| JP | 2007305821 A | 11/2007 |
| WO | 2005/040890 A2 | 5/2005 |
| WO | 2006013734 A1 | 2/2006 |
| WO | 2008064845 A1 | 6/2008 |

* cited by examiner

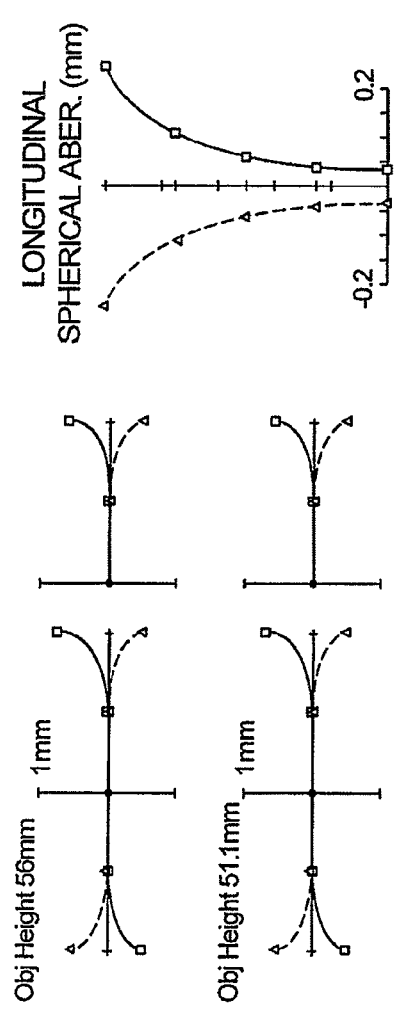
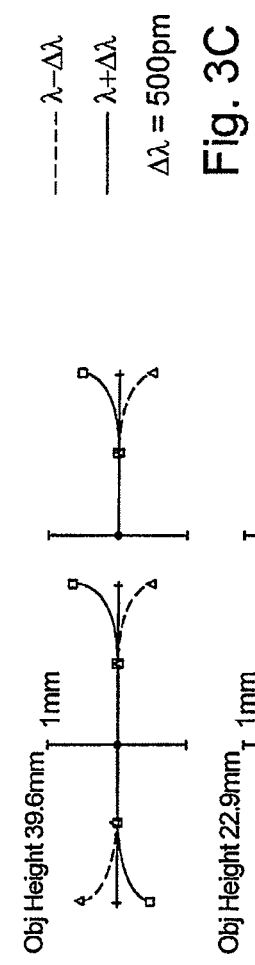
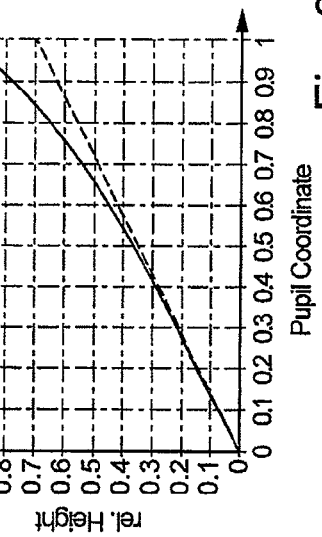
Fig. 3D
Fig. 3C
Fig. 3B

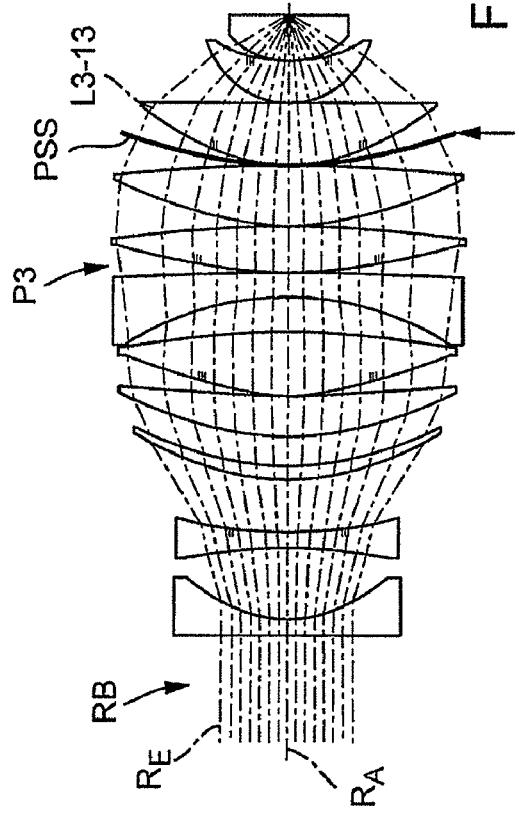
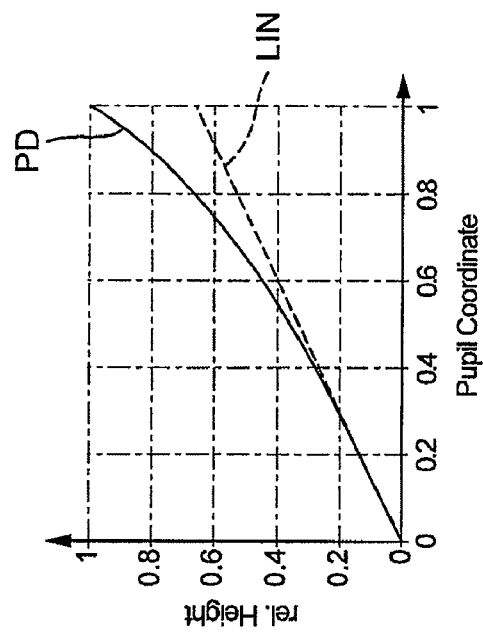
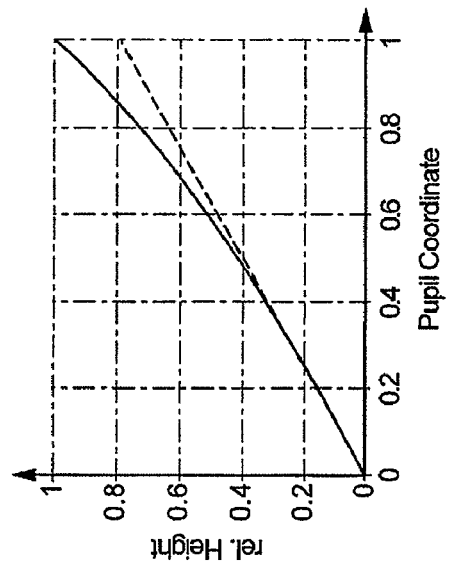
Fig. 4A
Fig. 4B

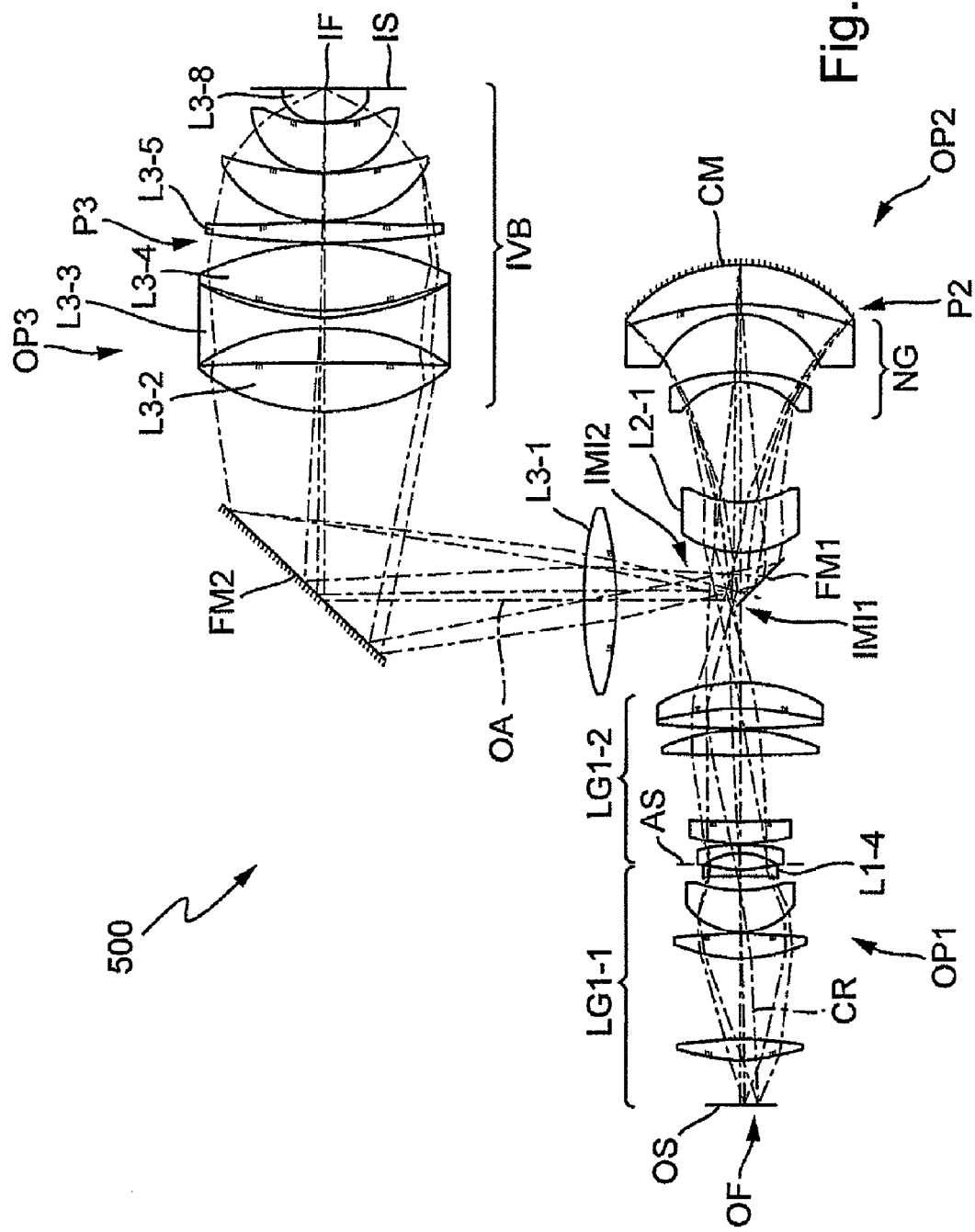

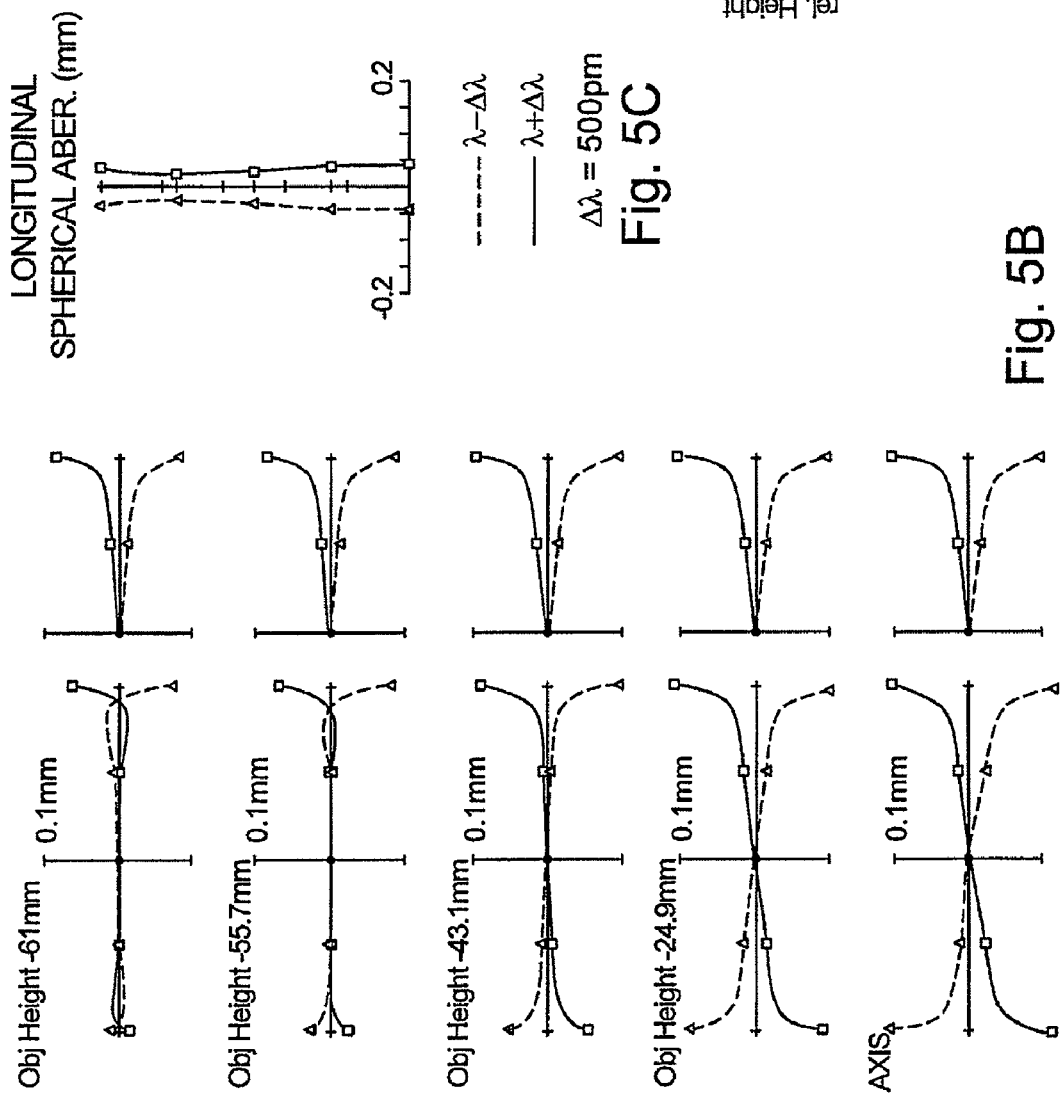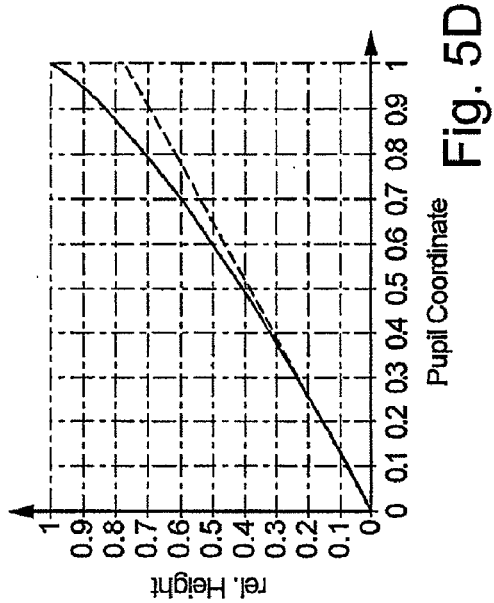

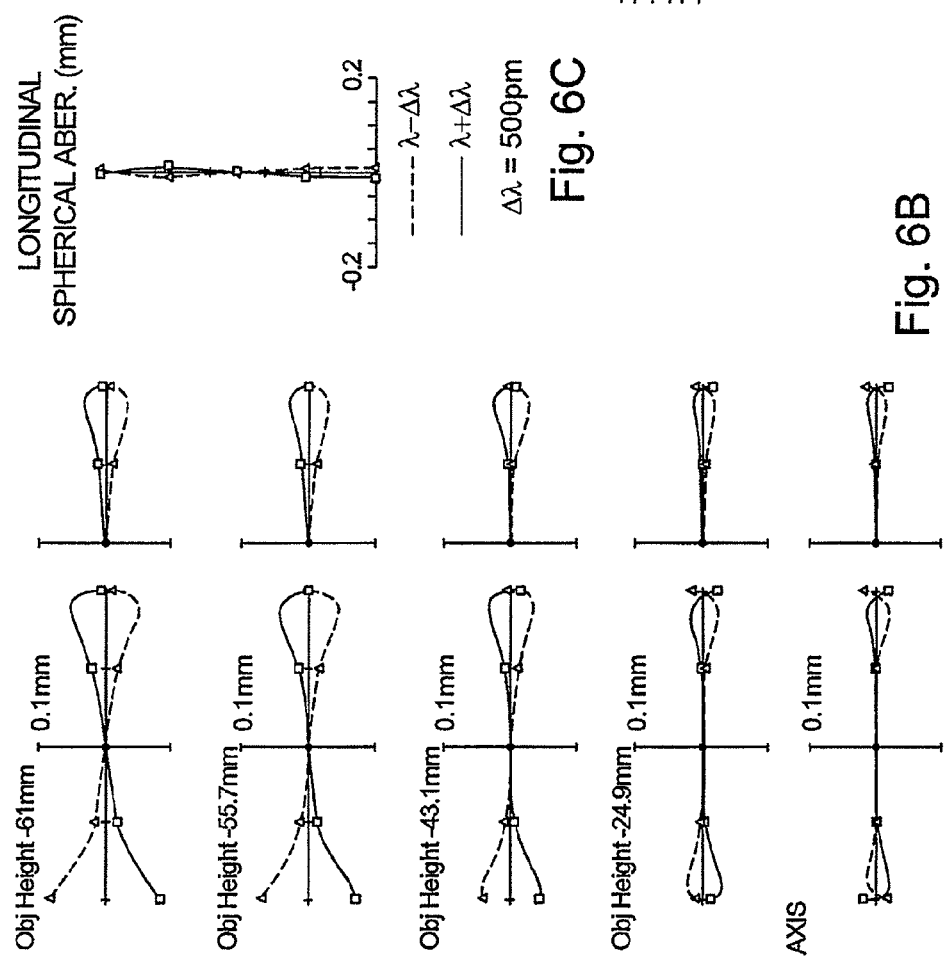

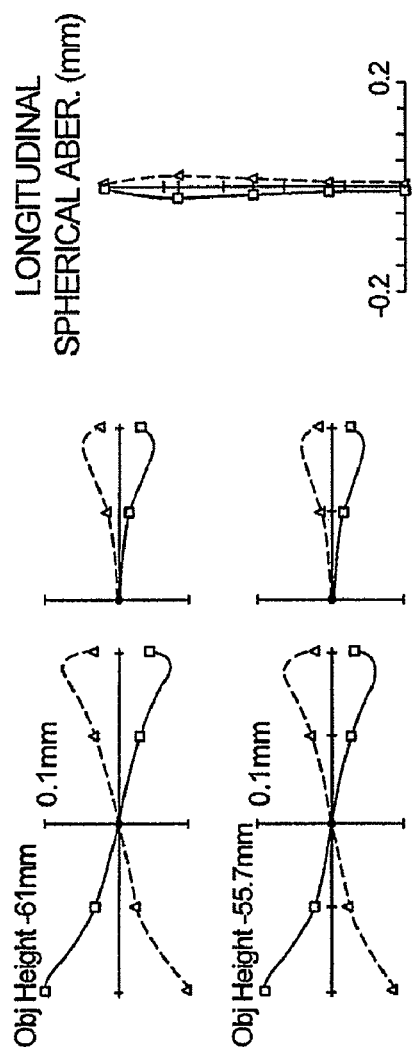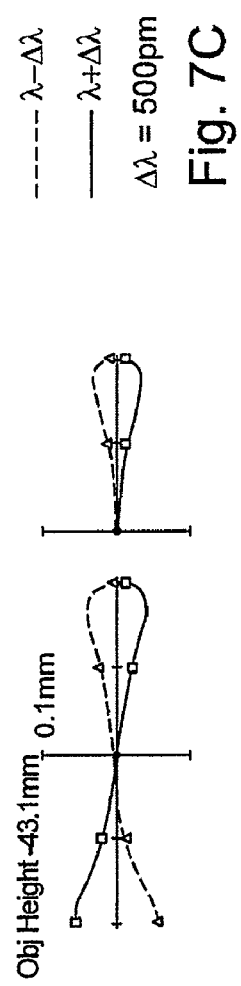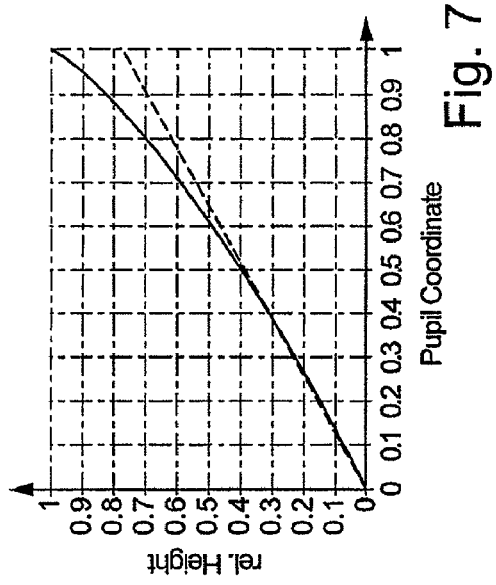

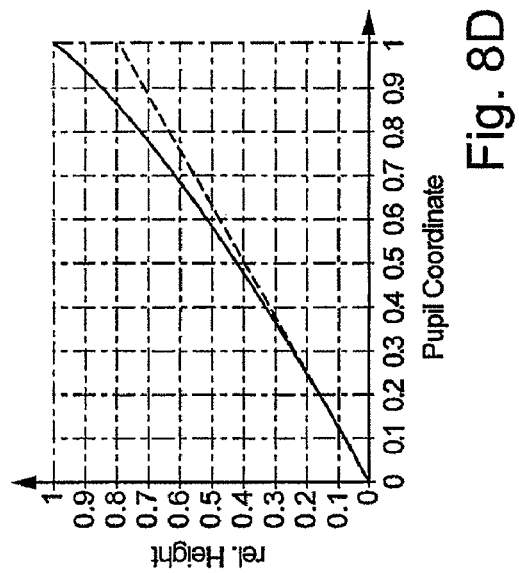
Fig. 8D
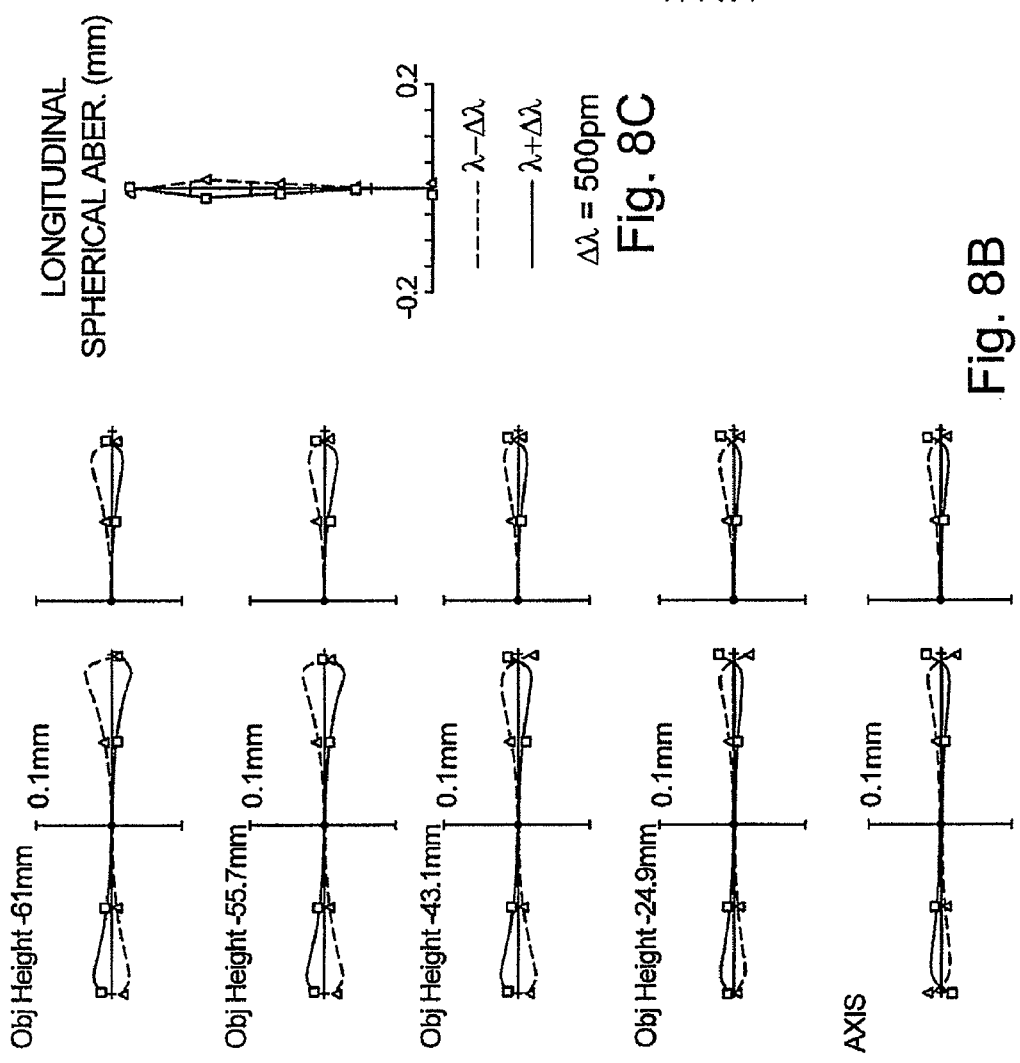
Fig. 8C
Fig. 8B

Obj Height -61mm

Obj Height -53.1mm

Obj Height -31.7mm

Obj Height -9.89mm

AXIS

LONGITUDINAL SPHERICAL ABER. (mm)

----- $\lambda - \Delta\lambda$

——— $\lambda + \Delta\lambda$ $\Delta\lambda = 500$ pm

CHROMATICALLY CORRECTED OBJECTIVE WITH SPECIFICALLY STRUCTURED AND ARRANGED DIOPTRIC OPTICAL ELEMENTS AND PROJECTION EXPOSURE APPARATUS INCLUDING THE SAME

This is a continuation-in-part application of application Ser. No. 12/143,598, filed on Jun. 20, 2008, the complete disclosure of which, including amendments, is incorporated into this application by reference.

BACKGROUND OF THE INVENTION

1. Field of the Invention

The invention relates to an objective. The objective may be configured as a projection objective which may be used in a microlithographic projection exposure apparatus to expose a radiation-sensitive substrate arranged in the region of an image surface of the projection objective with at least one image of pattern of a mask that is arranged in the region of an object surface of the projection objective. The invention also relates to a projection exposure apparatus which includes such objective.

2. Description of the Related Art

Microlithographic projection exposure methods and apparatus are used to fabricate semiconductor components and other finely patterned components. A microlithographic exposure process involves using a mask (reticle) that carries or forms a pattern of a structure to be imaged, for example a line pattern of a layer of a semiconductor component. The pattern is positioned in a projection exposure apparatus between an illumination system and a projection objective in a region of the object surface of the projection objective. Primary radiation from the ultraviolet electromagnetic spectrum (UV radiation) is provided by a primary radiation source and transformed by optical components of the illumination system to produce illumination radiation directed at the pattern of the mask. The radiation modified by the mask and the pattern passes through the projection objective, which forms an image of the pattern in the image surface of the projection objective, where a substrate to be exposed is arranged. The substrate, e.g. a semiconductor wafer, normally carries a radiation-sensitive layer (photoresist).

Various types of primary radiation sources are currently used in the field of microlithography. In some cases, a laser is used as primary radiation source. A natural bandwidth of the laser may be narrowed by appropriate bandwidth narrowing devices. For example, a natural bandwidth of about $\Delta\lambda=500$ pm may be reduced by three orders of magnitude to obtain radiation having a bandwidth $\Delta\lambda\approx0.5$ pm used for the exposure. Where radiation with a relatively small bandwidth is used for the exposure, chromatic aberrations caused by the optical elements of the projection objective may be kept relatively small without specific efforts for chromatic correction (correction of chromatic aberrations).

The situation is different in microlithographic systems having primary radiation source emitting ultraviolet radiation from a relatively broad wavelength band. For example, a mercury vapour lamp or a light emitting diode (LED) may be used as primary radiation source. Specifically, projection exposure systems having a central wavelength $\lambda=365.5$ nm$\pm2$ nm (so-called i-line system) have been in use for a long time. Those systems utilize the i-line of a mercury vapour lamp, the natural bandwidth thereof being limited to a narrower utilized band width $\Delta\lambda$ of about 2 nm with the aid of filters or in some other way. Other spectral lines of a mercury vapour lamp may also be used for exposure, such as the mercury h-line at about 405 nm and the mercury g-line at about 436 nm. The electromagnetic spectrum of each of the lines is relatively broad, thereby requiring that the projection objective should provide a relatively efficient correction of chromatic aberrations in order to ensure low-aberration imaging even with such broad band radiation at the required resolution. Chromatic correction is also required if it is desired to use a laser source at the natural line width or a laser source having only moderate line width narrowing.

Chromatic aberrations occur basically because of the fact that the index of refraction, n, of transparent optical materials varies as a function of the wavelength $\lambda$. In general, the index of refraction (or refractive index) of transparent optical materials is higher for shorter wavelength than for longer wavelength. Chromatic aberrations may be subdivided into different categories. A first category of chromatic aberrations includes deviations of axial position, shape and/or size of images formed at different wavelength from an ideal image. This accounts for the fact that an image is formed for each wavelength in a paraxial region, and the images usually differ in position and size. The chromatic aberrations of the first category are usually referred to as "axial chromatic aberration" (or axial color, AX) and "chromatic difference of magnification" (or lateral color, LAT).

Axial chromatic aberration is the longitudinal variation of paraxial focus (or image position) with wavelength. Where the index of refraction of an optical material is higher for shorter wavelength than for longer wavelength, the short wavelengths are more strongly refracted at each surface of a lens element so that, in a simple positive lens, for example, the relatively shorter wavelength rays are brought to a focus closer to the lens than the relatively longer wavelength rays. The paraxial distance along the optical axis of the lens between the two focus points is the axial chromatic aberration. When the shorter wavelength rays are brought to focus closer to the positive lens than the longer wavelength rays, the longitudinal axial chromatic aberration is usually termed "undercorrected" or "negative".

When a lens system forms images of different sizes for different wavelengths, the difference between the paraxial image heights for different colors is usually denoted lateral color or chromatic difference of magnification.

The chromatic variation of the index of refraction also produces a variation of monochromatic aberrations, which may be summarized in a second category of chromatic aberrations. The variation of monochromatic aberrations include the chromatic variation of spherical aberration (also denoted spherochromatism), the chromatic variation of coma, the chromatic variation of astigmatism, the chromatic variation of distortion and the chromatic variation of image field curvature.

SUMMARY OF THE INVENTION

It is one object of the invention to provide an objective useful for microlithography which may be operated with ultraviolet radiation provided by a broadband radiation source.

It is another object of the invention to provide an objective useful for microlithography which generates an image with sufficient contrast for coarse and fine structures when operated with ultraviolet radiation provided by a broadband radiation source.

It is another object of the invention to provide an objective having a good correaction status with respect to chromatic variation of spherical aberration.

To address these and other objects the invention, according to one formulation of the invention, provides an objective comprising:
a plurality of optical elements arranged to image a pattern from an object field in an object surface of the objective to an image field in an image surface region of the objective at an image-side numerical aperture NA>0.8 with electromagnetic radiation from a wavelength band around a wavelength λ, the optical elements including a number N of dioptric optical elements, each dioptric optical element i made from a transparent material having a normalized optical dispersion $$\Delta n_i = n_i(\lambda_0) - n_i(\lambda_0 + 1 \text{ pm})$$

for a wavelength variation of 1 pm from a wavelength $\lambda_0$, wherein the objective satisfies the relation $$\frac{\left|\sum_{i=1}^{N} \Delta n_i (s_i - d_i)\right|}{\lambda_0 NA^4} \leq A$$

for any ray of an axial ray bundle originating from a field point on an optical axis in the object field;
where $s_i$ is a geometrical path length of a ray in an ith dioptric optical element having axial thickness $d_i$ and the sum extends on all dioptric optical elements of the objective, and where

A=0.2.

According to another formulation, the invention provides an objective comprising:
a plurality of optical elements arranged to image a pattern from an object field in an object surface of the objective to an image field in an image surface region of the objective at an image-side numerical aperture NA>0.8 with electromagnetic radiation from a wavelength band around a wavelength λ, the optical elements including optical elements forming a focussing lens group imaging a field surface closest to the image surface onto the image surface,
wherein a maximum value of pupil distortion, $PD_{MAX}$=Max (Dp) within the focusing lens group is less than 20%, where a normalized pupil distortion $D_P = V/NA^3$ and V is the pupil distortion at a maximum value of image-side NA for which the objective is sufficiently corrected, where V at a given position is given by a difference between an actual ray height RH and a paraxial ray height PRH, normalized by the paraxial ray height PRH according to V=(RH−PRH)/PRH.

The upper limit for the pupil distortion may be smaller than that, for example $PD_{MAX}$<17% or $PD_{MAX}$<15% or below.

It has been found that objectives having dioptric optical elements structured and arranged to obey the above condition have a level of spherochromatism (i.e. chromatic variation of spherical aberration) significantly lower than conventional objectives having comparable image-side NA values and image field size values and allow the formation of images of patterns with high contrast both in a central region of the image field around the optical axis and near the outer edges of extended image field. Considerations underlying the specified structures of objectives may be understood from the following.

A ray of radiation covering a geometrical distance s through an optical medium having refractive index n at a wavelength $\lambda_o$ travels along an optical path with an optical path length OP according to:

$$OP = n \cdot s \quad (1)$$

A change of wavelength λ of the radiation by a wavelength difference Δλ causes the optical path length of the ray in the medium to change by a corresponding chromatic optical path difference, $OPD_C$, which may be described by the following relation, $$OPD_C = (n + \delta \cdot \Delta \lambda) \cdot s - n \cdot s = \delta \cdot \Delta \lambda \cdot s, \quad (2)$$

where $$\delta = dn/d\lambda \quad (3)$$

characterizes the dispersion of the medium. The dispersion may also be described by a normalized optical dispersion Δn according to $$\Delta n = \delta \cdot \Delta \lambda, \quad (4)$$

wherein the wavelength difference may be defined by a finite value, e.g. Δλ=1 pm (i.e. 1 picometer). In an optical system having a number i of dioptric optical elements transilluminated by a ray of radiation the overall chromatic optical path difference $OPD_C$ accumulated along that optical path in a number of N dioptric optical elements may be written as:

$$OPD_C = \Delta\lambda \cdot \sum_{i=1}^{N} \delta_i s_i, \quad (5)$$

wherein the sum includes all the dioptric optical elements i= 1 . . . N. Note that the dioptric optical elements may all be made from the same material, but also may be made from different materials, characterized by the specific values $\delta_i$ for each of the dioptric optical elements. This consideration assumes that the light rays both at λ and at λ+Δλ travel along the same path in the optical system. This is true for Δλ approaching zero, and still a good approximation for small values of Δλ. For example, at λ=193 the approximation is valid for Δλ in the order of several picometers (pm).

No variations of the wavefront with a change in wavelength occur if all the single rays of a ray bundle have exactly the same chromatic optical path difference $OPD_C$. This corresponds to a situation where all the chromatic aberrations are fully corrected. If this condition is not fulfilled, then the wavefront and the chromatic aberrations of the optical system will vary with the wavelength, which is expressed by specific non-zero values for chromatic aberrations.

In the following, the above equation (5) regarding $OPD_C$ will be further analyzed for an axial ray bundle, i.e. a bundle of rays originating from a field point on an optical axis in the object field. This representative ray bundle is chosen exemplarily because in many prior art objectives, the chromatic aberration limiting the optical performance is given for the region of the optical axis, for example, the axial chromatic aberration (or axial colour, AX), and also the chromatic variation of spherical aberration. For reasons of symmetry the chromatic optical path difference $OPD_C$ of a ray corresponding to a positive entrance pupil coordinate has the same value as the ray originating from a corresponding negative entrance pupil coordinate. Specifically, it is considered that the chromatic optical path difference is rotationally symmetric about a symmetry centre in the entrance pupil. Therefore, the variation of chromatic optical path difference can only vary in even powers with the ray height in the entrance pupil, wherein the height of a ray is the radial distance of the ray from the optical axis. A quadratic variation of the chromatic optical path difference $OPD_C$ with the coordinate in the entrance pupil leads to a defocus when the wavelength is changed. This defocus corresponds to the axial chromatic aberration AX.

Variations of chromatic optical path difference with higher even orders, such as the fourth order or sixth order etc. of the entrance pupil coordinate then correspond to a chromatic variation of spherical aberration, also denoted as spherochromatism (SPHC).

It is important to note that the axial chromatic aberration AX and the chromatic variation of spherical aberration (spherochromatism, SPHC) should be treated as separate entities characterizing different aspects of the chromatic performance of an optical system. This fact is practically relevant since the means for correcting axial chromatic aberration may generally differ from the means for correcting chromatic variation of spherical aberration. With other words: technical measures effective for correcting axial chromatic aberration may generally not be equally effective or effective at all when it comes to correaction of chromatic variation of spherical aberration, and vice versa. However, it has been found that the axial chromatic aberration as well as the chromatic variation of spherical aberration should both be corrected within certain limits if a chromatically corrected imaging with radiation from a relatively broad band radiation source is desired. With other words: in order to obtain a wavefront sufficiently corrected for chromatic aberrations in an optical imaging system, both the axial chromatic aberration and the chromatic variation of spherical aberration should be sufficiently corrected.

According to one aspect of the present disclosure, the chromatic correction will be regarded as sufficient, if the chromatic optical path difference $OPD_C$ for all rays of the axial ray bundle is changing in substantially the same way as the wavelength varies within the wavelength band under consideration.

Since a constant change of chromatic optical path difference with wavelength will only result in a global offset in the image surface, which is not relevant for the image formation, the problem of correction may be approached by subtracting, from each optical path of a ray of the axial ray bundle, the chromatic optical path difference of a reference ray running along the optical axis. Based on these considerations the above criterion (substantially the same change of chromatic optical path difference for all rays of the axial ray bundle upon change of wavelength) may be approached as follows. Consider that $\delta_i$ is the dispersion of the material of the $i^{th}$ optical element, $s_i$ is the geometrical path length of a ray in the $i^{th}$ optical element at the main wavelength $\lambda_o$ and $\Delta\lambda$ is the characteristic band width of a light source:

$$\Delta n_i = \delta_i \cdot \Delta\lambda \qquad (6)$$

Further, it is defined here that $OPD^o_C$ is the chromatic optical path difference of a chief ray resulting from the change of refractive index according to equation (6). Further, the general chromatic optical path difference $OPD_C$ of a random ray of the axial ray bundle for the given wavelength band may be written as:

$$OPD_C = \sum_{i=1}^{N} d_i \cdot \Delta n_i \qquad (7)$$

In this notation, the following equation $$|OPD_C - OPD_C^o|_{\Delta\lambda = 1pm}/\lambda_0 < A' \qquad (8)$$

represents the requirement that all the chromatic optical path differences of different rays of the axial ray bundle will change substantially by the same amount upon a change of wavelength or, in other words, the differences of chromatic optical path differences between different rays of the axial ray bundle may not exceed a certain limiting value A' in order to obtain sufficient chromatic correction for both the axial chromatic aberration and the chromatic variation of spherical aberration within the axial ray bundle for a normalized wavelength difference $\Delta\lambda=1$ pm in the wavelength band.

Studies of the inventor show that the degree of chromatic variation of spherical aberration typically increases strongly as the image-side numerical aperture NA is increased to such an extent that the chromatic variation of spherical aberration may become a limiting aberration for objectives with very high image-side NA values, such as, for example, $NA \geq 0.8$ or $NA \geq 0.9$ or $NA \geq 1.0$, which latter values may be obtained in immersion systems. The chromatic variation of spherical aberration may be described as depending from the image-side numerical aperture to the power of four ($NA^4$), which allows to define a limiting value $$A = A'/(NA^4) \qquad (9)$$

describing the chromatic variation of spherical aberration independent of the NA value of the objective. Therefore, in an objective with dioptric elements made from transparent materials having a normalized optical dispersion $$\Delta n_i = n_i(\lambda_0) - n_i(\lambda_0 + 1 \text{ pm}) \qquad (10)$$

for a wavelength variation of 1 pm from a wavelength $\lambda_o$, the objective should satisfy the relation $$\frac{\left|\sum_{i=1}^{N} \Delta n_i (s_i - d_i)\right|}{\lambda_0 NA^4} \leq A \qquad (11)$$

for any ray of an axial ray bundle originating from a field point on an optical axis in the object field, if spherochromatism shall be corrected to a sufficient degree. In equation (11) $s_i$ is a geometrical path length of a ray in an $i^{th}$ dioptric optical element having axial thickness $d_i$ and the sum extends on all dioptric optical elements of the objective. Embodiments with NA>1 and sufficient correction of spherochromatism may be characterized by A=0.2.

The upper limit A may be smaller in some embodiments, for example A=0.15 or even A=0.10 or A=0.05, indicating very low levels of axial chromatic aberration and spherochromatism.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 4 shows in 4A an image-side end portion of a projection objective having a significant amount of pupil distortion and in 4B an image-side end portion of a projection objective having a relatively smaller amount of pupil distortion;

FIG. 14 shows selected rays of a beam passing through the projection objective in a region near the first and second deflecting mirrors to illustrate the extent of regions of caustic conditions at the intermediate images, wherein

DETAILED DESCRIPTION OF THE PREFERRED EMBODIMENTS

In the following description of preferred embodiments, the term "optical axis" refers to a straight line or a sequence of straight-line segments passing through the centers of curvature of optical elements. The optical axis can be folded by folding mirrors (deflecting mirrors) such that angles are included between subsequent straight-line segments of the optical axis. In the examples presented below, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Where tables are provided to disclose the specification of a design shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the radiation propagation direction).

Figure 1:
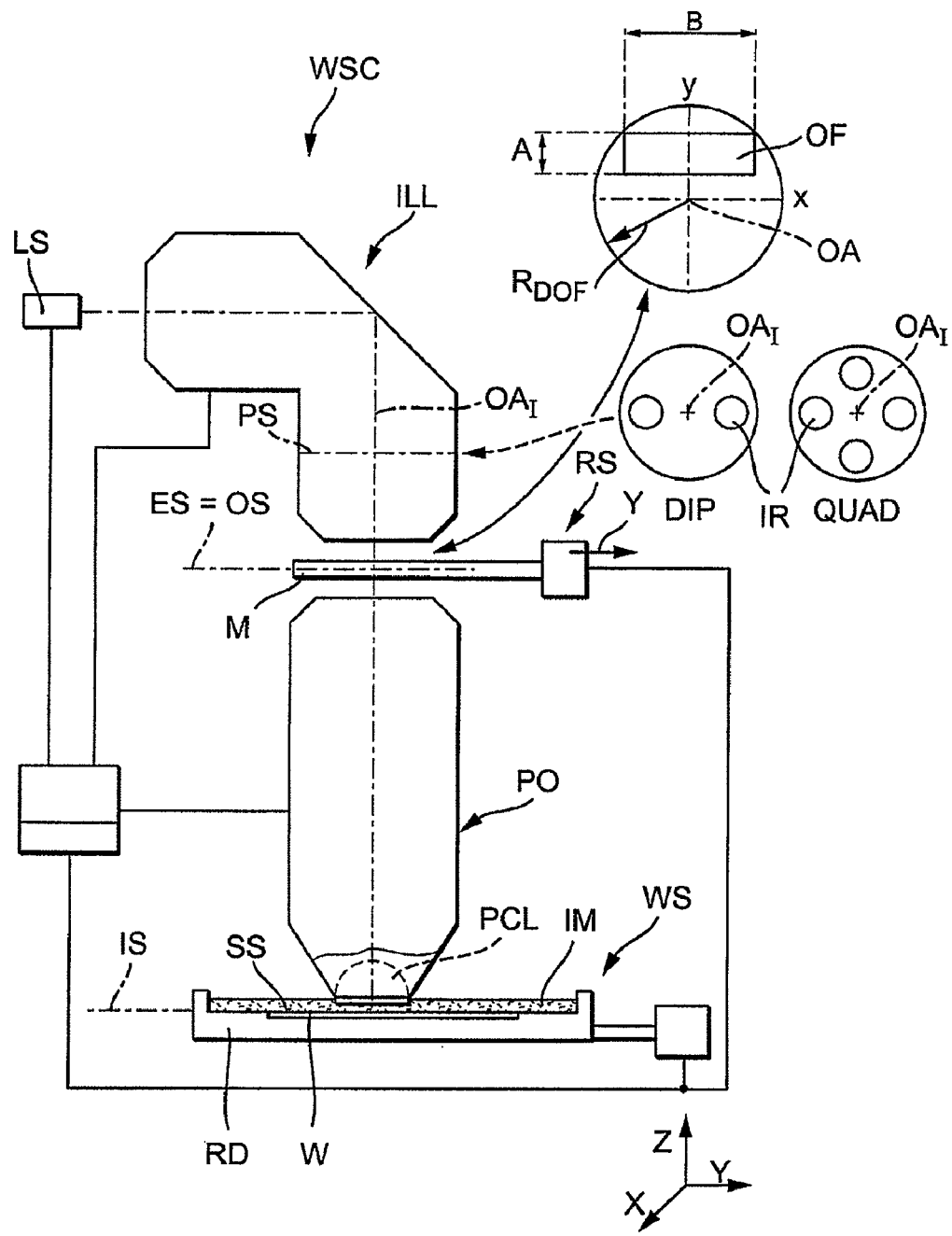
FIG. 1 shows a schematic drawing of an embodiment of a projection exposure apparatus for microlithography having an illumination system and a projection objective.

FIG. 1 shows schematically a microlithographic projection exposure system in the form of a wafer scanner WSC, which is provided for fabricating large scale integrated semiconductor components by means of immersion lithography in a step-and-scan mode. The projection exposure system comprises an Excimer laser as light source LS having an operating wavelength of 193 nm. Other operating wavelengths, for example 157 nm or 248 nm, are possible. A downstream illumination system ILL generates, in its exit surface ES, a large, sharply delimited, homogeneously illuminated illumination field arranged off-axis with respect to the optical axis of the projection objective PO (which is coaxial with optical axis $OA_I$ of the illumination system in embodiments) and adapted to the telecentric requirements of the downstream catadioptric projection objective PO. Specifically, the exit pupil of the illumination system coincides with the entrance pupil of the projection objective for all field points.

The multi-axis projection objective is shown schematically only to facilitate illustration. The illumination system ILL has devices for selecting the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

A device RS for holding and manipulating a mask M is arranged between the exit-side last optical element of the illumination system and the entrance of the projection objective such that a pattern—arranged on or provided by the mask—of a specific layer of the semiconductor component to be produced lies in the planar object surface OS (object plane) of the projection objective, said object plane coinciding with the exit plane EX of the illumination system. The device RS—usually referred to as "reticle stage"—for holding and manipulating the mask contains a scanner drive enabling the mask to be moved parallel to the object surface OS of the projection objective or perpendicular to the optical axis (z direction) of projection objective and illumination system in a scanning direction (y-direction) for scanning operation.

The size and shape of the illumination field provided by the illumination system determines the size and shape of the effective object field OF of the projection objective actually used for projecting an image of a pattern on a mask in the image surface of the projection objective. The slit-shaped effective object field has a height A parallel to the scanning direction and a width B>A perpendicular to the scanning direction and may be rectangular (as shown in the inset figure) or arcuate (ring field). An aspect ratio B/A may be in a range from B/A=2 to B/A=10, for example. The same applies for the illumination field. A circle with minimum radius $R_{DOF}$ around the effective object field and centred about the optical axis OA of the projection objective indicates the design object field including field points sufficiently corrected for aberrations to allow imaging with a specified performance and free of vignetting. The effective object field includes a subset of those field points.

The reduction projection objective PO is telecentric at the object and image side and designed to image a pattern provided by the mask with a reduced scale of 4:1 onto a wafer W coated with a photoresist layer. Other reduction scales, e.g. 5:1 or 8:1 are possible. The wafer W serving as a light-sensitive substrate is arranged in such a way that the planar substrate surface SS with the photoresist layer essentially coincides with the planar image surface IS of the projection objective. The wafer is held by a device WS (wafer stage) comprising a scanner drive in order to move the wafer synchronously with the mask M in parallel with the latter, and with reduced speed corresponding to the reduction ratio of the projection objective. The device WS also comprises manipulators in order to move the wafer both in the Z direction parallel to the optical axis OA and in the X and Y directions perpendicular to said axis. A tilting device having at least one tilting axis running perpendicular to the optical axis is integrated.

The device WS provided for holding the wafer W (wafer stage) is constructed for use in immersion lithography. It comprises a receptacle device RD, which can be moved by a scanner drive and the bottom of which has a flat recess for receiving the wafer W. A peripheral edge forms a flat, upwardly open, liquid-tight receptacle for a liquid immersion medium IM, which can be introduced into the receptacle and discharged from the latter by means of devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has an immersion lens group formed by a plano-convex lens PCL, which is the last optical element nearest to the image surface IS. The planar exit surface of said lens is the last optical surface of the projection objective PO. During operation of the projection exposure system, the exit surface of the plano-convex lens PCL is partly or completely immersed in the immersion liquid IM and is wetted by the latter. In the exemplary case the immersion liquid has a refractive index $n_I \approx 1.65$ at 193 nm. The convex entry surface of plano-convex lens PCL is adjacent to a gas filling the space between this lens and a lens immediately upstream thereof on the object-side. The plano-convex lens forms a monolithic immersion lens group allowing the projection objective to operate at NA>1 in an immersion operation.

In this application, the term "immersion lens group" is used for a single lens or a lens group including at least two cooperating optical elements providing a convex object-side entry surface bounding at a gas or vacuum and an image-side exit surface in contact with an immersion liquid in operation. The exit surface may be essentially planar. The immersion lens group guides the rays of the radiation beam from gas (or vacuum) into the immersion liquid.

Various different illumination settings may be set with the illumination system ILL. For example, where the pattern of the mask to be projected on the wafer essentially consists of parallel lines running in one direction, a dipole setting DIP (see left inset figure) may be utilized to increase resolution and depth of focus. To this end, adjustable optical elements in the illumination system are adjusted to obtain, in a pupil surface PS of the illumination system ILL, an intensity distribution characterized by two locally concentrated illuminated regions IR of large light intensity at diametrically opposed positions outside the optical axis OA and little or no light intensity on the optical axis. A similar inhomogeneous intensity distribution is obtained in pupil surfaces of the projection objective optically conjugate to the pupil surface of the illumination system.

The illumination setting may be changed to obtain, for example, conventional illumination (rotational symmetry around the optical axis) or quadrupole illumination (four-fold radial symmetry around the optical axis, see right hand side inset figure QUAD with four off-axis illuminated regions IR).

Illumination systems capable of optionally providing the described off-axis polar illumination modes are described, for example, in U.S. Pat. No. 6,252,647 B1 or in applicant's patent application US 2006/005026 A1, the disclosure of which is incorporated herein by reference.

In order for the projection objective to function properly at a given wavelength or a given plurality of wavelengths within a desired wavelength band the projection objective must be configured to allow an exposure of substrates utilizing light from the wavelength band for which the projection objective is designed. This wavelength band may be denoted as "design wavelength band" and denotes a range of wavelengths including those wavelengths for which the optical performance of the projection objective is sufficiently good to allow diffraction limited imaging with relatively low aberration level.

Schematic FIG. 2 is employed in the following to illustrate imaging aberrations resulting from utilizing a light source emitting light at different wavelengths within a wavelength band. To this end, FIG. 2 shows schematically a projection objective PO having two dioptric lens elements L1, L2 aligned along a straight optical axis OA to image a pattern PAT disposed in the planar object surface OS of the projection objective onto a substrate disposed in the image surface optically conjugate to the object surface OS. An aperture stop AS defining the image side numerical aperture NA used for the exposure is disposed between lenses L1 and L2 at or optically close to a pupil surface formed between the object surface and image surface. The pattern on the mask (reticle) is schematically illustrated as a diffraction grating diffracting the light coming from a coherent primary light source LS via an illumination system (not shown) preparing the light from the light source prior to incidence on the pattern PAT. Light coming from the light source side is diffracted by the pattern into a $0^{th}$ diffraction order (around the optical axis OA), a $-1^{st}$ diffraction order and a $+1^{st}$ diffraction order.

Broadband light source LS emits light a various wavelengths from a wavelength band having a main wavelength (g), an upper limit wavelength (r) and a lower limit wavelength (b), wherein the lower limit wavelength is shorter and the upper limit wavelength is longer than the main wavelength. The designations g, b and r refer to "green", "blue" and "red" indicative of the relations between the wavelengths. Note that in most objectives used as projection objectives for microlithography the utilized light is from the ultraviolet region of the spectral band, particularly from the deep ultraviolet region (DUV) below about 260 nm, for example. Therefore, the designations g, r and b are only given to illustrate the relations between the wavelengths, not their absolute values.

Figure 2A:
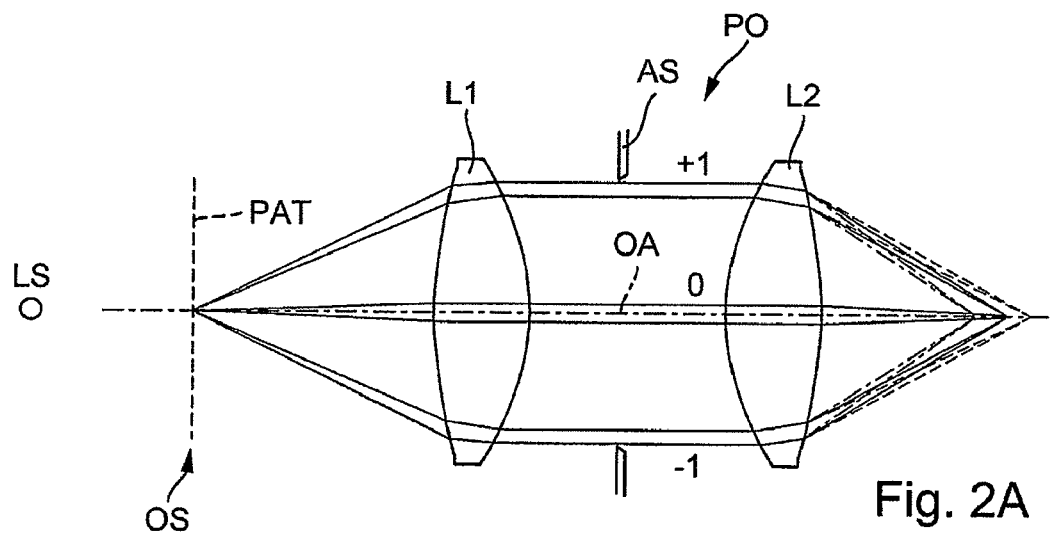
FIG. 2 shows a schematic illustration of an imaging system imaging patterns at different wavelengths.

The upper FIG. 2A represents the situation for a pattern with a relatively fine structure, i.e. small periodicity length between structural features, corresponding to structures at the resolution limit of the objective. With fine structures at the resolution limit the diffraction orders relevant for the imaging of the fine features are situated at the edge of the system pupil, i.e. relatively close to the inner edge of the aperture stop AS. In systems with chromatic variation of a spherical aberration (spherochromatism) the light corresponding to different wavelengths will be focussed on different focal surfaces axially offset with respect to each other. Specifically, in systems which are chromatically undercorrected, the focal plane of the relatively shortest wavelength (b) will be focused closer to the optical system than light with larger wavelengths, such as g or r. This effect deteriorates the contrast of the image at a given spectral width of the light source.

Figure 2B:
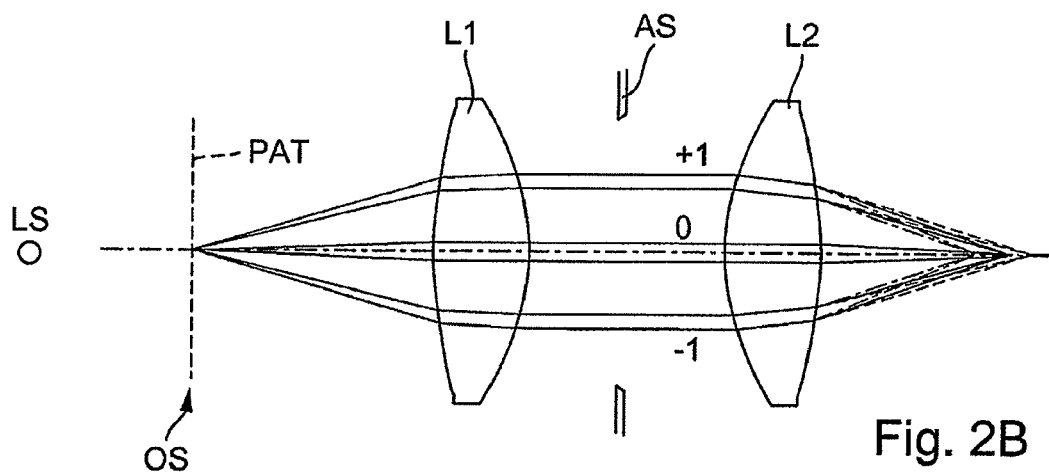

In the lower FIG. 2B the same situation is depicted for a pattern PAT having a coarser pattern, i.e. larger periodicity lengths between structural features. Under these conditions, the $+1^{st}$ and $-1^{st}$ diffraction orders are situated closer to the optical axis in the region of the aperture stop. As a consequence, the amount of defocus in image space is significantly smaller when compared to the finer structures in FIG. 2A. Note that, in objectives fully corrected for axial chromatic aberration (AX) the defocus of the diffraction orders for infinitely large structures (large periodicity spacings) converges towards zero.

The following exemplary embodiments illustrate a number of preferred measures to reduce spherochromatism in objectives, particularly in objectives used as projection objective in microlithography applications.

The finite bandwidth of the light source in connection with non-negligible amounts of chromatic aberration in the projection objective therefore results in contrast loss in the image structures. For example, defocused images corresponding to wavelengths at the upper and the lower limit of the wavelength band will be superimposed over the desired image formed with radiation around the main wavelength. It has been found that this effect is particularly strong when imaging fine structures close to the resolution limit of the projection objective. FIG. 2 already indicates schematically that correction of the chromatic aberration at the edge of the pupil requires special attention since rays passing the projection objective at the outer edge of the pupil are needed to image those fine structures.

Figure 3A:
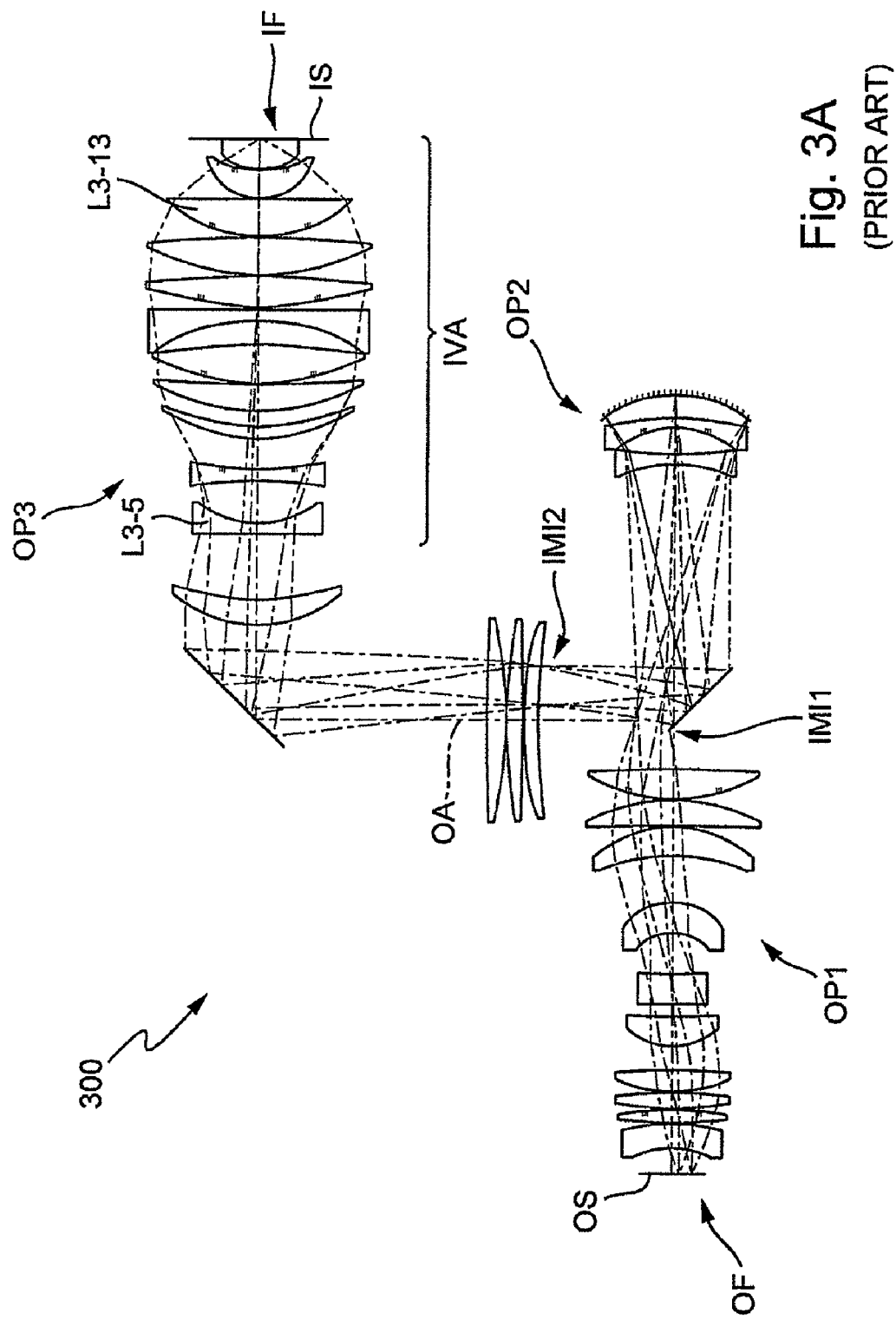
FIG. 3 shows a meridional section of a prior art catadioptric projection objective in 3A and optical properties thereof in FIG. 3B to 3G.

A further understanding of the problems addressed and solved by the inventor will become evident from a detailed analysis of chromatic aberrations of a prior art catadioptric projection objective presented in connection with FIGS. 3A to 3G. FIG. 3A shows a meridional lens section of a catadioptric projection objective 300 presented as seventh embodiment in European patent application EP 1 480 065 A2, FIG. 19. The corresponding disclosure of this patent application is incorporated herein by reference. FIGS. 3B to 3G show diagrams resulting from an analysis of chromatic aberrations of this embodiment.

Briefly, projection objective 300 is designed for immersion lithography to project an image of a pattern on a reticle arranged in the planar object surface OS (object plane) into the planar image surface IS (image plane) on a reduced scale (4:1), while creating exactly two real intermediate images IMI1, IMI2. Imaging may be performed at a maximum image-side numerical aperture NA=1.30 with radiation from a primary light source emitting at a wavelength of about $\lambda$=193 nm. The effective object field OF and image field IF are off-axis, i.e. entirely outside the optical axis OA, which is folded twice. A first refractive objective part OP1 is designed for imaging the pattern provided in the object surface into the first intermediate image IMI1. A second, catadioptric (refractive/reflective) objective part OP2 images the first intermediate image IMI1 into the second intermediate image IMI2 at a magnification close to 1:(-1). A third, refractive objective part OP3 images the second intermediate image IMI2 onto the image surface IS with a strong reduction ratio.

FIG. 3B shows ray intercept plots for representative field points at different object heights for radiation from a wavelength band with absolute width 1 nm from $\lambda-\Delta\lambda$ to $\lambda+\Delta\lambda$ with $\Delta\lambda$=500 pm. FIG. 3C shows a diagram of the longitudinal axial chromatic aberration, AX, for a field point on the optical axis. The transverse aberrations for the field point at three wavelengths shown in FIG. 3B indicates that the insufficient correction of axial chromatic aberration of the axial field point is found essentially constant for all different values of the object height. The regions close to the outer edge of the pupil appear to have values of axial color in the region of about 470 nm/pm, which is much worse than the corresponding values of the axial color of rays passing through the central region of the pupil close to the optical axis, where the axial color is in the order of about 70 nm/pm. As explained in connection with FIG. 2, this significant variation of the amount of axial chromatic aberration from the inner part of the pupil towards the outer edge of the pupil may have negative influence on the imaging properties.

In FIG. 3B it can clearly be seen that the transverse aberrations are well corrected for the main wavelengths $\lambda_0$, whereas the short and long wavelengths $\lambda_0\pm\Delta\lambda$ show significant spherical aberration of different sign. Thus, the whole system is affected by significant spherochromatism (SPHC).

A further characterization of the projection objective is given in FIG. 3D, which presents a graphical representation of the "maximum value of the pupil distortion", $PD_{MAX}$, in the third objective part (imaging the second intermediate image onto the image. The concept of pupil distortion will be explained later in more detail, particularly in connection with FIG. 4.

Figure 3E:
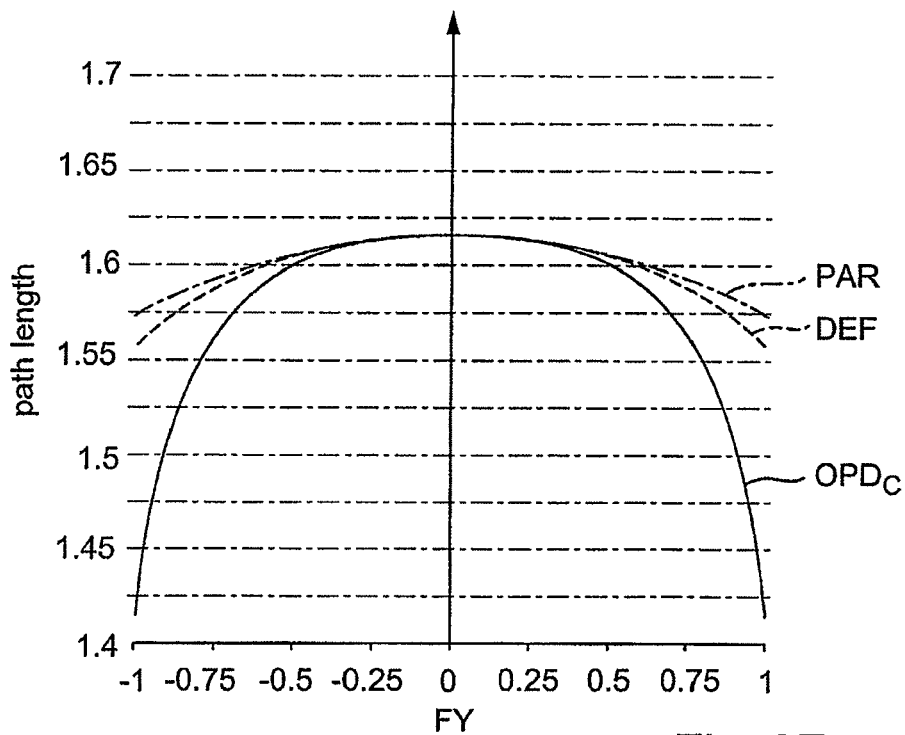
Figure 3F:
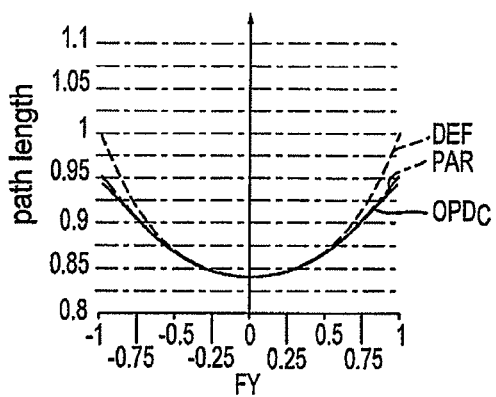
Figure 3G:
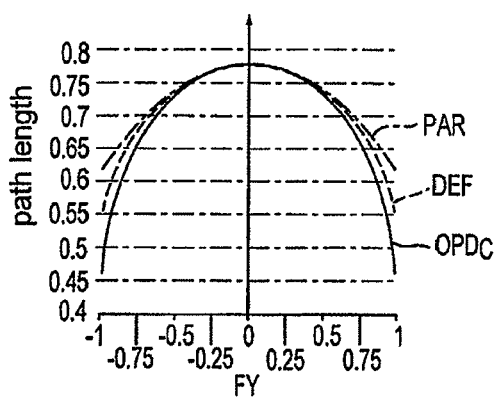

Further analyses of the color dependence of aberrations in the projection objective are now presented in FIGS. 3E to 3G. Consider that a change of the wavefront is a function of the wavelength along a path of a ray may be described in terms of a product of the geometrical length of a ray passing through a transparent optical lens material and the dispersion of the trans-parent material. FIG. 3E shows the normalized pupil coordinate on the X-axis and the chromatic optical path difference $OPD_C$ accumulated by rays of the axial ray bundle upon the optical path from the object surface to the image surface, i.e. through the entire objective. While the solid line represents the chromatic optical path difference, the first dashed line DEF corresponds to a pure defocus at the maximum image-side NA of the system and the other dashed line PAR represents a pure parabola representing the pure defocus at a smaller NA value. It is evident that the wavelength dependence of the chromatic optical path difference is particularly pronounced close to the outer edge of the pupil and is significantly larger than a corresponding optical path difference resulting from defocus only. This general behaviour corresponds to the relatively large values of spherochromatism in this embodiment.

While FIG. 3E shows the optical properties of the entire projection objective, FIG. 3F represents the same quantities effected only by the combination of the first and second objective parts OP1 and OP2 creating the second intermediate image IMI2, and FIG. 3G shows the contribution of the third objective part OP3, imaging the second intermediate image onto the image surface. Since that third refractive objective part OP3 provides a large contribution to the overall demagnifying magnification and creates the large value of image-side NA, the third objective part imaging the last intermediate image (second intermediate image IMI2) onto the image surface is also denoted as "focusing lens group" in this application. It is evident that a major portion of the overall chromatic optical path difference originates from the contribution of the third objective part (focusing lens group). This is evident from the fact that the contributions of the first and second objective parts OP1, OP2 in FIG. 3F are significantly smaller than the respective contributions in FIG. 3G and that the sign of the contribution of the overall system (indicated by the direction of curvature of the curves) is essentially determined by the contributions shown in FIG. 3G (curves are open towards the lower side). The contributions shown in FIG. 3F contribute to correction, but they are not sufficient. The dimensions on the Y-axis are given in arbitrary units, such as a ratio between a first length unit and a second length unit.

Detailed analyses of the inventor revealed that these results are representative of many high NA projection objectives having at least one intermediate image, where a focusing lens group images a last intermediate image (intermediate image closest to the image surface) onto the image surface. With other words: it has been found that conventional focusing lens groups typically introduce variations of chromatic aberrations at the edge of the pupil which are significantly larger than would have been expected from a paraxial calculation (represented by the parabola PAR) and also variations which are stronger than variations corresponding to the defocus DEF only.

The analysis performed by the inventor revealed that these general properties may also be described in terms of the "pupil distortion" generated in the focusing lens group imaging a last intermediate image upstream of the image surface onto the image surface. This will now be further explained in connection with FIG. 4A which shows, on the left side, the image-side end portion IVA of the third objective part OP3 of the projection objective shown in FIG. 3A with representative rays from an axial ray bundle, and, on the right-hand side, the diagram also shown in FIG. 3D. The ray bundle RB shown in FIG. 4A is the axial ray bundle (originating from an axial object field point) and includes an axial ray $R_A$ travelling through the optical system along the optical axis and outer rays $R_E$ travelling from the axial field point towards the outer edge of the pupil. The representative rays shown in the figure are equally spaced in a radial direction in the entrance pupil such that the heights of the rays increase linerarily with their respective heights in the entrance pupil.

The effect of pupil distortion effected by the focusing lens group is qualitatively evident from the radial "spreading" of the rays between the optical axis (field height 0) and the outer edge of the ray bundle because the radial distance between neighbouring rays (having equal radial distance in the entrance pupil) increases from the optical axis towards the edge of the ray bundle disproportionally, which is indicative of pupil distortion. The pupil distortion corresponds to the observation that the rays at the outer edge of the ray bundle have a geometrical path length which is disproportionally long when compared to rays travelling closer to the optical axis. Since the optical system is designed as an optical imaging system (having optically conjugate object surface and image surface), the optical path lengths of the rays of each ray bundle need to be essentially constant for different rays, which further indicates that the path length of the rays through the transparent lens material is disproportionally small for the rays at the edge of the pupil as compared to the rays on or close to the optical axis.

The inventor has analyzed in detail the optical path length of different rays through an optical system and the variation of optical path length with the respective wavelength to obtain chromatic optical path differences influencing chromatic aberrations, such as spherochromatism. Basic considerations are presented in connection with equations (1) to (5) discussed above. Reference is made to the respective portion of this disclosure. Further analysis resulted in the following considerations.

It has been found useful to evaluate the "maximum value of the pupil distortion", $PD_{MAX}$, in the focusing lens group of the objective. To this end, the pupil distortion at a given optical surface may be defined as follows (compare FIG. 4A, left part): for a given optical surface, a pseudo surface PSS (drawn bold in FIG. 4A) is defined where the vertex of the pseudo surface corresponds with the vertex of the optical surface under consideration, and where the pseudo surface is concentric to the paraxial image of the object such that a paraxial marginal ray intersects the pseudo surface PSS at right angles. The pseudo surface PSS corresponding to the convex, aspheric entry surface of positive lens L3-13 is shown in FIG. 4A. In the absence of pupil distortion, i.e. where the sine condition is fulfilled, and further in the absence of spherical aberration, the intersection height (height of the intersection point between ray and pseudo surface) of a ray of the axial ray bundle in the pseudo surface should increase linearly with the corresponding entrance pupil height. Each deviation from this ideal condition (prevailing in the paraxial region close to the optical axis) is associated with the pupil distortion. The amount of pupil distortion may be determined for each single optical surface in the objective using the above directive, thereby creating a number of values for the pupil distortion corresponding to each of the optical surfaces in the considered region of the objective. The maximum value of pupil distortion, $PD_{MAX}$ is defined, for this application, as the maximum value of the pupil distortion observed in the focusing lens group of an objective, i.e. within an imaging objective path imaging an intermediate image (or the object) onto the image surface.

The spreading of rays towards the outer edge of the pupil evident in FIG. 4A is a visible consequence of the pupil distortion. The right diagram in FIG. 4A (corresponding to FIG. 3D) is another representation of the "spreading" of rays towards the outer edge of the pupil, i.e. the increase in radial distance between rays which have equally spaced radial coordinates in the entrance pupil. While the dashed line LIN corresponds to a linear dependence of the relative height on the pupil coordinate (expected in the absence of pupil distortion), the solid line PD represents the relative height of the actual intersection points of the various rays of the ray bundle with a plane perpendicular to the optical axis and positioned at third pupil surface P3. It is evident that a large deviation from the linear behaviour is found close to the outer edge of the pupil, i.e. for relatively high pupil coordinates close to 1.

Investigations to quantify the pupil distortion showed that, in lowest order, the pupil distortion increases with the third order of the image-side aperture, i.e. with $NA^3$. As a measure independent of NA it has been found useful to calculate the normalized pupil distortion $D_P$, which quantifies at least approximately the value of the pupil distortion at NA=1 according to the following definition:

$$D_P = V/NA^3, \tag{12}$$

wherein V is the pupil distortion at the maximum value of image-side NA for which the objective is sufficiently corrected.

In this equation, the pupil distortion V is given by the difference between the actual ray height RH and the paraxial ray height PRH, normalized by the paraxial ray height PRH according to V=(RH−PRH)/PRH.

The reference system in FIG. 3A having NA=1.3 may be characterized by a maximum pupil distortion V=52.6% and $PD_{MAX}=V/NA^3=23.9\%$.

Various embodiments of objectives with a significant improvement of spherochromatism will now be described using the terms and concepts explained above in detail in connection with the prior art system.

Figure 5E:
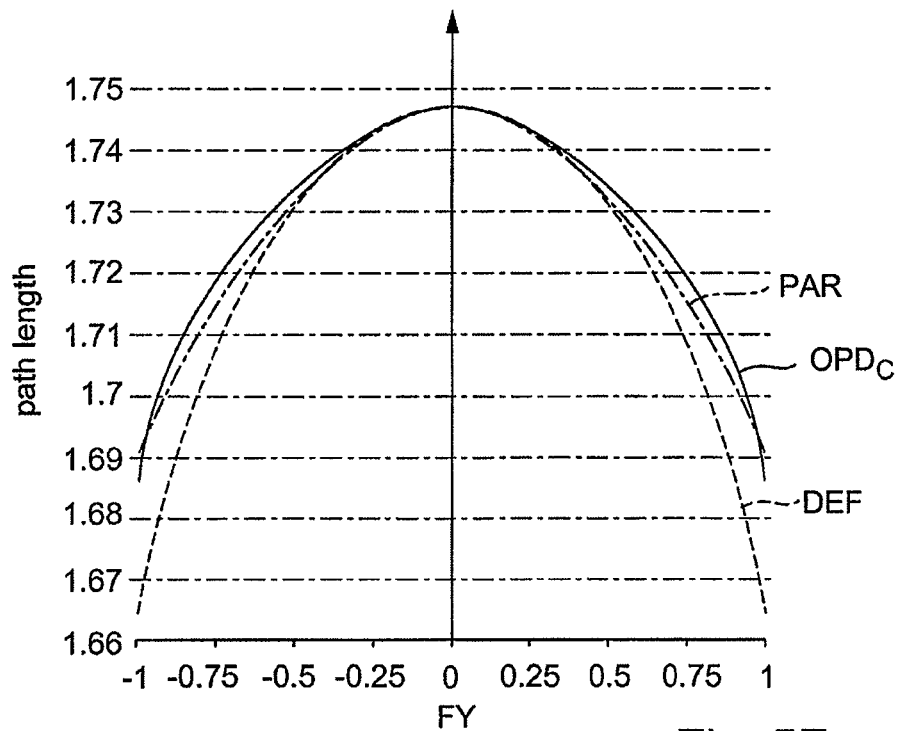
FIG. 5 shows a meridional section of a first embodiment of a catadioptric projection objective in 5A and diagrams illustrating optical properties thereof in FIG. 5B to 5G.

FIG. 5A shows a catadioptric projection objective 500 designed for a nominal UV-operating wavelength λ=193 nm (first embodiment). An image-side numerical aperture NA=1.35 is obtained at a reducing magnification 4:1 (β=−0.25) in a rectangular off-axis image field with size 26 mm×5.5 mm. The total track length L (geometrical distance between object surface and image surface) is 1750 mm. The radius $R_{DOF}$ of the design object field, also denoted object field height OBH, is 61 mm. The specification is given in tables 5, 5A.

Projection objective 500 has a telecentric image space and is designed to project an image of a pattern on a reticle arranged in the planar object surface OS (object plane) into the planar image surface IS (image plane) on a reduced scale while creating exactly two real intermediate images IMI1, IMI2. The rectangular effective object field OF and image field IF are off-axis, i.e. entirely outside the optical axis OA. A first refractive objective part OP1 is designed for imaging the pattern provided in the object surface into the first intermediate image IMI1. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Projection objective 500 is an example of a "concatenated" projection objective having a plurality of cascaded objective parts which are each configured as imaging systems and are linked via intermediate images, the image (intermediate image) generated by a preceding imaging system in the radiation path serving as object for the succeeding imaging system in the radiation path. The succeeding imaging system can generate a further intermediate image (as in the case of the second objective part OP2) or forms the last imaging system of the projection objective, which generates the "final" image field in the image plane of the projection objective (like the third objective part OP3). Systems of the type shown in FIG. 2 are sometimes referred to as R-C-R system, where "R" denotes a refractive (dioptric) imaging system and "C" denotes a catadioptric (or catoptric) imaging system.

The path of a projection CR of a chief ray of an outer field point of the off-axis object field OF onto the meridional plane (drawing plane) is drawn bold in FIG. 2 in order to facilitate following the beam path of the projection beam. For the purpose of this application, the term "chief ray" (also known as principal ray) denotes a ray running from an outermost field point (farthest away from the optical axis) of the effectively used object field OF to the center of the entrance pupil. Using an off axis rectangular object field the chief ray of the objective may originate at the outermost field corner. Thus, only the projection CR of the chief ray onto the meridional plane may be displayed in the figures but not its real height. Due to the rotational symmetry of the system the chief ray may be chosen from an equivalent field point in the meridional plane. This equivalent hypothetical chief ray may not contribute to the imaging when an off axis object field with fold mirrors or other surfaces acting as baffles are used. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective object field with fold mirrors or other surfaces acting as baffles is used. The chief ray and marginal ray are chosen to characterize optical properties of the projection objectives. The radial distance between such selected rays and the optical axis at a given axial position are denoted as "chief ray height" (CRH) and "marginal ray height" (MRH), respectively. The angle included between the chief ray and the optical axis is the chief ray angle CRA. The angle included between the marginal ray and the optical axis is the marginal ray angle MRA.

The projection objective is essentially telecentric in image space, i.e. the exit pupil is located essentially at infinity. This determines the position of the pupil surfaces in the subsystems being the conjugate planes to the exit pupil at infinity. The object space may be essentially telecentric as well, thus providing an entrance pupil essentially at infinity.

Three mutually conjugated pupil surfaces P1, P2 and P3 are formed at positions where the chief ray intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a single concave mirror CM situated in the vicinity of the second pupil surface P2 at CRH/MRH close to 0. The projection objective includes two meniscus lenses with negative refractive power forming a lens group with negative refracting power, denoted as negative group NG in the following. This group is located immediately in front of the concave mirror CM and coaxial with the concave mirror and passed twice by radiation on its way from first objective part towards the concave mirror, and from the concave mirror towards the first folding mirror FM1. A combination of a concave mirror arranged at or optically close to a pupil surface and a negative group comprising at least one negative lens arranged in front of the concave mirror on a reflecting side thereof in a double pass region such that radiation passes at least twice in opposite directions through the negative group is sometimes referred to as "Schupmann achromat". This group contributes significantly to correction of chromatic aberrations, particularly axial chromatic aberration AX. Correction of Petzval sum is predominantly influenced by the curvature of concave mirror CM.

In general, the negative group may be positioned in direct proximity to the concave mirror in a region near the pupil, where this region may be characterized by the fact that the marginal ray height (MRH) of the imaging is greater than the chief ray height (CRH). Preferably, the marginal ray height is at least twice as large, in particular at least 5 to 10 times as large, as the chief ray height in the region of the negative group. A negative group in the region of large marginal ray heights can contribute effectively to the chromatic correaction, in particular to the correction of the axial chromatic aberration AX, since the axial chromatic aberration AX of a thin lens is proportional to the square of the marginal ray height at the location of the lens (and proportional to the refractive power and to the dispersion of the lens). Added to this is the fact that the projection radiation passes twice, in opposite through-radiating directions, through a negative group arranged in direct proximity to a concave mirror, with the result that the chromatically overcorrecting effect of the negative group is utilized twice. The negative group may e.g. consist of a single negative lens or contain at least two negative lenses.

The negative group predominantly influences axial chromatic aberration due to the refractive power and large marginal ray heights in the region of the negative group. In contrast, spherochromatism (SPHC) is mainly corrected by correcting pupil distortion. The pupil distortion has the same sign in the negative group NG and in the third objective part (focusing lens group). However, the negative lenses of the negative group have opposite refractive power (negative instead of positive). Therefore the negative group in the catadioptric objective part has an overcorrecting influence on spherochromatism, whereas the positive refractive power of the focusing lens group has an undercorrecting influence. In other words: rays from the outer edge region of the pupil pass through disproportionally little material in the positive lenses of the focusing lens group, whereas the same rays pass through disproportionally thick regions of the lenses in the negative group of the second objective part. Therefore, the negative group may compensate some of the spherochromatism generated in the focusing lens group.

The concave mirror CM is arranged coaxially with the lenses of the first objective part OP1 and receives light from the object surface or the first intermediate image, respectively, without intermediate deflection by a mirror. A first planar folding mirror FM1 is arranged geometrically close to the first intermediate image at an angle 45° relative to the optical axis OA such that it reflects radiation reflected by the concave mirror towards a second folding mirror FM2 arranged downstream of the first folding mirror. The first folding mirror FM1 is arranged on the same side of the optical axis as the off-axis object field OF, which is on the opposite side to the first intermediate image. The first intermediate image IMI1 is formed very close to the front edge of the first folding mirror FM1 facing the optical axis OA such that the radiation beam passes at a small distance from the front edge without causing vignetting. The second intermediate image IMI2 is formed immediately downstream of the first folding mirror FM1 at a small distance therefrom, optically between the first and second folding mirrors FM1, FM2, and geometrically overlapping with the first intermediate image IMI1. A double pass region where the radiation passes twice in opposite directions is formed geometrically between the first deflecting mirror FM1 and the concave mirror CM, and optically between the first intermediate image IMI1 and the first folding mirror FM1. The second folding mirror FM2, having a planar mirror surface aligned at right angles to the planar mirror surface of the first folding mirror, reflects the radiation coming from the first folding mirror FM1 in the direction of the image surface IS, which is aligned parallel to the object surface OS.

The optical axis is folded by 90° at the first and second folding mirrors FM1, FM2 due to the 45° inclination of these folding mirrors. However, inclination angles deviating significantly from 45°, for example by about up to 5° or up to 10°, may be used in embodiments such that the second section OA2 of the optical axis includes non-rectangular angles with the other sections OA1, OA3 (see, for example, U.S. Pat. No. 6,995,833 B2, FIG. 2). When the projection objective is installed in a projection exposure apparatus, the first and third sections of the optical axis are typically oriented in the vertical direction such that the second section OA2 is aligned in a horizontal direction or at a small angle from the horizontal direction. Therefore, the transverse section defined by the second section OA2 of the optical axis is sometimes denoted as "horizontal optical axis".

Details of the embodiment of FIG. 5A are now described in more detail. The first objective part OP1 includes 9 lenses forming a first lens group LG1-1 with positive refractive power and a second lens group LG1-2 with positive refractive power, the pupil surface P1 being disposed between the two lens groups. Two or three positive lenses of the second lens group LG1-2 closest to the first intermediate image may be considered as forming a first field lens group. A biconcave negative lens L1-4 is situated close to or at the first pupil surface. The first objective part defines the position, size, shape and correction status of the first intermediate image IMI1 formed close to the inner edge of first folding mirror FM1.

A single positive meniscus lens L2-1 is arranged in the double-pass region geometrically close to the first folding mirror FM1 optically immediately down-stream of first intermediate image IMI1 and optically close to the first intermediate image in a region where the chief ray height is larger than the marginal ray height, thereby acting as positive field lens group. The convex lens surface facing the first intermediate image is aspherical, the concave lens surface facing the concave mirror is spherical. Positive field lens L2-1 is effective to converge incident radiation towards the concave mirror CM, and radiation reflected from the concave mirror is converged towards the second intermediate image IMI2, which is formed downstream of field lens group and the first folding mirror FM1. Therefore, first folding mirror FM2 is part of second objective part OP2.

The structure of third objective part OP3, forming a demagnifying last objective part imaging the second intermediate image directly onto the image surface, is now described. A single biconvex positive lens L3-1 having an aspherical entry surface facing the second intermediate image IMI2 and the spherical exit surface facing the second folding mirror FM2 is arranged in a single pass region geometrically between the first and second folding mirrors FM1, FM2, respectively and forms the first (entry-side) lens of the third objective part OP3. This lens is arranged in a position where CRH>MRH and acts as a field lens. A single positive field lens in this region effectively contributes to pupil imaging from the second to the third pupil surface. At the same time, mounting of the field lens is simplified and a mechanically stable construction is made possible due to the fact that there is only one single lens between the folding mirrors. Further, the free optical diameters of the lenses on the third objective part OP3 may be reduced. A biconvex positive lens L3-2 follows downstream of second folding mirror FM2 and is effective to converge radiation.

A biconcave negative lens L3-3 having a spherical concave entry surface and a spherical concave exit surface is arranged immediately downstream lens L3-2 in a region of converging radiation and forms a divergent beam. Large angles of incidence at the concave entry surface contribute effectively to aberration correaction. Radiation diverges only slightly downstream of the concave exit side towards biconvex positive lens L3-4 forming the lens with the largest diameter in the third objective part. Positive lens L3-4 in conjunction with four consecutive positive lenses is effective to converge radiation towards the image surface IS.

A variable aperture stop AS (i.e. an aperture stop having a variable diameter) may be arranged at or close to the third pupil surface P3. If a significant amount of stop curvature is present in the region of the third pupil surface P3, then a variable aperture stop may alternatively be positioned close to or at the first pupil surface P1 or close to or at the second pupil surface P2 (close to concave mirror CM).

The image-side end of the projection objective is formed by a plano-convex positive lens L3-8 (PCL) acting as an immersion lens group ILG to guide the radiation rays from a gas-filled space upstream of the convex entry surface of the plano-convex lens into the immersion liquid which fills the image-side working space between the planar exit surface of the plano-convex lens and the image surface during operation. All lenses including plano-convex lens L3-8 are made of fused silica with n≈1.56 at λ=193 nm.

The arrangement VIB of lenses downstream of second folding mirror FM2 is also depicted in FIG. 4B.

The third objective part OP3 has been optimized partly in view of the goal to suppress pupil distortion in the region of the third pupil surface P3 significantly relative to prior art systems having comparable NA values. Specifically, the lenses between second folding FM2 and the image surface IS forming lens group IVB shown in enlarged detail in FIG. 4B (left side) have a substantially aplanatic construction. The corresponding trajectories of rays of an axial ray bundle are shown in FIG. 4B (left-hand side) and the pupil distortion is shown in the diagram in FIG. 4B (right-hand side) which has been calculated analogous to the diagram in FIG. 4A above. A construction of lenses qualified as "substantially aplanatic construction" may be characterized as follows. In general, an aplanatic surface is an optical surface which does not intrinsically introduce spherical aberration and which does not intrinsically introduce a change of the sine condition. With k being the direction cosine of an aperture ray of an axial ray bundle before the respective surface and i' being the angle of incidence of a refracted ray behind (optically downstream of) the surface, the quantities AA and BB, respectively, may be defined as:

$$AA = \frac{\sin(i')}{k} \quad (13)$$

and $$BB = \sin(i') - k \quad (14)$$

With these definitions, an aplanatic surface is given where AA=1 or BB=0. A deviation of a surface from an ideal aplanatic shape may then be characterized by deviations of AA and BB, respectively from the ideal values.

The first embodiment in FIG. 5A having NA=1.35 may be characterized by V=26.81% and $PD_{MAX}$=V/NA$^3$=10.89% (see Table A). Further, parameter A from eq. (11) is about 0.09 (see Table B).

Figure 6A:
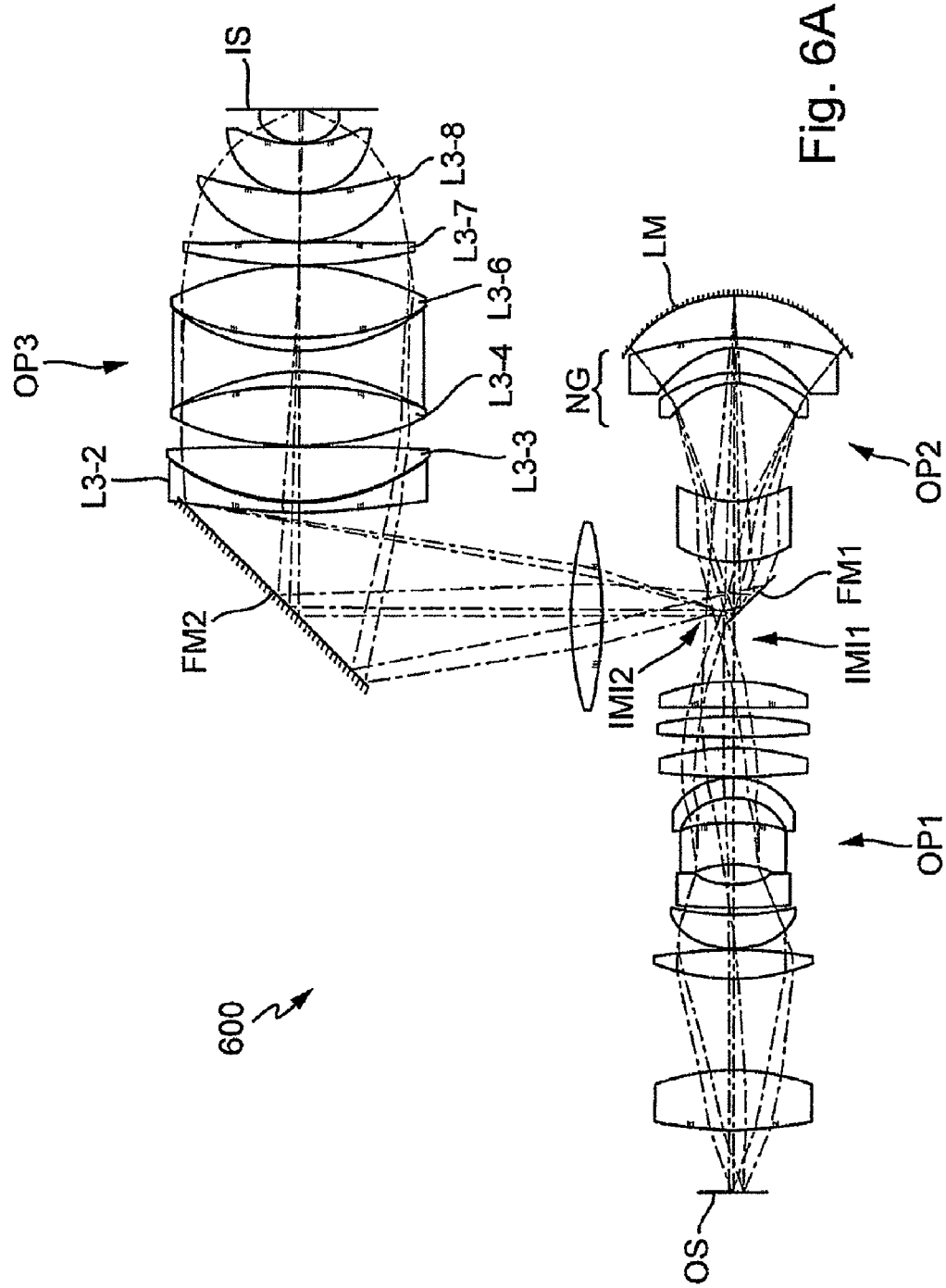
FIG. 6 shows a meridional section of a second embodiment of a catadioptric projection objective in FIG. 6A and diagrams illustrating optical properties thereof in FIG. 6B to 6D.

FIG. 6A shows a catadioptric projection objective 600 designed for a nominal UV-operating wavelength λ=193 nm (second embodiment). An image-side numerical aperture NA=1.35 is obtained at a reducing magnification 4:1 (β=−0.25) in a rectangular off-axis image field with size 26 mm×5.5 mm. The total track length L (geometrical distance between object surface and image surface) is 1750 mm. The radius $R_{DOF}$ of the design object field, also denoted object field height OBH, is 61 mm. The specification is given in tables 6, 6A.

The objective may be considered as a variant of the objective 500 in FIG. 5A with modifications applied particularly to the third objective part OP3 to further improve chromatic correction. One improvement may be taken from a comparison of FIG. 6C with FIG. 5C indicating that the axial chromatic aberration now has a number of zero-crossings in the pupil coordinate. Improvement of axial color is mainly effected by providing a second lens material in addition to fused silica, which is used for all lenses in the embodiment of FIG. 5A. In projection objective 600 relatively low dispersion calcium fluoride (CaF$_2$) having a dispersion smaller than that of fused silica is used particularly in positive lenses arranged closed to the third pupil surface (lenses L3-3, L3-4, L3-6, L3-7, L3-8), thereby reducing the undercorrection of axial color introduced in this embodiment by those lenses made from a higher dispersive material, such as fused silica. Further, when compared to the embodiment of FIG. 5A, an additional negative lens made from strongly dispersive fused silica is introduced immediately downstream of second folding mirror FM2. This negative meniscus lens L3-2 having aspheric convex entry surface and spherical concave exit surface provides overcorrection for axial color, thereby contributing to improvement of AX. As seen from Table B below, the normalized pupil distortion $D_P$=11.65% is similar to that of objective 500 and significantly smaller than in the prior art system (FIG. 3).

While using at least two different materials (having different Abbe numbers) may be utilized to improve chromatic correction, a second material is not necessary to obtain such improvement. This is exemplarily demonstrated using the third embodiment of a catadioptric projection objective 700 shown in FIG. 7A.

Figure 7A:
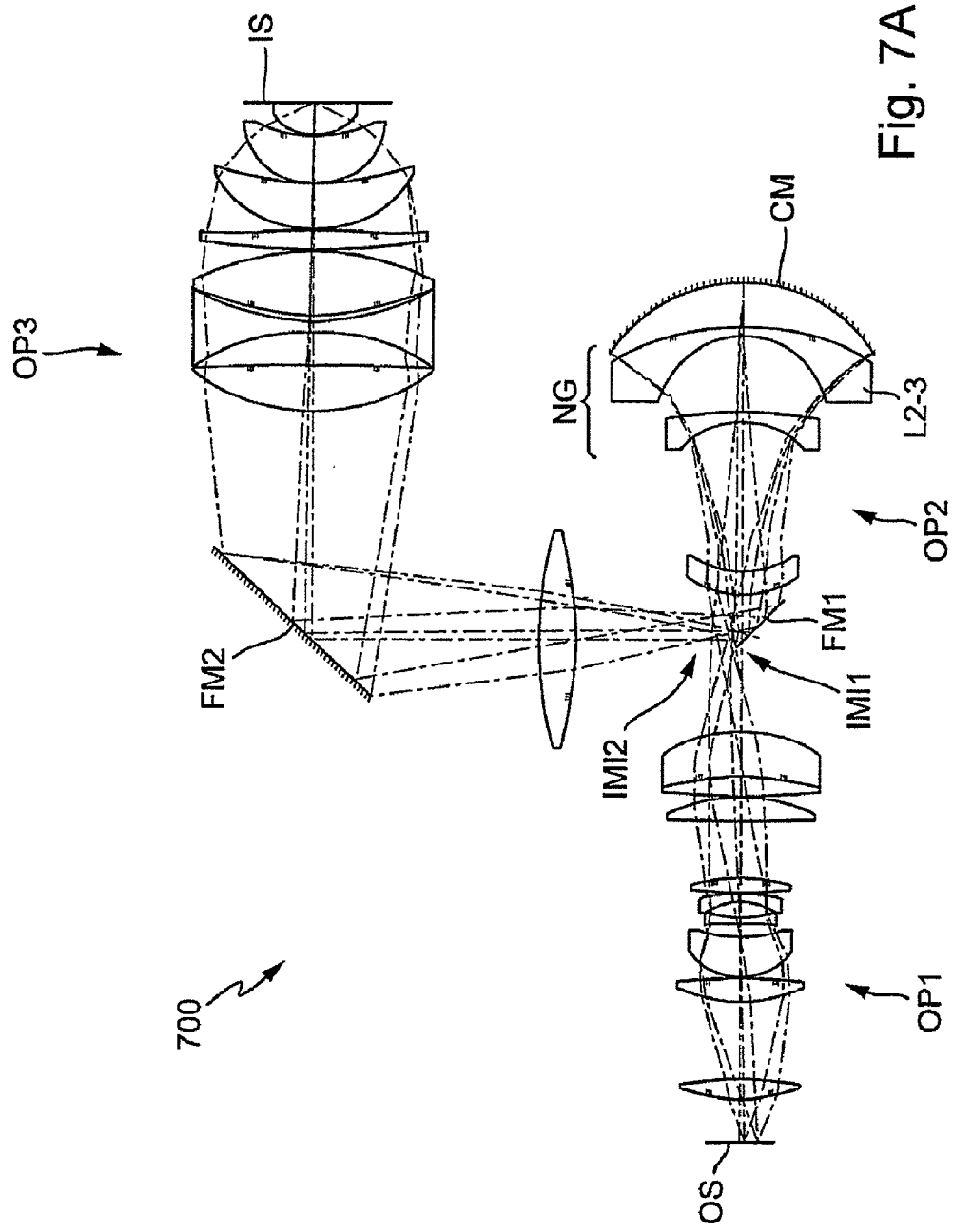
FIG. 7 shows a meridional section of a third embodiment of a catadioptric projection objective in 7A and diagrams illustrating optical properties thereof in FIG. 7B to 7D.

FIG. 7A shows a catadioptric projection objective 700 designed for a nominal UV-operating wavelength λ=193 nm (third embodiment). An image-side numerical aperture NA=1.35 is obtained at a reducing magnification 4:1 (β=−0.25) in a rectangular off-axis image field with size 26 mm×5.5 mm. The total track length L (geometrical distance between object surface and image surface) is 1750 mm. The radius $R_{DOF}$ of the design object field, also denoted object field height OBH, is 61 mm. The specification is given in tables 7, 7A.

If no calcium fluoride is used for correcting chromatic aberrations, this may result in a very stressed catadioptric group (e.g. lenses with strong negative power ahead of the concave mirror), but avoids to use expensive materials, such as CaF$_2$.

The improved correction of axial chromatic aberration AX in this embodiment is predominantly effected by increasing the effective diameter and the refractive power of the negative lenses of the "Schupmann achromat" in the second objective part OP2. In this embodiment, the optical free diameter of negative lens L2-3 immediately in front of concave mirror CM is larger than the optical free diameter of any lens in the third objective part OP3.

Balancing the task of correcting chromatic aberrations between different objective parts may be utilized to reduce the chromatic aberrations of field points, which are generally evident from the diagrams showing ray intercept plots in the figures with suffix "B". Reducing the values for lateral color aberration contributes to improving the chromatic correction over the entire image field. This is further demonstrated in connection with the fourth embodiment of catadioptric projection objective 800 in FIG. 8 discussed below.

Figure 8A:
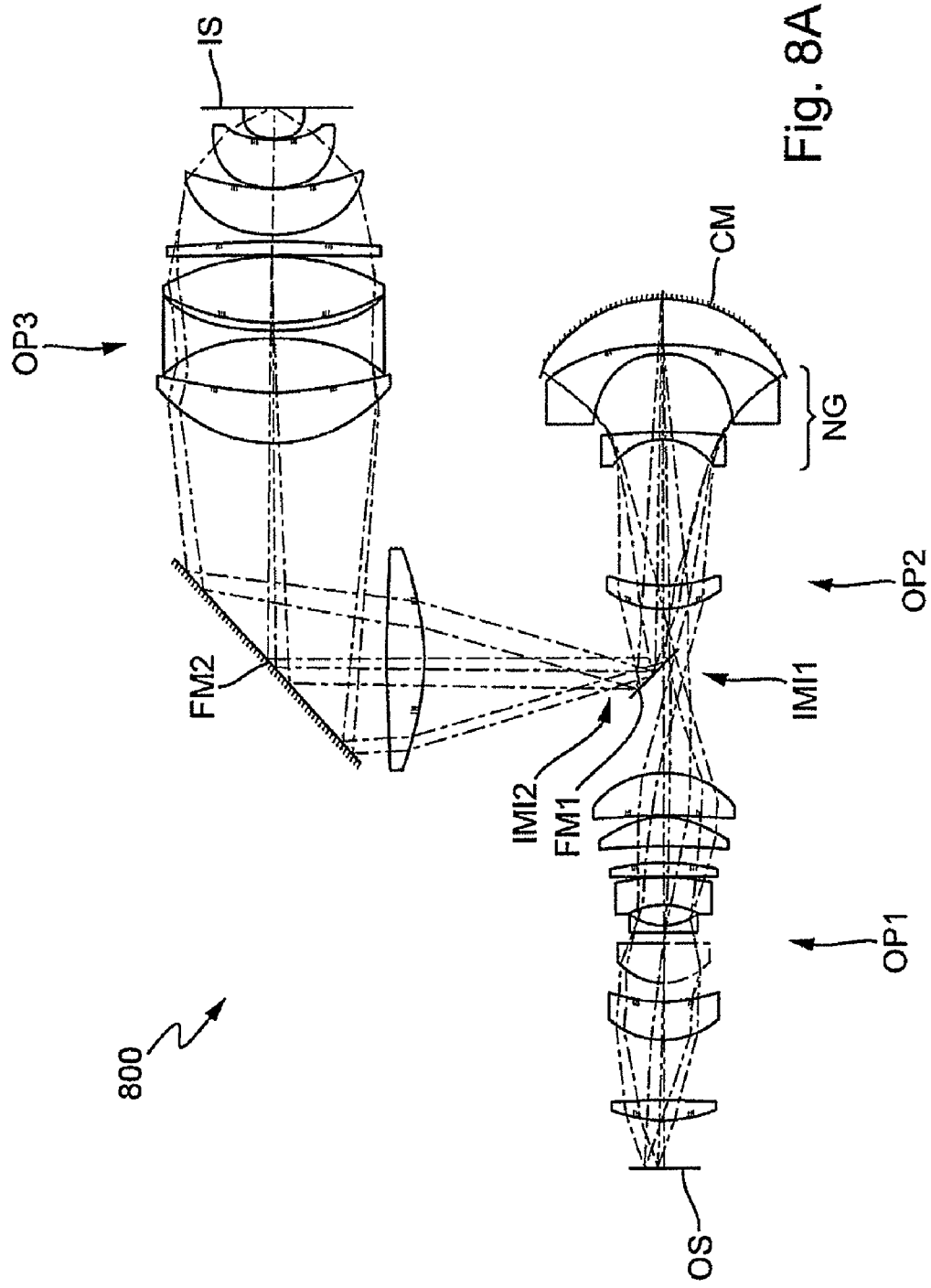
FIG. 8 shows a meridional section of a fourth embodiment of a catadioptric projection objective in 8A and diagrams illustrating optical properties thereof in FIG. 8B to 8G.
Figure 8E:
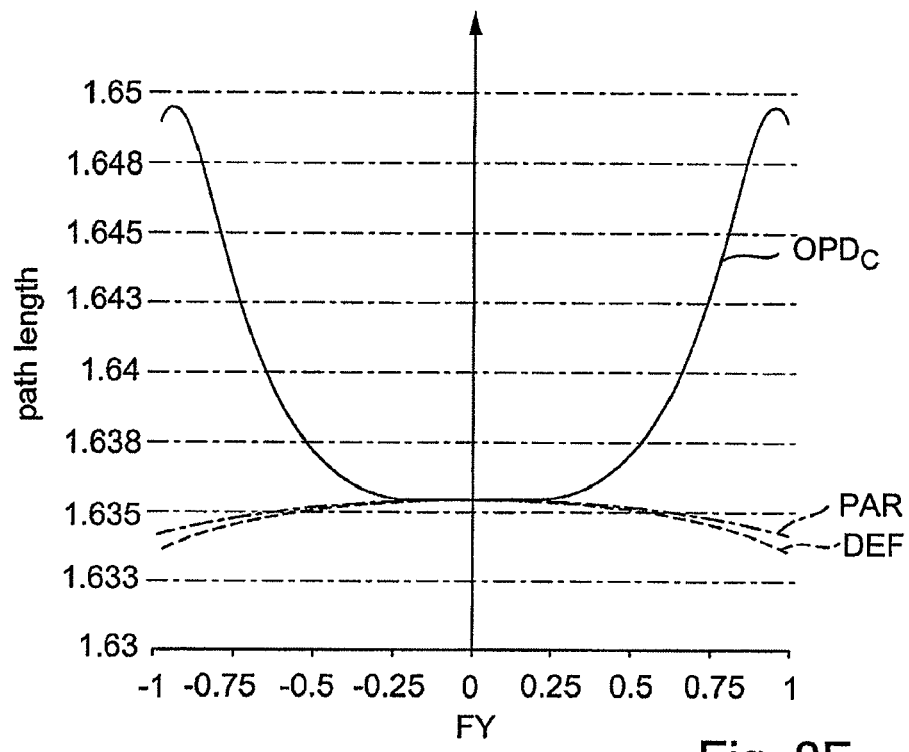
Figure 8F:
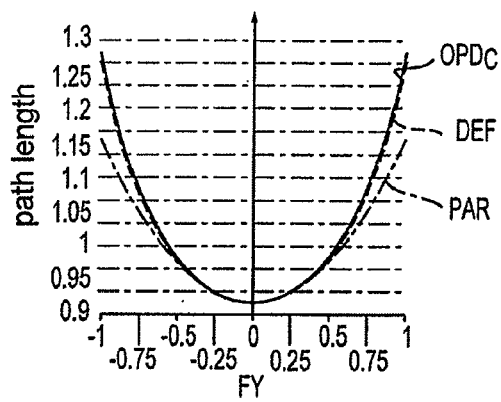
Figure 8G:
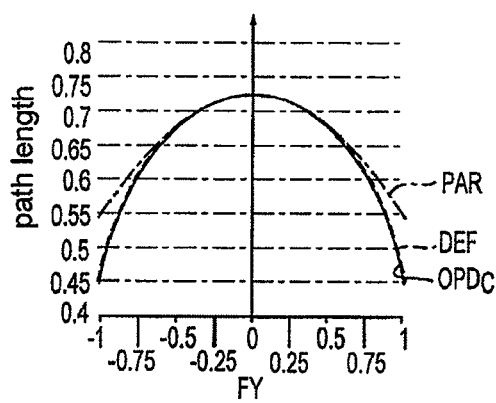

FIG. 8A shows a catadioptric projection objective 800 designed for a nominal UV-operating wavelength λ=193 nm (fourth embodiment). An image-side numerical aperture NA=1.35 is obtained at a reducing magnification 4:1 (β=−0.25) in a rectangular off-axis image field with size 26 mm×5.5 mm. The total track length L (geometrical distance between object surface and image surface) is 1750 mm. The radius $R_{DOF}$ of the design object field, also denoted object field height OBH, is 61 mm. The specification is given in tables 8, 8A.

The general sequence of objective parts (refractive-catadioptric-refractive) is the same as in the previous embodiments. However, the folding geometry is different. In projection objective 800 the first folding mirror FM1 is arranged geometrically between the first intermediate image IMI1 and the second folding mirror FM2 or, in other words, between the part of the optical axis connecting the object surface with the concave mirror, and the part of the optical axis defined by the aperture-providing lenses of the third objective part. In this construction, the part of the optical path between object surface and concave mirror, and the part of the optical path between concave mirror and image surface do not cross each other, as in the previous embodiments. The optical properties are shown in FIG. 8B to 8G and further in Table A below.

The various means to improve chromatic correction discussed above are not limited to projection objectives having the various folding geometries shown in the previous embodiments. Further, those measures may be applied equally effective to systems having even larger image-side numerical apertures. The following embodiment is an example to demonstrate the broad applicability of the concepts outlined above.

Figure 9A:
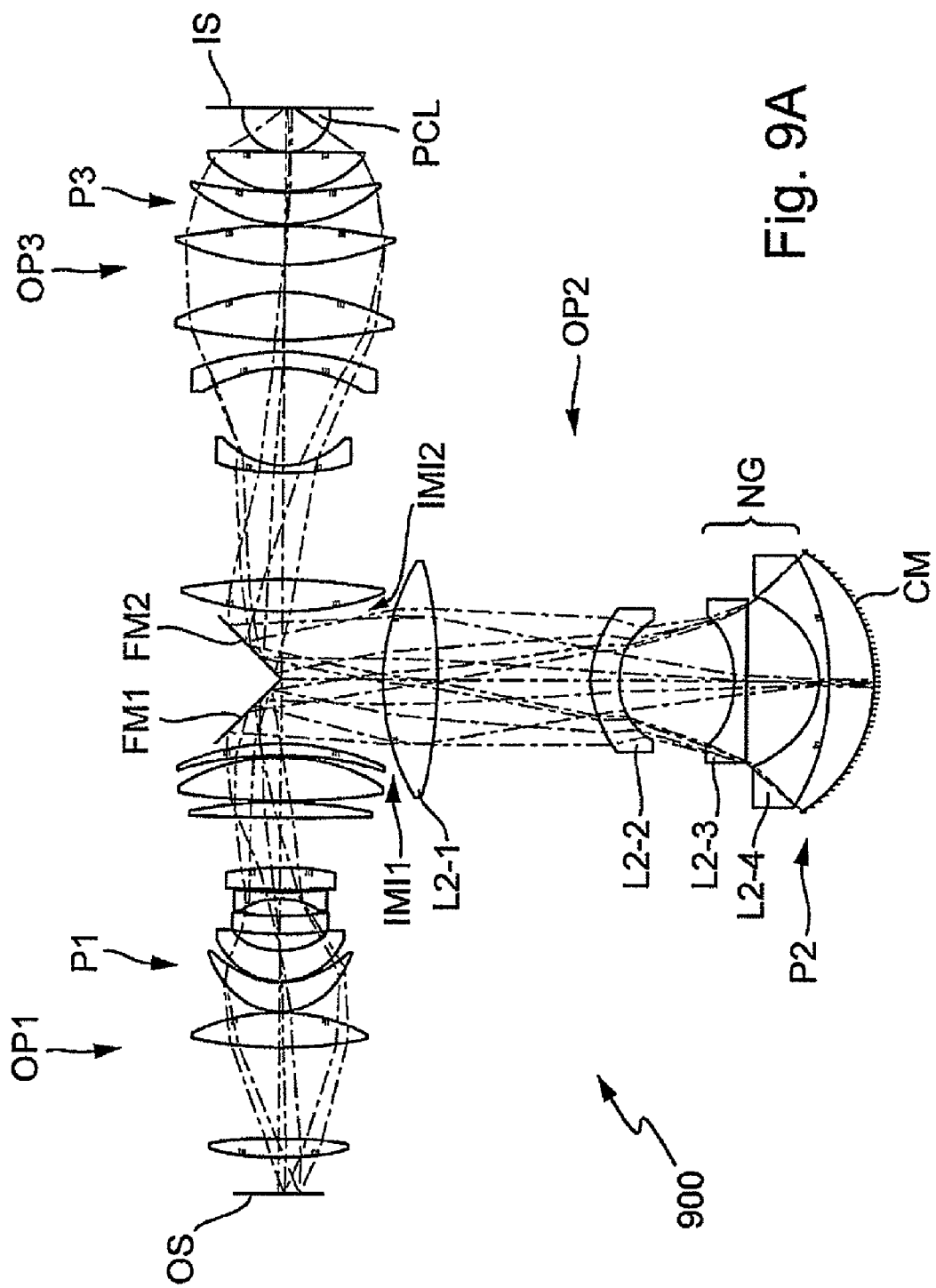
FIG. 9 shows a meridional section of a fifth embodiment of a catadioptric projection objective in 9A and diagrams illustrating optical properties thereof in FIG. 9B to 9D.

FIG. 9A shows a catadioptric projection objective 900 designed for a nominal UV-operating wavelength λ=193 nm (fifth embodiment). An image-side numerical aperture NA=1.55 is obtained at a reducing magnification 4:1 (β=−0.25) in a rectangular off-axis image field with size 26 mm×5.5 mm. The total track length L (geometrical distance between object surface and image surface) is 1600 mm. The radius $R_{DOF}$ of the design object field, also denoted object field height OBH, is 63 mm. The specification is given in tables 9, 9A.

The sequence of imaging objective parts (refractive-catadioptric-refractive, RCR) is the same as in the previous embodiments, however, a different folding geometry is realized. Specifically, the second objective part OP2 includes a single concave mirror CM situated at the second pupil surface P2. A first planar folding mirror FM1 is arranged optically close to the first intermediate image IMI1 at an angle of 45° to the optical axis OA such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface. The folding mirrors FM1, FM2 are each located in the optical vicinity of, but at a small distance from the closest intermediate image. A double pass region where the radiation passes twice in opposite directions is thereby formed geometrically between the deflecting mirrors FM1, FM2 and the concave mirror CM. A single positive lens L2-1 is arranged in the double pass region geometrically close to the folding mirrors FM1, FM2 and optically close to both the first and second intermediate images, thereby acting as a positive field lens. A negative group NG having two negative lenses L2-2 is arranged in a region with large marginal ray height near the concave mirror and coaxial with the concave mirror such that the radiation passes twice in opposite directions through the negative group. No optical element is arranged between the negative group and the concave mirror. A negative meniscus lens L2-2 having a concave surface facing the concave mirror CM is arranged between positive lens L2-1 and the lenses of negative group NG.

All lenses with the exception of the last optical element closest to the image surface (plano-convex lens PCL) are made from fused silica. Plano-convex lens PCL is made from crystalline magnesium aluminium oxide ($MgAlO_4$) with spinel structure, briefly denoted as "spinel" in the following. This high-index material has refractive index n=1.91 at λ=193 nm. This allows for very high image-side NA, such as NA=1.55 in this embodiment.

In general, in the case of reducing optical imaging, in particular of projection lithography, the image side numerical aperture NA is limited by the refractive index of the surrounding medium in image space. In immersion lithography the theoretically possible numerical aperture NA is limited by the refractive index of the immersion medium. The immersion medium can be a liquid or a solid. Solid immersion is also spoken of in the latter case.

However, for practical reasons the aperture should not come arbitrarily close to the refractive index of the last medium (i.e. the medium closest to the image), since the propagation angles then become very large relative to the optical axis. It has proven to be practical for the numerical aperture not to exceed substantially approximately 95% of the refractive index of the last medium of the image side. This corresponds to maximum propagation angles of approximately 72° relative to the optical axis. For 193 nm, this corresponds to a numerical aperture of NA=1.35 in the case of water ($n_{H2O}$=1.43) as immersion medium.

With liquids whose refractive index is higher than that of the material of the last lens, or in the case of solid immersion, the material of the last lens element (i.e. the last optical element of the projection objective adjacent to the image) acts as a limitation if the design of the last end surface (exit surface of the projection objective) is to be planar or only weakly curved. The exit surface must be of planar design for solid immersion, in particular, in order to expose the wafer, which is likewise planar.

For DUV (operating wavelength of 248 nm or 193 nm), the materials normally used for the last lens are fused silica (synthetic quartz glass, $SiO_2$) with a refractive index of $n_{SiO2}$=1.56 at 193 nm or $CaF_2$ with a refractive index of $n_{CaF2}$=1.50 at 193 nm. This results in a numerical aperture of approximately 1.425 (95% of n=1.5) which can be achieved if CaF is used for the last optical element. Using quartz glass may allow numerical apertures of 1.48 (corresponding to approximately 95% of the refractive index of quartz at 193 nm). The relationships are similar at 248 nm. Using a high-index material allows to exceed those limits to NA.

In general, an embodiment may have an immersion lens group (e.g. plano-convex lens PCL) having a convex object-side entry surface bounding at a gas or vacuum and an image-side exit surface in contact with an immersion liquid in operation, wherein the immersion lens group is at least partly made of a high-index material with refractive index n≧1.6 and/or n≧1.7 and/or n≧1.8 and/or n≧1.9 at the operating wavelength. As the image-side numerical aperture NA may be extended close to the refractive index of the high-index material in certain cases, very high NA values with NA>1.35 or NA>1.4 or NA>1.5 are possible.

The high-index material may be chosen, for example, from the group consisting of aluminum oxide ($Al_2O_3$), beryllium oxide (BeO), magnesium aluminum oxide ($MgAlO_4$, spinell), yttrium aluminium oxide ($Y_3Al_5O_{12}$), yttrium oxide ($Y_2O_3$), lanthanum fluoride ($LaF_3$), lutetium aluminium garnet (LuAG), magnesium oxide (MgO), calcium oxide (CaO), lithium barium fluoride ($LiBaF_3$).

In general, the condition $NA/n_f$>0.8 may be fulfilled where NA is the image-side numerical aperture and $n_f$ is the refractive index of the image space.

Figure 9D:
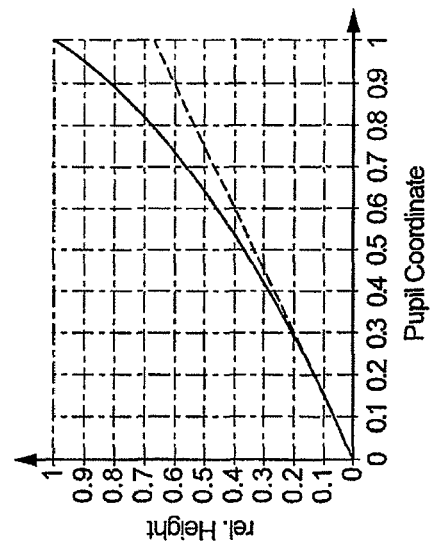
Figure 9C:
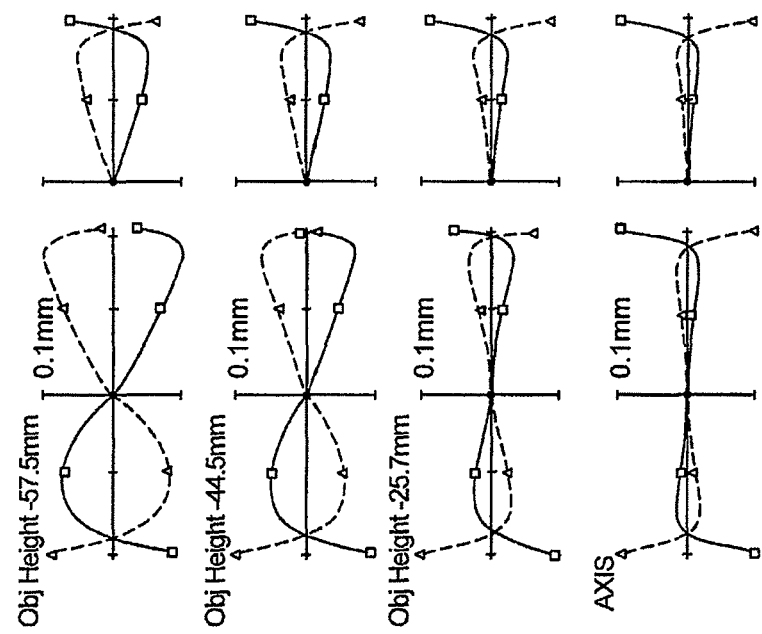
Figure 9B:
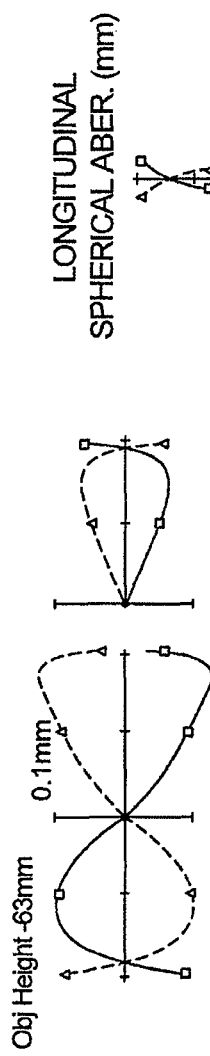

The optical performance with respect to correction of chromatic aberrations is shown in FIG. 9B to 9D.

Figure 10A:
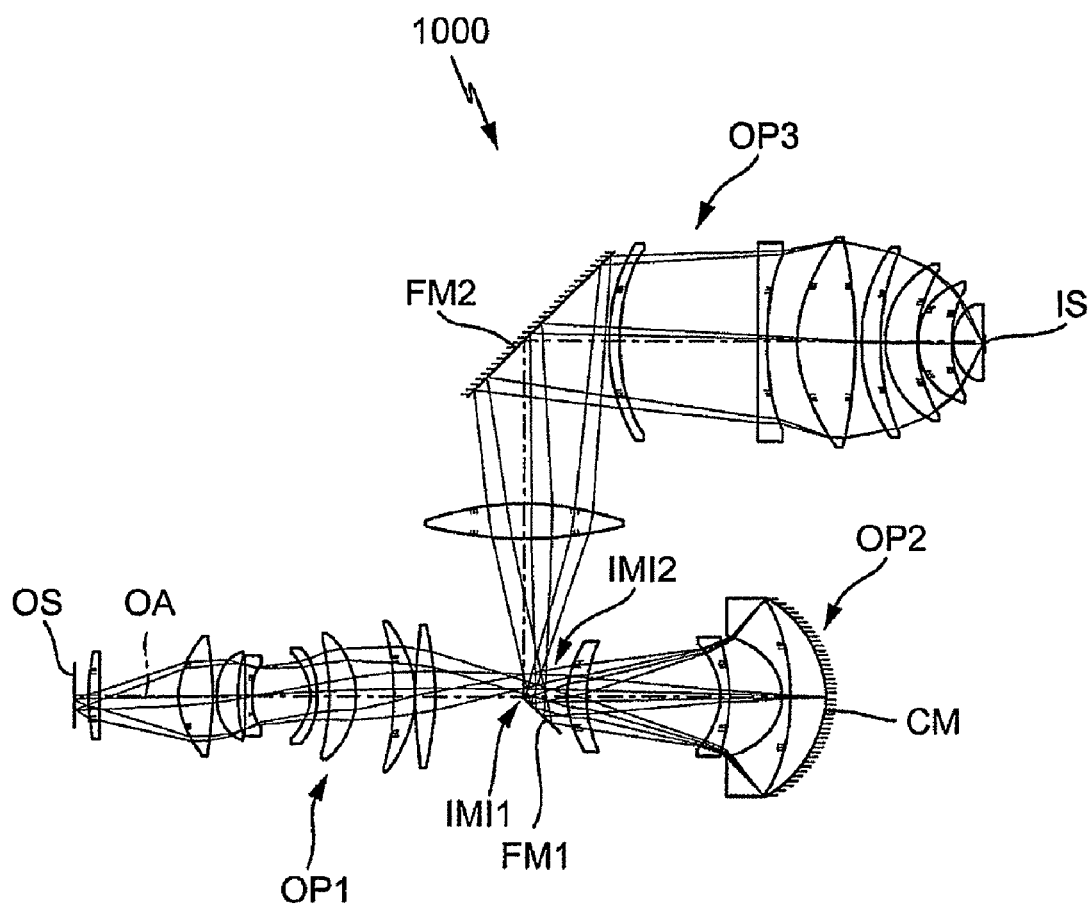
FIG. 10 shows a meridional section of a sixth embodiment of a catadioptric projection objective in 10A and diagrams illustrating optical properties thereof in FIG. 10B to 10D.

FIG. 10A shows a meridional section of a catadioptric projection objective 1000 designed for a nominal UV-operating wavelength λ=193 nm (sixth embodiment). An image-side numerical aperture NA=1.35 is obtained at a reducing magnification 4:1 (β=−0.25) in a rectangular off-axis image field with size 26 mm×5.5 mm. The radius $R_{DOF}$ of the design object field, also denoted object field height OBH, is 61 mm. The specification is given in tables 10, 10A.

The general layout of the projection objective 1000 corresponds to the general layout of the first embodiment shown in FIG. 5A. Reference is made to the corresponding description. Features and feature groups with corresponding structure or function are designated by identical or similar reference identifications. Objective 1000 may be considered as a variant of the objective type shown in FIG. 5A, 6A, 7A or 8A in some respects. Objective 1000 realizes further improvements of chromatic correction when compared to those embodiments. Specifically, further efforts were made to optimize the optical performance such that a very low level of spherochromatism (chromatic variation of spherical aberration) is obtained for most or all rays of the beam passing through the objective. As a consequence, the improved correction allows utilizing primary laser light sources having a wavelength bandwidth (FWHM) even larger than for the previous embodiments, such that this embodiment almost shows a real polychromatic correction of the wave front.

All lenses are made of the same material, namely fused silica ($SiO_2$). With other words, no second material, such as calcium fluoride, is needed for the correction. Manufacturing of such systems is therefore facilitated, and costs are reduced when compared to systems employing at least one second material.

Figure 10B:
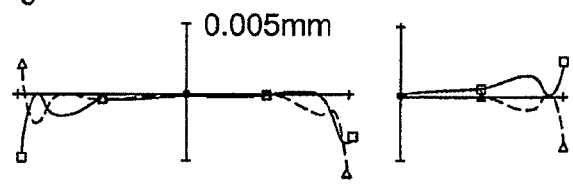
Figure 10B:
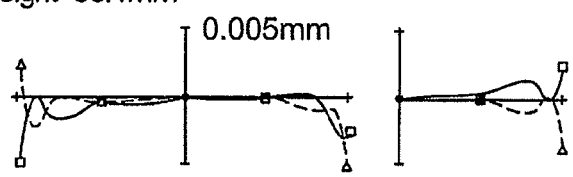
Figure 10B:
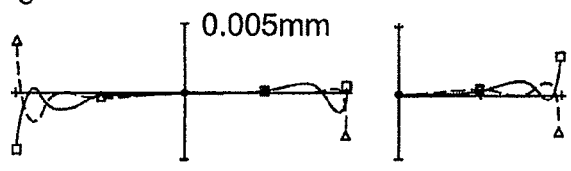
Figure 10B:
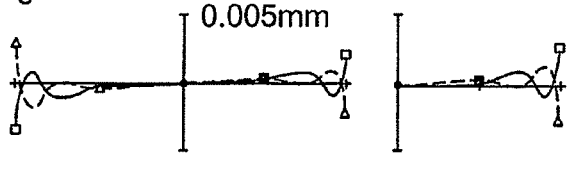
Figure 10B:
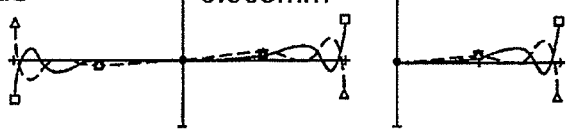
Figure 10C:
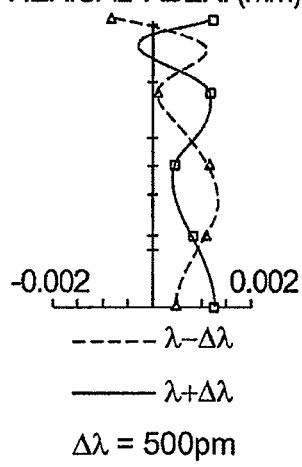

In order to demonstrate key features of the optical performance FIG. 10B shows ray intercept plots for representative field points at different object heights from a wavelength band with absolute width 1 nm from $\lambda-\Delta\lambda$ to $\lambda+\Delta\lambda$ with $\Delta\lambda=500$ pm. FIG. 10C shows a diagram of the longitudinal axial chromatic aberration, AX, for a field point on the optical axis. Although the curves appear to be similar when compared to the previous embodiments, it is to be noted that the scales for the magnitude of the aberrations differ significantly. Particularly, the maximum value of the scale for the ray intercept plots (FIG. 10B) is 5 µm instead of 100 µm in the previous embodiments. Further, the maximum value of the scale for AX (FIG. 10C) is 2 µm instead of 200 µm in the previous embodiments. Therefore, these aberration are smaller than those of the previous embodiments by about a factor 100.

Figure 10D:
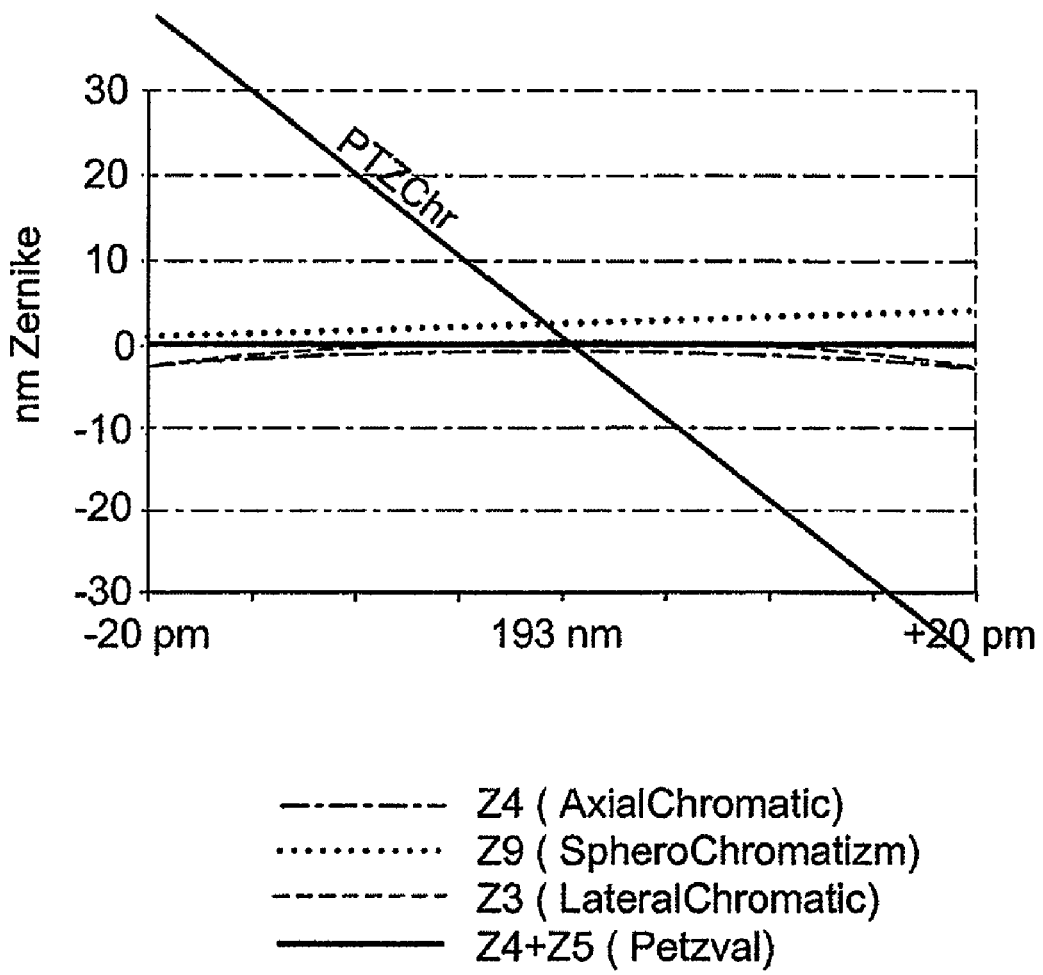

To further demonstrate the near-perfect chromatic correction FIG. 10D presents data for the chromatic variation of selected Zernike coefficients over the wavelength in a wavelength range 193 nm±20 pm. The curves represent the variation of Z4 (focus) for an axial field point (designated as AxialChromatic), the variation of Z3 (distortion) for the edge of the field (designated by Lateral Chromatic), the variation of Z9 (aspherical aberration) for an axial field point (designated by SpheroChromatism) and the sum of Z4 (field curvature) and Z5 (astigmatism) for the field edge minus the value of Z4 at the centre of the field. The latter curve is designated by Petzval (or PTZChr). It is evident from the FIG. 10D that all chromatic variations of the aberrations except for the chromatic variation of the Petzval sum are almost completely corrected, as described above. The resulting spectral bandwidth corresponds to multiples of 10 pm, which means that primary light sources with large spectral bandwidth can be used and still an image significantly unaffected by chromatic variations of those aberrations may be obtained.

Figure 11:
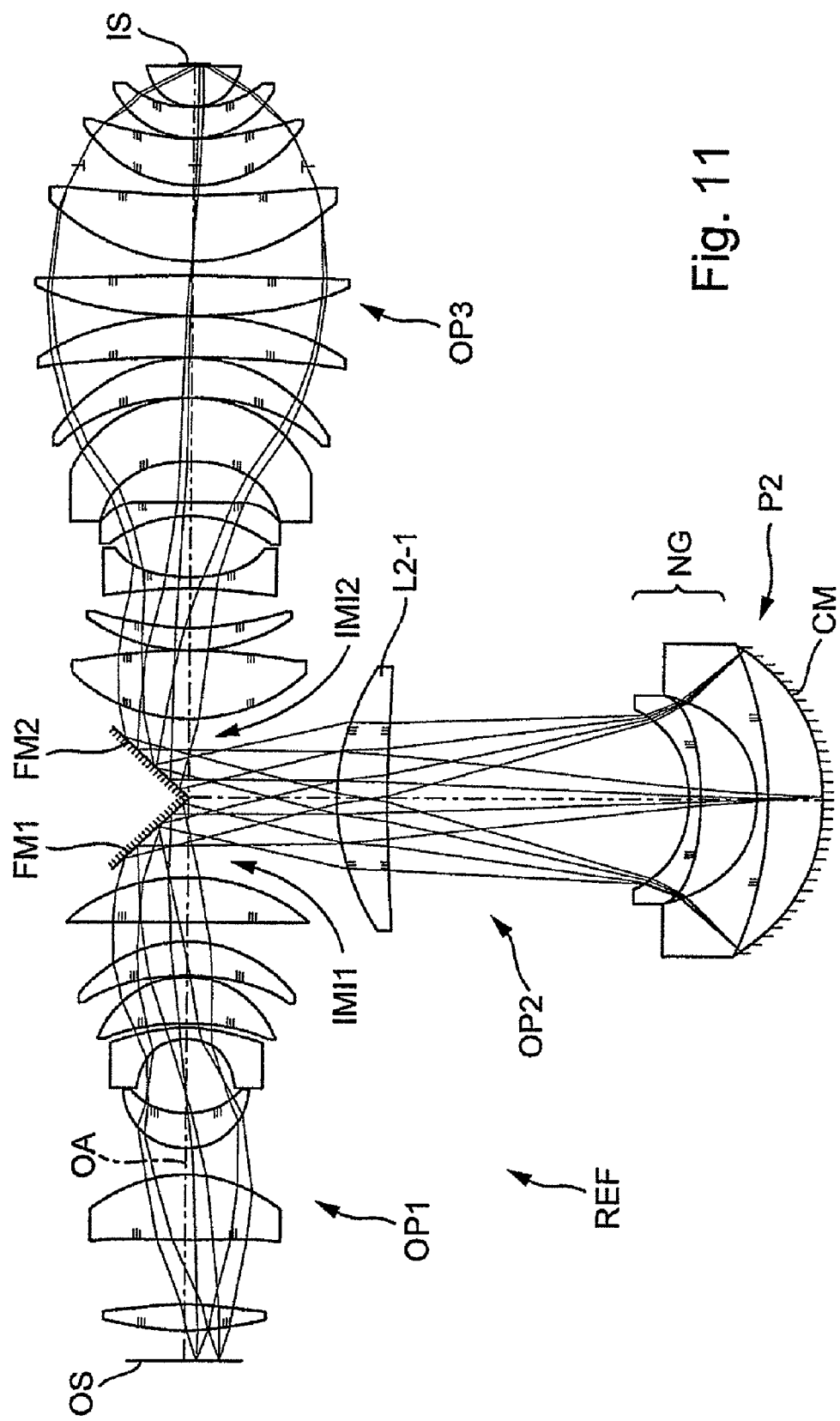
FIG. 11 shows a meridional section of a catadioptric projection objective used as a reference system for subsequent embodiments.

Further catadioptric projection objectives according to the general design of projection objective 900 in FIG. 9A are now discussed in connection with FIGS. 11 to 14. FIG. 11 shows a reference system with REF provided only for reasons of comparison, and FIGS. 12 and 13 show a seventh and an eighth embodiment, respectively.

The sequence of imaging objective parts (refractive (only lenses, no curved mirror)-catadioptric (combination of one or more curved mirror and one or more lenses)-refractive) is the same as in the previous embodiments. However, the folding geometry is different from the embodiments shown in FIGS. 3A, 5A, 6A, 7A and 8A. Specifically, the second objective part OP2 includes a single concave mirror CM situated at the second pupil surface P2. A first planar folding mirror FM1 is arranged optically close to the first intermediate image IMI1 at an angle of 45° to the optical axis OA such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface. The folding mirrors FM1, FM2 are each located in the optical vicinity of, but at a small distance from the closest intermediate image. A double pass region where the radiation passes twice in opposite directions is thereby formed geometrically between the deflecting mirrors FM1, FM2 and the concave mirror CM. A single positive lens L2-1 is arranged in the double pass region geometrically close to the folding mirrors FM1, FM2 and optically close to both the first and second intermediate images, thereby acting as a positive field lens. A negative group NG having two negative lenses is arranged in a region with large marginal ray height near the concave mirror and coaxial with the concave mirror such that the radiation passes twice in opposite directions through the negative group. No optical element is arranged between the negative group and the concave mirror.

The reference system REF in FIG. 11 is designed for a nominal UV-operating wavelength $\lambda=193$ nm. An image-side numerical aperture NA=1.35 is obtained at a reducing magnification 4:1 ($\beta=-0.25$) in a rectangular off-axis image field with size 26 mm×5.5 mm. The radius $R_{DOF}$ of the design object field, also denoted object field height OBH, is 62.5 mm. The specification is given in tables 11, 11A.

Figure 12:
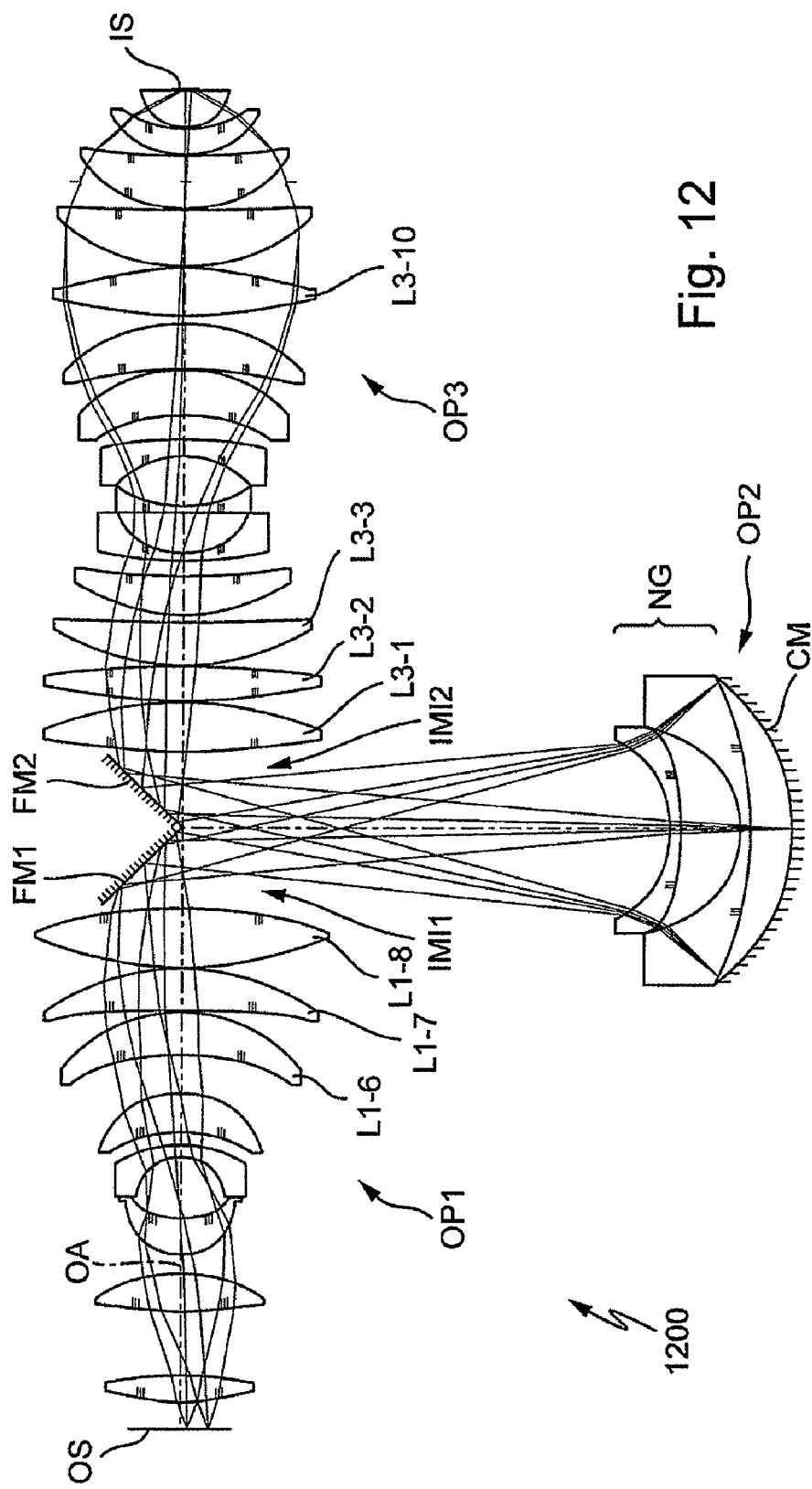
FIG. 12 shows a meridional section of a seventh embodiment of a catadioptric projection objective.
Figure 13:
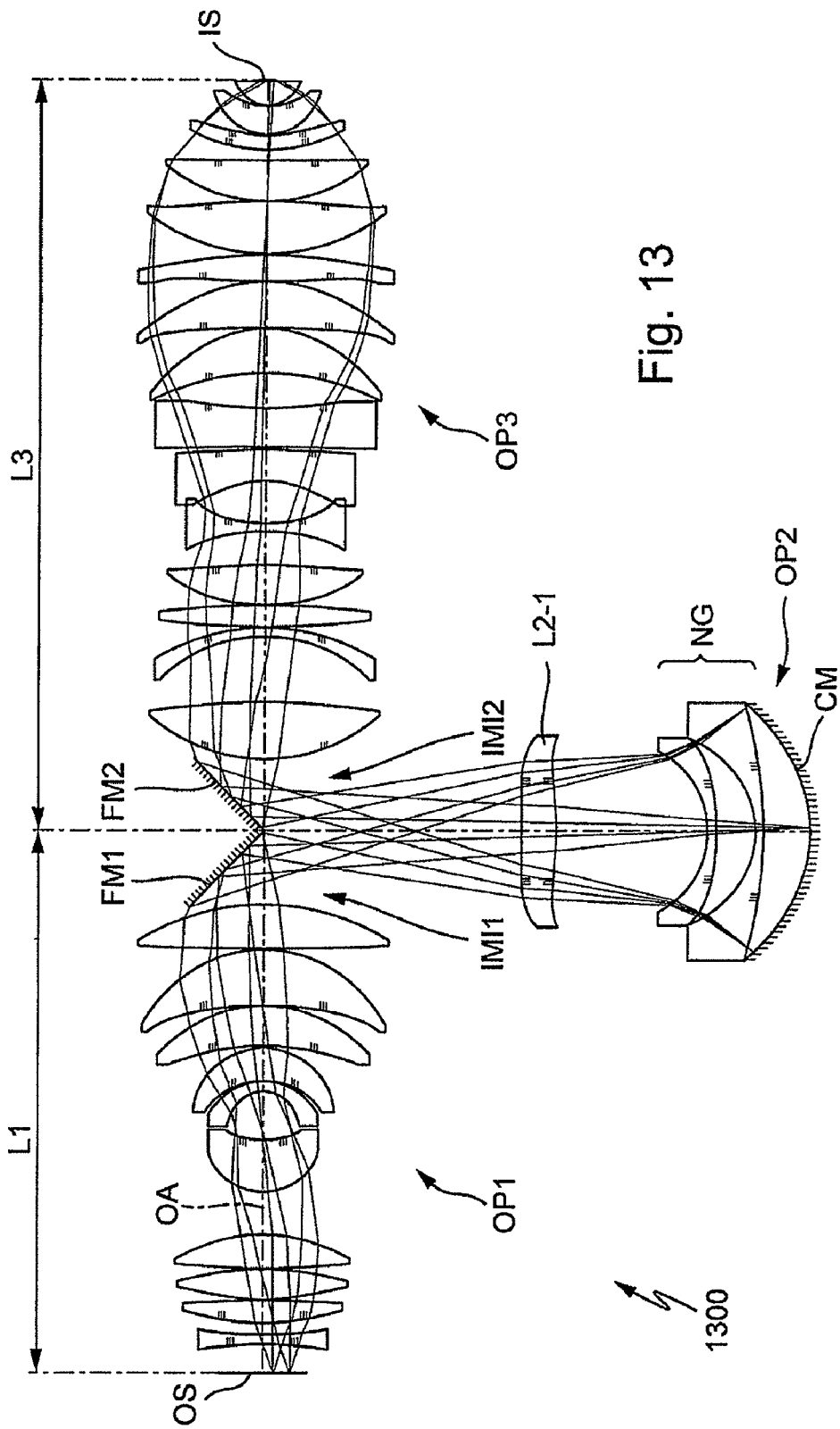
FIG. 13 shows a meridional section of an eighth embodiment of a catadioptric projection objective.

FIG. 12 shows a catadioptric projection objective 1200 designed for $\lambda=193$ nm (seventh embodiment). An image-side numerical aperture NA=1.35 is obtained at a reducing magnification 4:1 ($\beta=-0.25$) in a rectangular off-axis image field with size 26 mm×5.5 mm. The radius $R_{DOF}$ of the design object field, also denoted object field height OBH, is 60 mm. The specification is given in tables 12, 12A.

A comparison with the reference system of FIG. 11 shows immediately a significant structural difference. While a positive lens L2-1 is inserted in the double pass region geometrically between the folding mirrors and the concave mirror CM of the reference system, there is no positive lens arranged between the concave mirror CM and the deflecting mirrors FM1, FM2 in projection objective 1200. In other words the second objective part OP1 has only three optical elements, namely the concave mirror CM and the two negative lenses of the negative group NG. The absence of a positive field lens between the deflecting mirrors and the concave mirror is compensated for by shifting the collecting refractive power into the positive lenses L1-8, L1-7, L1-6 etc. immediately upstream of the first folding mirror FM1 and L3-1, L3-2, L3-3 etc. immediately downstream of the second folding mirror FM2. The free optical diameter of these positive lenses is increased relative to the corresponding lenses in the reference system REF. In objective 1200 at least one of the first, second and third lens following downstream of the second folding mirror (particularly L3-1, L3-2 and L3-3) has a free optical diameter larger than the free optical diameter of the largest lens in the image-side belly of the third objective part (here L3-10). Yet in other words, a largest lens of the third objective part is situated geometrically closer to the second folding mirror FM2 than to the image surface IS.

As mentioned above, it has been found that caustic conditions in the regions close to the folding mirrors may occur concurrently with the reduction of pupil distortion. As used herein, the term "caustic condition" refers to a situation where different rays emitted from an object point at different numerical aperture intersect in a region (caustic region) within the optical system which is not exactly optically conjugate to the object surface. A surface imperfection on an optical surface (lens surface or mirror surface) positioned in a caustic region, such as a scratch or a particle, may therefore have an influence on rays emitted from an object point at different aperture angles, thereby potentially deteriorating imaging quality substantially more than an imperfection placed outside a caustic region. The eighth embodiment shown in FIG. 13 has been particularly optimized to avoid such problems associated with caustic conditions.

FIG. 13 shows a catadioptric projection objective 1300 designed for $\lambda=193$ nm (seventh embodiment). An image-side numerical aperture NA=1.35 is obtained at a reducing magnification 4:1 ($\beta=-0.25$) in a rectangular off-axis image field with size 26 mm×5.5 mm. The radius $R_{DOF}$ of the design object field, also denoted object field height OBH, is 62.5 mm. The specification is given in tables 13, 13A.

In an ideal imaging process (without intermediate image), all rays emitted from an object point intersect only at an image point optically conjugate to the object point. However, in cases of significant aberrations those rays may already intersect in regions some distance from the nominal image surface. Such caustic conditions may cause that some regions of the pupil may be disturbed by inhomogeneities within the optical material as well as on optical surfaces of optical elements arranged in a caustic region. In extreme this may cause that specific pupil areas may not be imaged at all, while instead the inhomogeneities present in the caustic region may be imaged onto the image surface. Negative effects of caustic conditions may be reduced or avoided if high requirements on the quality of optical surfaces and the optical material are placed, which typically tends to increase the costs of manufacturing significantly. On the other hand, if an optical design is optimized such that no optical surface is placed in a region of caustic conditions, then the manufacturing requirements may be relaxed, thereby reducing the costs of manufacturing without negative impact on optical performance.

The optical design of objective 1300 has been optimized on the one hand such that the first and second intermediate image IMI1 and IMI2 show a better correction than the respective intermediate images in the reference system. Further, the optimization has been performed such that the optical distance between an intermediate image and the closest folding mirror is increased relative to the reference system. Specifically, the first intermediate image IMI1 is placed at a larger distance downstream of the first folding mirror FM1, whereas the second intermediate image IMI2 is placed at a larger optical distance upstream of the second folding mirror. One structural modification effective for obtaining these beneficial features is to increase the length provided for the lenses of the first objective part OP1, and provided for the lenses of the third objective part OP3, respectively.

An increase in physical length of the space provided for the lenses of the third objective part appears to be particularly helpful. If L1 is a first length measured along the optical axis OA between the object surface OS and the intersection of the optical axis with the first deflecting mirror FM1, and L3 is a third length measured along the optical axis between the intersection with the second deflecting mirror FM2 and the image surface IS, a length ratio L1/L3 between the first length and the third length may be defined. If the third length increases disproportionally large, this length ratio tends to become smaller. It has been found beneficial if the length ratio L1/L3 is smaller than 0.8. If the length ratio is increased significantly over this threshold value it becomes increasingly difficult to avoid caustic conditions at the folding mirrors. The length ratio may be smaller than that, for example L1/L3<0.75. In the embodiment of FIG. 13, the length ratio L1/L3=0.72.

Figure 14A:
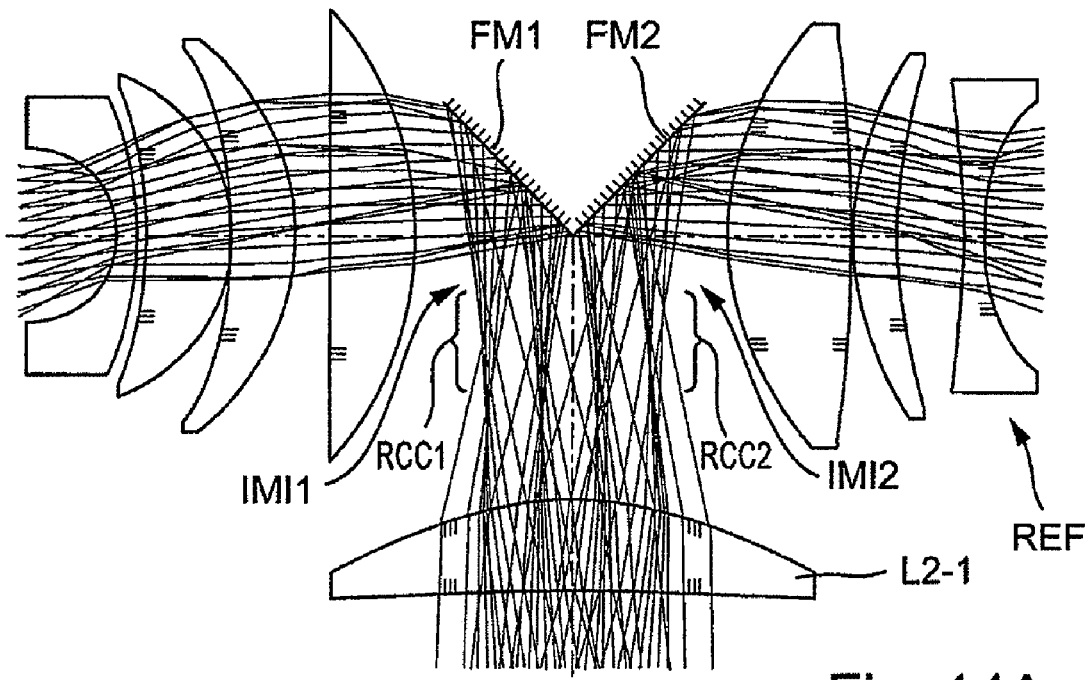
FIG. 14A shows the caustic conditions for the reference system of FIG. 11
Figure 14B:
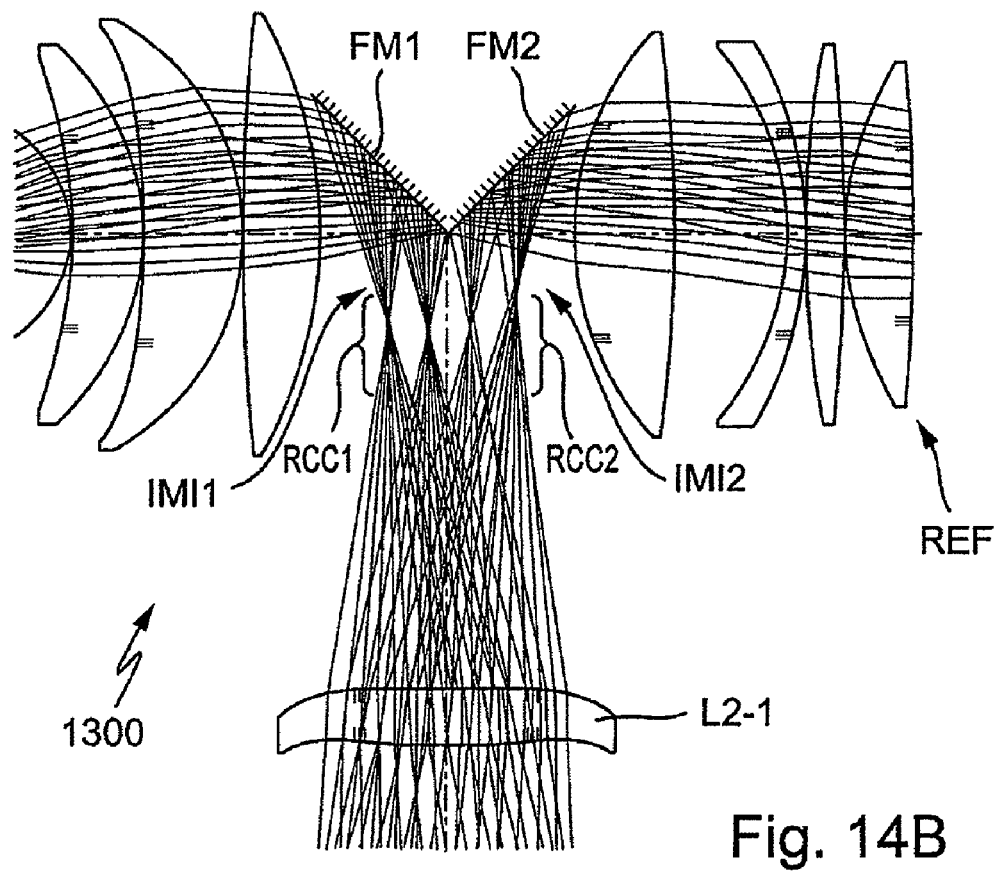
FIG. 14B shows the caustic conditions for the eighth embodiment shown in FIG. 13.

FIGS. 14A and 14B are provided to visualize the improvements with regard to caustic conditions. FIG. 14A shows an enlarged detail of the region close to the folding mirrors FM1, FM2 of the reference system REF in FIG. 11 and selected rays propagating through the projection objective. In contrast, FIG. 14B shows the corresponding region in the embodiment of FIG. 13.

It is evident that in the reference system the region RCC1 of caustic condition associated with the first intermediate image INI1 extends over both the first folding mirror FM1 and the downstream positive lens L2-1. Likewise, the region RCC2 of caustic condition associated with the second intermediate image IMI2 extends across both the positive lens L2-1 and the second folding mirror FM2 situated downstream of the weakly defined intermediate image. In contrast, there is no overlap of the region of caustic conditions with any optical surface near the intermediate images. Although relatively small regions of caustic conditions still exist at the intermediate images, all optical surfaces near the intermediate images lie outside the region RCC1 of caustic conditions associated with the first intermediate image IMI1 and the region RCC2 of caustic conditions associated with the second intermediate image IMI2. Therefore, even if there would be surface imperfections on the folding mirrors or imperfections on or in the positive lens nearest to the intermediate images, those imperfections would have only little influence on the optical performance.

Some or all of the embodiments discussed above may be characterized by one or more of the following characteristics.

An embodiment may be characterized by a maximum value for the angle of incidence in the third objective part (close to the image surface) which is smaller than in conventional systems having the same numerical aperture. Typically, conventional systems having an image-side numerical aperture NA and a refractive index $n_i$ in the image space (between an exit surface of the objective and the image surface) may have a maximum value for the angle of incidence, $i_{MAX}$, in the order of $\sin(i_{MAX}) \cong NA/n_i$. Where a conventional system has a constriction of beam diameter (so-called waist) in the third objective part the maximum value of angles of incidence may occur in the region of the waist upstream of the region of maximum beam diameter around the pupil surface closest to the image surface. For example, large angles of incidence occur on the concave exit surface of lens L3-5 in prior art system 300 in FIG. 3A. In contrast, some embodiments having significantly reduced pupil distortion do not have maximum angles of incidence in that order. Instead, in some embodiments a maximum angle of incidence on an optical surface of an imaging objective part imaging a last intermediate image onto the image surface fulfils the condition $\sin(i_{MAX}) < E \times NA/n_i$, wherein NA is the image-side numerical aperture, $n_i$ is the refractive index in the image space, and E=0.95. The upper limit may be smaller, such as E=0.90 or E=0.85.

Further, in embodiments having one or more real intermediate images, it has been found that a significant amount of coma may be given at the intermediate images. It is considered that a significant reduction of pupil distortion beneficial for reducing the spherochromatism may imply that the sine condition between the last intermediate image (intermediate image closest to the image surface) and the image surface may not be completely corrected. Therefore, in order to suppress coma in the image surface, it has been found that a significant amount of coma can be present in the intermediate image closest to the image surface. In systems having two intermediate images and a catadioptric objective part imaging a first intermediate image onto a second intermediate image a significant amount of coma may be present in both intermediate images due to the symmetry of the catadioptric objective part.

Further, it has been found that caustic conditions in the regions close to the folding mirrors may occur concurrently with the reduction of pupil distortion. As used herein, the term "caustic condition" refers to a situation where different rays emitted from an object point at different numerical aperture intersect in a region (caustic region) within the optical system. Where an optical surface is positioned in a caustic region, i.e. in a region where caustic conditions exist, different rays emitted from an object point at different numerical aperture may intersect on the optical surface or in the vicinity thereof. A surface imperfection on an optical surface positioned in a caustic region, such as a scratch or a particle, may have an influence on rays emitted from an object point at different aperture angles, thereby potentially deteriorating imaging quality substantially more than an imperfection placed in a region outside a caustic region. Therefore, careful control of caustic conditions near folding mirrors should be considered when controlling spherochromatism. The presence of caustic conditions is typically correlated to a substantial amount of coma at the intermediate images.

Further, it has been found that an essentially aplanatic construction of the image-side end of the objective is facilitated if a relatively large value of meridional pupil curvature is admitted in the region of the pupil surface closest to the image surface, such as the third pupil surface in the embodiments shown in the drawings. Where a variable aperture stop is to be placed in the region of aperture error it may be advantageous to construct the aperture stop such that it has an aperture stop edge determining the aperture stop diameter, where the axial position of the aperture edge with reference to the optical axis is varied as a function of the aperture stop diameter. This permits optimum adaption of the effective aperture stop position to the beam path as a function of the aperture stop diameter. Alternatively, a variable aperture stop may be positioned at a pupil surface optically conjugate to the image-side pupil surface, which may have no stop curvature. In some embodiments, a variable aperture stop is therefore positioned in the first objective part imaging the object surface into the first intermediate image. An aperture stop close to or at the concave mirror may also be used in some embodiments.

Some concepts proposed to improve chromatic correction, particularly correction of spherochromatism, have been discussed above used exemplary embodiments designed for 193 nm operating wavelength. The improvement in correaction of spherochromatism allows to utilize primary laser light sources having a wavelength band width (FWHM) significantly larger than the band width of conventional excimer laser light sources with dedicated bandwidth narrowing devices. For example, the light source may have a wavelength difference $\Delta\lambda \geq 0.5$ pm or $\Delta\lambda > 1$ pm or $\Delta\lambda \geq 2$ pm or $\Delta\lambda > 5$ pm or $\Delta\lambda \geq 10$ pm or more. The concepts may also be used in other wavelength regions, such as around 248 nm, or around 157 nm.

The term wavelength difference $\Delta\lambda$ of a radiation source as used here to characterize the bandwidth of the radiation source refers to the Full Width at Half Maximum (FWHM) of the emission spectrum of the radiation source, which characterizes the spectral width of the radiation source about a central wavelength.

Table A below summarizes the properties related to parameters described in connection with eqns. (1) to (11).

TABLE A

Figure 5F:
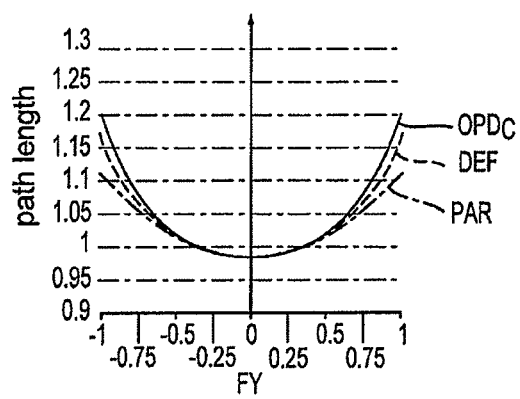
Figure 5G:
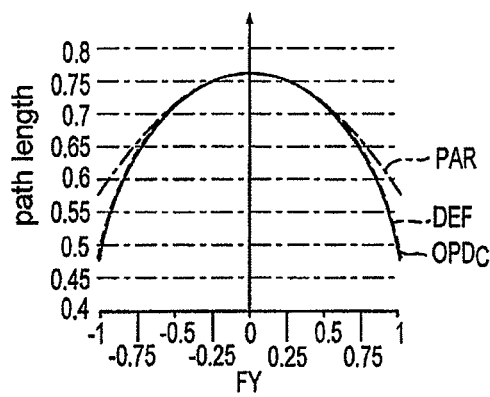

| FIG. | Typ | NA | λ [nm] | A' | A |
|---|---|---|---|---|---|
| Prior Art/FIG. 3 | R-C-R | 1.30 | 193 | 1.054 | 0.37 |
| FIG. 5 | R-C-R | 1.35 | 193 | 0.312 | 0.09 |
| FIG. 6 | R-C-R | 1.35 | 193 | 0.066 | 0.02 |
| FIG. 7 | R-C-R | 1.35 | 193 | 0.145 | 0.04 |
| FIG. 8 | R-C-R | 1.35 | 193 | 0.073 | 0.02 |
| FIG. 9 | R-C-R | 1.55 | 193 | 0.118 | 0.02 |
| FIG. 10 | R-C-R | 1.35 | 193 | 0.001 | 0.0003 |
| FIG. 11 (REF) | R-C-R | 1.35 | 193 | 0.0024 | 0.0006 |
| FIG. 12 | R-C-R | 1.35 | 193 | 0.0003 | 0.01 |
| FIG. 13 | R-C-R | 1.35 | 193 | 0.004 | 0.013 |

Table B below summarizes the properties related to the maximum pupil distortion within the focusing lens group imaging the final intermediate image onto the image surface. In the table, "srf" is the optical surface where the maximum pupil distortion $PD_{MAX} = \text{Max}(D_P)$ occurs. Note that $D_P = V/NA^3$. The indication "ims-5" indicates that this surface is the 5$^{th}$ surface upstream of the image surface.

TABLE B

| | Prior Art FIG. 3 | FIG. 5 | FIG. 6 | FIG. 7 | FIG. 8 | FIG. 9 |
|---|---|---|---|---|---|---|
| NA | 1.30 | 1.35 | 1.35 | 1.35 | 1.35 | 1.55 |
| V [%] | 52.56 | 26.81 | 28.68 | 24.59 | 23.32 | 40.27 |
| srf | ims-7 | ims-5 | ims-5 | ims-7 | ims-5 | ims-7 |
| $PD_{MAX}$ | 23.92 | 10.89 | 11.65 | 9.99 | 9.48 | 10.81 |

| | FIG. 10 | FIG. 11 (REF) | FIG. 12 | FIG. 13 |
|---|---|---|---|---|
| NA | 1.35 | 1.35 | 1.35 | 1.35 |
| V [%] | 11.9 | 23.9 | 25.4 | 8.5 |
| srf | ims-7 | ims-7 | ims-7 | ims-7 |
| $PD_{MAX}$ | 4.83 | 9.71 | 10.3 | 3.5 |

The wavelength band may include wavelengths $\lambda \geq 300$ nm. For example where primary radiation is provided by a mercury vapour radiation source the wavelength band may include at least one of the mercury g-, h- and i-lines. In some embodiments the wavelength band may include at least two mercury spectral lines, for example each of the mercury g-, h- and i-lines. The wavelength band may include wavelengths $\lambda < 300$ nm, such as $\lambda < 260$ nm or $\lambda < 200$ nm, for example. The wavelength may be larger than 100 nm or larger than 150 nm. Wavelengths smaller than 300 nm may be provided by a laser radiation source.

The wavelength band may include radiation of one spectral line region only, where a considerable amount of energy of the spectral line region may be used. The wavelength difference $\Delta\lambda$ may be 0.1 nm or more or 1 nm or more or 2 nm or more in some cases. Larger wavelength differences are possible, such as $\Delta\lambda > 5$ nm. In some embodiments $\Delta\lambda > 10$ nm, or $\Delta\lambda > 25$ nm, or $\Delta\lambda > 50$ nm. For example where the wavelength band includes each of the mercury g-, h- and i-lines $\Delta\lambda$ may be larger than 70 nm. $\Delta\lambda$ may be smaller than 200 nm or smaller than 100 nm.

Catadioptric objectives useful for broadband application with sufficient control of the chromatic variation of spherical aberration may be configured in a variety of ways.

For example, folded catadioptric projection objectives having at least one intermediate image which have one or more planar folding mirrors in combination with a single catadioptric group designed in the manner of a "Schupmann achromat" basically as disclosed in U.S. Pat. No. 6,909,492 B2 or US 2004/0160677 A1 or US 2003/0011755 A1 or U.S. Pat. No. 6,665,126 or EP 1 480 065 may be modified. Folded designs with more than one catadioptric group designed in the manner of a "Schupmann achromat" basically as disclosed in WO 2005/040890 my also be modified. Unfolded projection objectives (in-line systems) having a concave mirror arranged near the pupil and having a further concave mirror as shown e.g. in EP 1 069 448 A1 may be modified. Other in-line systems, in part having four or six concave mirrors, basically as shown in the U.S. Pat. No. 6,636,350 or U.S. Pat. No. 6,995,918 may be modified. Those system types can be utilized in principle, with corresponding adaptation, in the context of embodiments.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The content of all the claims is made part of this description by reference.

The following tables summarize specifications of embodiments described above. In the tables, column 1 specifies the number of a refractive surface or a reflective surface or a surface distinguished in some other way, column 2 specifies the radius r (radius of curvature) of the surface (in mm), column 3 specifies the distance d—also denoted as thickness—between the surface and the subsequent surface (in mm), and column 4 specifies the material of the optical components. Column 5 indicates the refractive index of the material, and column 6 specifies the optically free radius or the optically free semidiameter (or the lens height) of a lens surface or other surfaces (in mm). Radius r=0 corresponds to a planar surface.

The table or tables are designated by the same numbers as the respective figures. A table with additional designation "A" specifies the corresponding aspheric or other relevant data. The aspheric surfaces are calculated according to the following specification:

$$p(h)=[((1/r)h^2)/(1+SQRT(1-(1+K)(1/r)^2h^2))]+C1*h^4+C2*h^6+$$

In this case, the reciprocal (1/r) of the radius specifies the surface curvature and h specifies the distance between a surface point and the optical axis (i.e. the ray height). Consequently, p(h) specifies the so-called sagitta, that is to say the distance between the surface point and the surface vertex in the z direction (direction of the optical axis). Constant K is the conic constant, and parameters, C1, C2 are aspheric coefficients.

TABLE 5

NA = 1.35; OBH = 61 mm.

| SURF | RADIUS | THICKNESS | MATERIAL | INDEX | SEMI-DIAM. |
|---|---|---|---|---|---|
| 0 | 0.000000 | 79.699853 | | | 61.0 |
| 1 | 252.236386 | 34.957316 | SILUV | 1.560970 | 95.9 |
| 2 | −619.121972 | 141.674876 | | | 96.7 |

TABLE 5-continued

NA = 1.35; OBH = 61 mm.

| SURF | RADIUS | THICKNESS | MATERIAL | INDEX | SEMI-DIAM. |
|---|---|---|---|---|---|
| 3 | 256.803480 | 40.725875 | SILUV | 1.560970 | 103.4 |
| 4 | −702.627279 | 0.999540 | | | 101.6 |
| 5 | 103.077560 | 73.478652 | SILUV | 1.560970 | 86.8 |
| 6 | 229.216936 | 24.877568 | | | 64.8 |
| 7 | −515.877323 | 9.999886 | SILUV | 1.560970 | 54.4 |
| 8 | 197.764019 | 27.644154 | | | 55.0 |
| 9 | −106.333536 | 15.071430 | SILUV | 1.560970 | 55.8 |
| 10 | −297.876602 | 1.001179 | | | 64.2 |
| 11 | 263.516618 | 36.381527 | SILUV | 1.560970 | 71.9 |
| 12 | 2470.993921 | 115.380488 | | | 75.9 |
| 13 | 3185.145683 | 42.298903 | SILUV | 1.560970 | 119.5 |
| 14 | −309.790966 | 1.000292 | | | 123.0 |
| 15 | 875.087153 | 37.862683 | SILUV | 1.560970 | 128.5 |
| 16 | −426.894608 | 0.999712 | | | 128.8 |
| 17 | −738.188907 | 43.298477 | SILUV | 1.560970 | 128.4 |
| 18 | −260.126183 | 226.901120 | | | 130.0 |
| 19 | 154.381258 | 84.839745 | SILUV | 1.560970 | 83.1 |
| 20 | 162.698370 | 209.739975 | | | 74.1 |
| 21 | −116.385349 | 15.000000 | SILUV | 1.560970 | 91.9 |
| 22 | −265.578130 | 101.592496 | | | 109.0 |
| 23 | −142.874458 | 15.000000 | SILUV | 1.560970 | 129.4 |
| 24 | −595.820286 | 69.785628 | | | 183.5 |
| 25 | 0.000000 | 0.000000 | REFL | | 353.1 |
| 26 | 231.479468 | 69.785628 | REFL | | 190.3 |
| 27 | 595.820286 | 15.000000 | SILUV | 1.560970 | 182.6 |
| 28 | 142.874458 | 101.592496 | | | 129.1 |
| 29 | 265.578130 | 15.000000 | SILUV | 1.560970 | 109.2 |
| 30 | 116.385349 | 209.739975 | | | 92.4 |
| 31 | −162.698370 | 84.839745 | SILUV | 1.560970 | 79.3 |
| 32 | −154.381258 | 292.702131 | | | 90.1 |
| 33 | 601.258216 | 51.197529 | SILUV | 1.560970 | 150.4 |
| 34 | −617.952852 | 770.907937 | | | 151.6 |
| 35 | 344.053181 | 82.785609 | SILUV | 1.560970 | 198.8 |
| 36 | 28155.574657 | 58.981300 | | | 196.0 |
| 37 | −352.930380 | 20.000031 | SILUV | 1.560970 | 193.6 |
| 38 | 380.893477 | 11.870206 | | | 196.7 |
| 39 | 391.223791 | 113.592119 | SILUV | 1.560970 | 198.6 |
| 40 | −412.306844 | 0.999781 | | | 200.0 |
| 41 | 1143.777776 | 34.998057 | SILUV | 1.560970 | 188.2 |
| 42 | −884.565577 | 72.654667 | | | 185.6 |
| 43 | 0.000000 | −71.654908 | | | 167.1 |
| 44 | 190.037914 | 81.894794 | SILUV | 1.560970 | 165.0 |
| 45 | 285.667075 | 0.999640 | | | 156.9 |
| 46 | 120.329406 | 85.000740 | SILUV | 1.560970 | 115.2 |
| 47 | 302.740032 | 0.999100 | | | 91.6 |
| 48 | 76.191308 | 56.776542 | SILUV | 1.560970 | 63.4 |
| 49 | 0.000000 | 3.000000 | WATER | 1.437000 | 23.7 |
| 50 | 0.000000 | 0.000000 | | | 15.3 |

TABLE 5A

Aspheric constants

| | SRF | | | | |
|---|---|---|---|---|---|
| | 1 | 4 | 12 | 17 | 24 |
| K | 0 | 0 | 0 | 0 | 0 |
| C1 | −1.856912E−08 | 2.988048E−08 | 3.385596E−08 | −1.892460E−08 | −9.120248E−09 |
| C2 | −2.999437E−14 | −2.591210E−12 | 1.684339E−12 | −1.072152E−13 | 2.043631E−13 |
| C3 | 9.789963E−18 | 2.098682E−16 | −1.357033E−16 | −2.261229E−20 | −5.094304E−18 |
| C4 | −1.791411E−21 | −1.534328E−20 | 2.308354E−21 | −1.992350E−23 | 1.059377E−22 |
| C5 | 1.252043E−25 | 6.945086E−25 | 2.225337E−25 | 3.919726E−28 | −1.521327E−27 |
| C6 | −3.727304E−30 | −1.420320E−29 | −1.282163E−29 | −1.004348E−32 | 1.114216E−32 |

| | SRF | | | | |
|---|---|---|---|---|---|
| | 32 | 33 | 36 | 39 | 42 |
| K | 0 | 0 | 0 | 0 | 0 |
| C1 | 8.517862E−09 | −2.180535E−09 | −1.877379E−10 | −1.723021E−09 | 1.838856E−08 |
| C2 | 1.727459E−13 | −9.979225E−15 | −7.058891E−14 | −1.001868E−13 | −1.978975E−13 |

TABLE 5A-continued

Aspheric constants

| | | | | | |
|---|---|---|---|---|---|
| C3 | 9.754923E−18 | 2.249215E−19 | −1.516246E−18 | −5.761107E−19 | 3.676193E−18 |
| C4 | −1.183354E−22 | −4.874257E−24 | 4.432647E−23 | 2.240171E−23 | −1.329886E−22 |
| C5 | 3.048199E−26 | 1.092445E−28 | −3.878661E−28 | 3.561179E−28 | 1.772197E−27 |
| C6 | 1.791918E−31 | −1.269572E−33 | −7.886497E−34 | −3.893115E−33 | −2.421584E−33 |

| | SRF | |
|---|---|---|
| | 45 | 47 |
| K | 0 | 0 |
| C1 | −3.928047E−08 | 7.057007E−08 |
| C2 | 2.452624E−13 | 3.183072E−12 |
| C3 | 1.494375E−18 | −3.618301E−16 |
| C4 | 6.440220E−22 | 2.801962E−20 |
| C5 | −2.762685E−26 | −1.377647E−24 |
| C6 | 3.349908E−31 | 6.868836E−29 |

TABLE 6

NA = 1.35; OBH = 61 mm

| SURF | RADIUS | THICKNESS | MATERIAL | INDEX | SEMI-DIAM. |
|---|---|---|---|---|---|
| 0 | 0.000000 | 100.722269 | | | 61.0 |
| 1 | 418.617659 | 96.283145 | SILUV | 1.560970 | 101.0 |
| 2 | −298.961265 | 149.663212 | | | 110.8 |
| 3 | 319.265584 | 46.097078 | SILUV | 1.560970 | 114.5 |
| 4 | −551.951638 | 0.999351 | | | 112.9 |
| 5 | 105.603611 | 53.833895 | SILUV | 1.560970 | 91.1 |
| 6 | 368.587751 | 10.931364 | | | 83.4 |
| 7 | 1186.596185 | 38.065478 | SILUV | 1.560970 | 78.9 |
| 8 | 109.055313 | 32.725718 | | | 56.4 |
| 9 | −129.868876 | 67.109032 | SILUV | 1.560970 | 56.6 |
| 10 | −299.217798 | 40.263679 | | | 70.7 |
| 11 | −77.961018 | 32.057966 | SILUV | 1.560970 | 71.2 |
| 12 | −98.485248 | 0.999805 | | | 87.4 |
| 13 | 785.531416 | 47.940513 | SILUV | 1.560970 | 104.1 |
| 14 | −360.060563 | 17.336007 | | | 107.7 |
| 15 | 1215.075618 | 32.095588 | SILUV | 1.560970 | 110.3 |
| 16 | −587.768995 | 16.453010 | | | 110.6 |
| 17 | 1739.974428 | 40.389179 | SILUV | 1.560970 | 108.5 |
| 18 | −340.723709 | 196.458602 | | | 107.8 |
| 19 | 154.384142 | 98.451482 | SILUV | 1.560970 | 77.9 |
| 20 | 159.312653 | 192.360292 | | | 72.3 |
| 21 | −119.477231 | 15.000000 | SILUV | 1.560970 | 98.3 |
| 22 | −187.504646 | 40.277065 | | | 114.0 |
| 23 | −139.566037 | 15.000000 | SILUV | 1.560970 | 119.3 |
| 24 | −661.227141 | 68.113745 | | | 163.0 |
| 25 | 0.000000 | 0.000000 | REFL | | 299.3 |
| 26 | 218.062759 | 68.113745 | REFL | | 172.8 |
| 27 | 661.227141 | 15.000000 | SILUV | 1.560970 | 161.5 |
| 28 | 139.566037 | 40.277065 | | | 119.0 |
| 29 | 187.504646 | 15.000000 | SILUV | 1.560970 | 113.8 |
| 30 | 119.477231 | 192.360292 | | | 98.4 |
| 31 | −159.312653 | 98.451482 | SILUV | 1.560970 | 76.2 |
| 32 | −154.384142 | 300.501864 | | | 84.0 |
| 33 | 674.737489 | 49.125859 | SILUV | 1.560970 | 142.9 |
| 34 | −521.379140 | 607.139117 | | | 144.6 |
| 35 | 800.923493 | 20.045731 | SILUV | 1.560970 | 194.0 |
| 36 | 367.132130 | 0.999039 | | | 195.5 |
| 37 | 345.946141 | 84.145243 | CAFUV | 1.501395 | 199.7 |
| 38 | −3527.689551 | 0.999764 | | | 200.0 |
| 39 | 487.735626 | 98.679036 | CAFUV | 1.501395 | 200.0 |
| 40 | −636.756743 | 23.279808 | | | 197.8 |
| 41 | −346.989989 | 34.637025 | SILUV | 1.560970 | 195.9 |
| 42 | 332.379668 | 19.705989 | | | 194.5 |
| 43 | 443.428806 | 115.480929 | CAFUV | 1.501395 | 196.7 |
| 44 | −393.882308 | 0.999739 | | | 197.9 |
| 45 | 738.331272 | 35.833776 | CAFUV | 1.501395 | 184.1 |
| 46 | −2027.050796 | 71.587121 | | | 181.0 |
| 47 | 0.000000 | −70.587212 | | | 161.7 |
| 48 | 187.913433 | 81.002296 | CAFUV | 1.501395 | 159.4 |
| 49 | 346.663965 | 0.999258 | | | 151.7 |
| 50 | 115.181458 | 82.517778 | SILUV | 1.560970 | 110.3 |
| 51 | 304.252318 | 0.998795 | | | 87.6 |
| 52 | 70.640446 | 53.484568 | SILUV | 1.560970 | 59.7 |
| 53 | 0.000000 | 3.000000 | WATER | 1.437000 | 23.7 |
| 54 | 0.000000 | 0.000000 | | | 15.3 |

TABLE 6A

Aspheric constants

| | SRF | | | | |
|---|---|---|---|---|---|
| | 1 | 10 | 17 | 24 | 32 |
| K | 0 | 0 | 0 | 0 | 0 |
| C1 | −1.919043E−08 | −4.700613E−08 | −1.656366E−08 | −1.237242E−08 | 1.358363E−08 |
| C2 | 2.889047E−15 | −1.377910E−12 | −1.012667E−13 | 3.435078E−13 | 2.541240E−13 |
| C3 | 1.299932E−18 | −9.477643E−17 | 2.908290E−19 | −1.115160E−17 | 3.664232E−18 |
| C4 | −5.217247E−23 | −1.005446E−20 | −2.206474E−23 | 3.139019E−22 | 1.493546E−21 |
| C5 | −5.352568E−28 | 3.065642E−25 | 8.083772E−28 | −6.229074E−27 | −1.266318E−25 |
| C6 | 9.263603E−32 | −1.205373E−28 | −2.201107E−32 | 6.199756E−32 | 6.619834E−30 |

| | SRF | | | | |
|---|---|---|---|---|---|
| | 33 | 35 | 40 | 43 | 46 |
| K | 0 | 0 | 0 | 0 | 0 |
| C1 | −1.975472E−09 | −6.737745E−09 | −1.291536E−08 | −1.615923E−09 | 1.841946E−08 |

TABLE 6A-continued

Aspheric constants

| | | | | | |
|---|---|---|---|---|---|
| C2 | −1.468614E−14 | 8.067110E−15 | 2.027869E−13 | 4.315423E−14 | −3.378031E−13 |
| C3 | 2.867034E−19 | 4.165863E−19 | 2.076934E−19 | 9.389560E−19 | 5.801881E−18 |
| C4 | −3.304700E−24 | 4.584915E−24 | −5.168175E−23 | −5.175321E−23 | −1.937925E−22 |
| C5 | 2.053625E−29 | −7.347546E−30 | 1.027746E−27 | 1.351250E−27 | 2.754528E−27 |
| C6 | 4.276099E−35 | 9.763511E−34 | −7.840058E−33 | −8.421208E−33 | −2.293214E−33 |

| | SRF | |
|---|---|---|
| | 49 | 51 |
| K | 0 | 0 |
| C1 | −3.475276E−08 | 9.070183E−08 |
| C2 | 5.908580E−13 | 1.970982E−12 |
| C3 | −2.277990E−17 | −1.919332E−16 |
| C4 | 1.708444E−21 | 6.248756E−21 |
| C5 | −5.538628E−26 | 2.371176E−25 |
| C6 | 6.461117E−31 | 2.370413E−29 |

TABLE 7

NA = 1.35; OBH = 61 mm

| SURF | RADIUS | THICKNESS | MATERIAL | INDEX | SEMI-DIAM. |
|---|---|---|---|---|---|
| 0 | 0.000000 | 71.940828 | | | 61.0 |
| 1 | 222.139692 | 38.377527 | SILUV | 1.560970 | 93.8 |
| 2 | −588.919875 | 127.897524 | | | 94.5 |
| 3 | 207.360611 | 38.573989 | SILUV | 1.560970 | 95.2 |
| 4 | −1685.831949 | 0.997447 | | | 92.4 |
| 5 | 98.529993 | 75.026169 | SILUV | 1.560970 | 81.3 |
| 6 | 465.110221 | 15.821278 | | | 60.0 |
| 7 | −555.283992 | 9.999653 | SILUV | 1.560970 | 51.2 |
| 8 | 132.341460 | 30.231301 | | | 51.3 |
| 9 | −94.427498 | 9.998227 | SILUV | 1.560970 | 52.4 |
| 10 | −6005.018928 | 1.334128 | | | 62.7 |
| 11 | 441.345930 | 25.008148 | SILUV | 1.560970 | 67.5 |
| 12 | −252.962110 | 94.360880 | | | 70.8 |
| 13 | 1194.475015 | 44.249887 | SILUV | 1.560970 | 120.1 |
| 14 | −274.634569 | 0.998506 | | | 122.4 |
| 15 | 5217.509032 | 32.466772 | SILUV | 1.560970 | 126.5 |
| 16 | −373.598476 | 0.999300 | | | 127.2 |
| 17 | −746.195062 | 77.969182 | SILUV | 1.560970 | 126.9 |
| 18 | −227.188240 | 230.241960 | | | 133.2 |
| 19 | 143.080434 | 41.276449 | SILUV | 1.560970 | 84.3 |
| 20 | 187.194959 | 250.502546 | | | 80.0 |
| 21 | −114.923684 | 15.000000 | SILUV | 1.560970 | 89.5 |
| 22 | −689.662422 | 126.522781 | | | 109.9 |
| 23 | −133.588927 | 15.000000 | SILUV | 1.560970 | 129.7 |
| 24 | −457.240250 | 75.526577 | | | 200.4 |
| 25 | 0.000000 | 0.000000 | REFL | | 466.4 |
| 26 | 237.926438 | 75.526577 | REFL | | 209.6 |
| 27 | 457.240250 | 15.000000 | SILUV | 1.560970 | 199.7 |
| 28 | 133.588927 | 126.522781 | | | 129.3 |
| 29 | 689.662422 | 15.000000 | SILUV | 1.560970 | 109.7 |
| 30 | 114.923684 | 250.502546 | | | 89.9 |
| 31 | −187.194959 | 41.276449 | SILUV | 1.560970 | 87.3 |
| 32 | −143.080434 | 352.864117 | | | 92.6 |
| 33 | 638.740613 | 57.344119 | SILUV | 1.560970 | 166.5 |
| 34 | −640.079274 | 765.009145 | | | 167.7 |
| 35 | 315.195267 | 85.472477 | SILUV | 1.560970 | 192.3 |
| 36 | 9515.814939 | 51.951983 | | | 188.9 |
| 37 | −354.315849 | 14.999842 | SILUV | 1.560970 | 187.2 |
| 38 | 341.945085 | 19.571203 | | | 184.3 |
| 39 | 366.324617 | 105.775937 | SILUV | 1.560970 | 185.8 |
| 40 | −361.175410 | 0.999742 | | | 187.4 |
| 41 | 6776.374634 | 29.650012 | SILUV | 1.560970 | 177.3 |
| 42 | −620.255694 | 72.144867 | | | 175.4 |
| 43 | 0.000000 | −71.136199 | | | 152.7 |
| 44 | 173.130313 | 72.273642 | SILUV | 1.560970 | 151.1 |
| 45 | 224.428128 | 0.997175 | | | 142.8 |
| 46 | 112.244472 | 81.950180 | SILUV | 1.560970 | 107.9 |
| 47 | 279.648916 | 0.991496 | | | 84.7 |
| 48 | 69.552101 | 51.601280 | SILUV | 1.560970 | 58.4 |
| 49 | 0.000000 | 3.000000 | WATER | 1.437000 | 23.7 |
| 50 | 0.000000 | 0.000000 | | | 15.3 |

TABLE 7A

Aspheric constants

| | SRF | | | | |
|---|---|---|---|---|---|
| | 1 | 4 | 12 | 17 | 24 |
| K | 0 | 0 | 0 | 0 | 0 |
| C1 | −2.079650E−08 | 5.668179E−08 | 1.198541E−09 | −2.779170E−08 | −8.437630E−09 |
| C2 | −1.029837E−13 | −3.534348E−12 | 3.757760E−12 | −2.501903E−13 | 1.483881E−13 |
| C3 | 2.624784E−17 | 3.484223E−16 | 3.954610E−17 | −2.472507E−18 | −3.652271E−18 |
| C4 | −4.411346E−21 | −3.432797E−20 | −2.796162E−21 | −8.594255E−23 | 7.105556E−23 |
| C5 | 3.202382E−25 | 1.952373E−24 | −7.635830E−25 | 1.436112E−27 | −9.434186E−28 |
| C6 | −9.825494E−30 | −5.128865E−29 | −3.552547E−29 | −8.210685E−32 | 6.001048E−33 |

| | SRF | | | | |
|---|---|---|---|---|---|
| | 32 | 33 | 36 | 39 | 42 |
| K | 0 | 0 | 0 | 0 | 0 |
| C1 | 1.188770E−08 | −1.719217E−09 | −7.684905E−10 | −4.522222E−09 | 2.679879E−08 |

TABLE 7A-continued

Aspheric constants

|    |              |              |              |              |              |
|----|--------------|--------------|--------------|--------------|--------------|
| C2 | 3.243311E-13 | -1.009720E-14 | -1.405159E-13 | -2.372349E-13 | -6.088899E-13 |
| C3 | 1.503870E-17 | 1.815512E-19 | -1.244883E-18 | -1.116584E-19 | 1.658460E-17 |
| C4 | 7.677546E-22 | -3.169634E-24 | 8.456723E-23 | 4.396517E-23 | -6.638241E-22 |
| C5 | -3.041302E-26 | 5.946958E-29 | -1.454010E-27 | 4.933961E-28 | 1.317950E-26 |
| C6 | 5.159605E-30 | -5.819144E-34 | 8.383598E-33 | 2.028712E-34 | -9.118089E-32 |

| | SRF | |
|---|---|---|
| | 45 | 47 |
| K  | 0 | 0 |
| C1 | -6.024110E-08 | 9.088877E-08 |
| C2 | 7.222530E-13 | 6.531635E-12 |
| C3 | -5.398039E-17 | -7.879751E-16 |
| C4 | 5.173993E-21 | 1.997896E-20 |
| C5 | -1.877283E-25 | 1.556311E-24 |
| C6 | 2.419155E-30 | -2.754746E-29 |

TABLE 8

NA = 1.35; OBH = 61 mm

| SURF | RADIUS | THICKNESS | MATERIAL | INDEX | SEMI-DIAM. |
|---|---|---|---|---|---|
| 0  | 0.000000     | 81.077078  |       |          | 61.0  |
| 1  | 247.431591   | 33.985027  | SILUV | 1.560970 | 97.2  |
| 2  | -1108.213180 | 99.939876  |       |          | 97.8  |
| 3  | 149.275596   | 63.617953  | SILUV | 1.560970 | 102.7 |
| 4  | 720.298037   | 31.099409  |       |          | 92.3  |
| 5  | 110.181649   | 63.341215  | SILUV | 1.560970 | 81.2  |
| 6  | 3022.520680  | 20.926913  |       |          | 67.8  |
| 7  | 819.444306   | 9.999767   | SILUV | 1.560970 | 55.4  |
| 8  | 92.571235    | 36.633468  |       |          | 54.9  |
| 9  | -118.699105  | 44.761809  | SILUV | 1.560970 | 57.1  |
| 10 | -504.070675  | 1.005537   |       |          | 84.8  |
| 11 | -18825.443964| 21.620967  | SILUV | 1.560970 | 91.6  |
| 12 | -569.661655  | 29.939908  |       |          | 97.5  |
| 13 | -990.941232  | 48.088535  | SILUV | 1.560970 | 119.3 |
| 14 | -187.388962  | 0.999104   |       |          | 123.4 |
| 15 | 1858.481038  | 71.149453  | SILUV | 1.560970 | 133.8 |
| 16 | -177.106548  | 271.134859 |       |          | 137.2 |
| 17 | 152.570496   | 44.546857  | SILUV | 1.560970 | 96.4  |
| 18 | 310.749636   | 241.566541 |       |          | 93.1  |
| 19 | -113.768766  | 15.000000  | SILUV | 1.560970 | 89.1  |
| 20 | -514.116956  | 128.860652 |       |          | 107.0 |
| 21 | -124.047944  | 15.000000  | SILUV | 1.560970 | 122.9 |
| 22 | -432.665588  | 76.172922  |       |          | 201.7 |
| 23 | 0.000000     | 0.000000   | REFL  |          | 488.2 |
| 24 | 235.657223   | 76.172922  | REFL  |          | 210.8 |
| 25 | 432.665588   | 15.000000  | SILUV | 1.560970 | 201.0 |
| 26 | 124.047944   | 128.860652 |       |          | 122.6 |
| 27 | 514.116956   | 15.000000  | SILUV | 1.560970 | 106.6 |
| 28 | 113.768766   | 241.566541 |       |          | 89.3  |
| 29 | -310.749636  | 44.546857  | SILUV | 1.560970 | 98.2  |
| 30 | -152.570496  | 505.209245 |       |          | 101.8 |
| 31 | 432.687310   | 63.438158  | SILUV | 1.560970 | 200.0 |
| 32 | -5702.804483 | 570.839636 |       |          | 200.0 |
| 33 | 265.950496   | 80.830863  | SILUV | 1.560970 | 199.3 |
| 34 | 813.771525   | 85.106126  |       |          | 194.0 |
| 35 | -349.894995  | 14.986051  | SILUV | 1.560970 | 192.2 |
| 36 | 357.074904   | 9.056676   |       |          | 191.4 |
| 37 | 328.455609   | 119.723476 | SILUV | 1.560970 | 193.2 |
| 38 | -376.061000  | 1.005415   |       |          | 194.4 |
| 39 | -5127.320618 | 24.054914  | SILUV | 1.560970 | 182.7 |
| 40 | -623.070652  | 83.785856  |       |          | 180.7 |
| 41 | 0.000000     | -82.791321 |       |          | 153.7 |
| 42 | 164.806442   | 85.306027  | SILUV | 1.560970 | 152.0 |
| 43 | 239.932314   | 0.999006   |       |          | 142.4 |
| 44 | 107.960841   | 77.978935  | SILUV | 1.560970 | 103.8 |
| 45 | 193.275208   | 1.654246   |       |          | 77.6  |
| 46 | 69.066567    | 48.454127  | SILUV | 1.560970 | 56.7  |
| 47 | 0.000000     | 3.000000   | WATER | 1.437000 | 23.7  |
| 48 | 0.000000     | 0.000000   |       |          | 15.3  |

TABLE 8A

Aspheric constants

| | SRF | | | | |
|---|---|---|---|---|---|
| | 1 | 4 | 12 | 15 | 22 |
| K  | 0 | 0 | 0 | 0 | 0 |
| C1 | -5.377723E-11 | 1.077752E-07  | -3.343764E-08 | -3.780544E-08 | -8.281200E-09 |
| C2 | -3.682971E-13 | -2.575874E-12 | 3.729755E-12  | 2.080657E-13  | 1.433686E-13  |
| C3 | 1.901054E-17  | 3.798341E-16  | -1.570196E-16 | -9.656985E-18 | -3.548011E-18 |
| C4 | -2.103238E-21 | -3.475209E-20 | 1.046135E-20  | 1.901362E-22  | 6.818656E-23  |
| C5 | 1.350272E-25  | 2.381847E-24  | -4.493528E-25 | -1.899340E-27 | -8.871489E-28 |
| C6 | -4.050916E-30 | -6.839885E-29 | 6.577251E-30  | -3.152965E-32 | 5.438209E-33  |

| | SRF | | | | |
|---|---|---|---|---|---|
| | 30 | 31 | 34 | 37 | 40 |
| K  | 0 | 0 | 0 | 0 | 0 |
| C1 | 1.284269E-08 | -1.016328E-09 | 6.297545E-09  | 8.016636E-10  | 2.562147E-08  |
| C2 | 2.607881E-13 | -1.628115E-14 | -1.159786E-13 | -3.577396E-13 | -4.590920E-13 |

TABLE 8A-continued

Aspheric constants

|    |              |              |              |              |              |
|----|--------------|--------------|--------------|--------------|--------------|
| C3 | 6.800496E−18 | 1.408578E−19 | −9.519095E−19 | 2.401173E−18 | 9.451619E−18 |
| C4 | 1.028834E−21 | −1.336242E−24 | 3.791793E−24 | −3.309174E−23 | −3.348474E−22 |
| C5 | −4.872323E−26 | 4.755774E−30 | 4.881089E−29 | 1.275308E−27 | 3.872919E−27 |
| C6 | 3.218847E−30 | 1.304638E−35 | −5.862147E−33 | −4.548648E−33 | 3.173219E−33 |

| | SRF | |
|---|---|---|
| | 43 | 45 |
| K  | 0 | 0 |
| C1 | −6.277102E−08 | 8.740338E−08 |
| C2 | 1.462137E−12  | 1.050350E−11 |
| C3 | −5.425879E−17 | −1.025094E−15 |
| C4 | 4.563234E−21  | 3.662103E−20 |
| C5 | −1.758336E−25 | −2.839379E−24 |
| C6 | 2.450290E−30  | 4.506476E−28 |

TABLE 9

NA = 1.55; OBH = 63 mm

| SURF | RADIUS | THICKNESS | MATERIAL | INDEX | SEMIDIAM. |
|------|--------|-----------|----------|-------|-----------|
| 0  | 0.000000    | 52.373676  |       |          | 63.0  |
| 1  | 361.373309  | 26.922987  | SILUV | 1.560970 | 89.3  |
| 2  | −549.140567 | 134.503400 |       |          | 90.9  |
| 3  | 688.863997  | 51.548737  | SILUV | 1.560970 | 117.4 |
| 4  | −181.312819 | 1.533532   |       |          | 117.9 |
| 5  | 104.137954  | 42.536597  | SILUV | 1.560970 | 99.3  |
| 6  | 136.747803  | 0.999640   |       |          | 93.9  |
| 7  | 96.652721   | 46.285530  | SILUV | 1.560970 | 84.5  |
| 8  | 96.662535   | 22.515193  |       |          | 64.0  |
| 9  | 393.392385  | 25.740061  | SILUV | 1.560970 | 60.9  |
| 10 | 281.540109  | 27.143773  |       |          | 52.2  |
| 11 | −92.783024  | 10.228451  | SILUV | 1.560970 | 52.3  |
| 12 | 2146.867868 | 5.143922   |       |          | 59.3  |
| 13 | −1407.539323| 27.546076  | SILUV | 1.560970 | 61.0  |
| 14 | −1583.996922| 77.803003  |       |          | 70.1  |
| 15 | −9928.134971| 21.613858  | SILUV | 1.560970 | 121.4 |
| 16 | −562.732602 | 1.066552   |       |          | 124.8 |
| 17 | 1316.390285 | 66.539487  | SILUV | 1.560970 | 136.3 |
| 18 | −249.002886 | 0.999578   |       |          | 140.6 |
| 19 | −767.927975 | 17.261250  | SILUV | 1.560970 | 141.9 |
| 20 | −332.252391 | 243.640078 |       |          | 143.3 |
| 21 | 326.379929  | 77.497798  | SILUV | 1.560970 | 169.8 |
| 22 | −725.232461 | 222.178118 |       |          | 168.1 |
| 23 | 171.397565  | 44.385023  | SILUV | 1.560970 | 107.1 |
| 24 | 116.940424  | 167.705687 |       |          | 90.7  |
| 25 | −147.441972 | 15.000000  | SILUV | 1.560970 | 100.4 |
| 26 | −230311.815700 | 102.857383 |    |          | 120.8 |
| 27 | −141.946527 | 15.000000  | SILUV | 1.560970 | 131.2 |
| 28 | −456.655261 | 64.500021  |       |          | 188.3 |
| 29 | 0.000000    | 0.000000   | REFL  |          | 400.0 |
| 30 | 230.117394  | 64.500021  | REFL  |          | 196.5 |
| 31 | 456.655261  | 15.000000  | SILUV | 1.560970 | 187.7 |
| 32 | 141.946527  | 102.857383 |       |          | 131.1 |
| 33 | 230311.815700 | 15.000000 | SILUV | 1.560970 | 120.6 |
| 34 | 147.441972  | 167.705687 |       |          | 99.9  |
| 35 | −116.940424 | 44.385023  | SILUV | 1.560970 | 88.0  |
| 36 | −171.397565 | 222.178118 |       |          | 102.9 |
| 37 | 725.232461  | 77.497798  | SILUV | 1.560970 | 168.8 |
| 38 | −326.379929 | 245.753402 |       |          | 170.3 |
| 39 | 355.533851  | 48.878509  | SILUV | 1.560970 | 141.1 |
| 40 | −671.188800 | 158.064307 |       |          | 139.7 |
| 41 | 579.638173  | 9.999809   | SILUV | 1.560970 | 92.1  |
| 42 | 122.941895  | 144.102389 |       |          | 86.0  |
| 43 | −204.742345 | 23.689577  | SILUV | 1.560970 | 112.4 |
| 44 | −309.627361 | 17.927010  |       |          | 125.2 |
| 45 | 786.046427  | 68.884975  | SILUV | 1.560970 | 149.3 |
| 46 | −283.694149 | 43.176728  |       |          | 151.8 |
| 47 | 477.578769  | 56.188266  | SILUV | 1.560970 | 153.0 |
| 48 | −284.099699 | 52.790147  |       |          | 152.0 |
| 49 | 0.000000    | −51.790553 |       |          | 130.4 |
| 50 | 216.215734  | 45.981652  | SILUV | 1.560970 | 132.3 |
| 51 | 848.049222  | 0.999310   |       |          | 128.2 |

TABLE 9-continued

NA = 1.55; OBH = 63 mm

| SURF | RADIUS | THICKNESS | MATERIAL | INDEX | SEMIDIAM. |
|---|---|---|---|---|---|
| 52 | 163.000186 | 55.506472 | SILUV | 1.560970 | 113.5 |
| 53 | −7084.853977 | 0.996383 | | | 108.2 |
| 54 | 73.804239 | 65.907881 | SPINELL | 1.910000 | 64.2 |
| 55 | 0.000000 | 3.000000 | HIFLUID | 1.650000 | 24.1 |
| 56 | 0.000000 | 0.000000 | | | 15.8 |

TABLE 9A

Aspheric constants

| | SRF | | | | |
|---|---|---|---|---|---|
| | 1 | 4 | 14 | 19 | 28 |
| K | 0 | 0 | 0 | 0 | 0 |
| C1 | −2.156123E−08 | 8.926072E−08 | −1.892769E−07 | −1.769045E−08 | −9.805461E−09 |
| C2 | 2.804824E−13 | −2.762584E−12 | 6.981788E−12 | −1.525221E−13 | 1.207422E−13 |
| C3 | −8.627809E−18 | 1.300878E−16 | −1.189921E−15 | −1.639823E−18 | −3.464134E−18 |
| C4 | 3.994658E−22 | −3.358543E−21 | 7.548158E−20 | −5.045684E−23 | 5.168673E−23 |
| C5 | −1.043381E−26 | 4.556708E−26 | −4.907997E−24 | 8.603913E−28 | −6.159091E−28 |
| C6 | 6.265050E−32 | 2.748943E−31 | −7.291961E−29 | −3.405936E−32 | 1.126257E−33 |

| | SRF | | | | |
|---|---|---|---|---|---|
| | 38 | 39 | 41 | 43 | 46 |
| K | 0 | 0 | 0 | 0 | 0 |
| C1 | 5.695502E−09 | −1.147885E−08 | 4.701862E−08 | −7.011383E−09 | 3.819164E−09 |
| C2 | 1.659798E−14 | −1.185174E−13 | 6.009886E−13 | 1.591709E−13 | 5.017709E−13 |
| C3 | 2.012310E−19 | 4.705039E−19 | −1.076266E−17 | 8.044405E−18 | −5.929193E−17 |
| C4 | 1.763675E−25 | 1.174428E−23 | 3.053634E−22 | −2.758392E−23 | 3.449621E−21 |
| C5 | −1.006847E−29 | −1.460993E−28 | 5.512713E−26 | 1.331146E−25 | −8.211684E−26 |
| C6 | 2.338920E−34 | −4.724664E−34 | −4.064658E−30 | 6.957725E−30 | 7.855718E−31 |

| | SRF | | |
|---|---|---|---|
| | 48 | 51 | 53 |
| K | 0 | 0 | 0 |
| C1 | 6.166688E−08 | −3.513584E−08 | 8.686595E−09 |
| C2 | −1.396078E−12 | 2.182867E−12 | 1.662203E−13 |
| C3 | 7.082904E−17 | −2.210250E−17 | −1.094129E−16 |
| C4 | −3.696467E−21 | −4.834543E−22 | 1.125623E−20 |
| C5 | 8.807313E−26 | 4.110917E−26 | −5.549744E−25 |
| C6 | −7.600656E−31 | −5.830521E−31 | 1.235980E−29 |

TABLE 10

NA = 1.35; OBH = 61 mm

| SURF | RADIUS | THICKNESS | MATERIAL | INDEX1 | INDEX2 | INDEX3 | SEMIDIAM. |
|---|---|---|---|---|---|---|---|
| 0 | 0.000000 | 30.999909 | | | | | 61.00 |
| 1 | 264.142266 | 21.735363 | SILUV | 1.560970 | 1.561002 | 1.560938 | 76.08 |
| 2 | −3736.397330 | 155.438890 | | | | | 77.14 |
| 3 | 154.954815 | 63.139153 | SILUV | 1.560970 | 1.561002 | 1.560938 | 107.77 |
| 4 | −657.837463 | 9.803940 | | | | | 105.13 |
| 5 | 105.495577 | 37.428683 | SILUV | 1.560970 | 1.561002 | 1.560938 | 80.45 |
| 6 | 282.234333 | 16.519053 | | | | | 73.82 |
| 7 | −907.351826 | 9.999257 | SILUV | 1.560970 | 1.561002 | 1.560938 | 69.87 |
| 8 | 135.095290 | 113.443867 | | | | | 57.39 |
| 9 | −104.760943 | 9.999989 | SILUV | 1.560970 | 1.561002 | 1.560938 | 78.39 |
| 10 | −162.594937 | 22.959169 | | | | | 89.54 |
| 11 | −612.954629 | 50.036318 | SILUV | 1.560970 | 1.561002 | 1.560938 | 112.31 |
| 12 | −159.882663 | 77.187622 | | | | | 116.53 |
| 13 | −852.418977 | 40.943413 | SILUV | 1.560970 | 1.561002 | 1.560938 | 135.90 |
| 14 | −222.867288 | 0.999967 | | | | | 137.79 |
| 15 | 767.667343 | 38.628735 | SILUV | 1.560970 | 1.561002 | 1.560938 | 132.67 |
| 16 | −612.094392 | 255.796066 | | | | | 131.31 |

TABLE 10-continued

NA = 1.35; OBH = 61 mm

| SURF | RADIUS | THICKNESS | MATERIAL | INDEX1 | INDEX2 | INDEX3 | SEMIDIAM. |
|---|---|---|---|---|---|---|---|
| 17 | 182.765783 | 37.038090 | SILUV | 1.560970 | 1.561002 | 1.560938 | 101.05 |
| 18 | 270.468969 | 256.566566 | | | | | 97.63 |
| 19 | −132.968653 | 15.000000 | SILUV | 1.560970 | 1.561002 | 1.560938 | 96.82 |
| 20 | −456.481829 | 101.645594 | | | | | 110.44 |
| 21 | −117.764819 | 15.000000 | SILUV | 1.560970 | 1.561002 | 1.560938 | 116.35 |
| 22 | −411.281558 | 69.934655 | | | | | 189.28 |
| 23 | −224.561009 | −69.934655 | REFL | | | | 196.76 |
| 24 | −411.281558 | −15.000000 | SILUV | 1.560970 | 1.561002 | 1.560938 | 189.28 |
| 25 | −117.764819 | −101.645594 | | | | | 116.35 |
| 26 | −456.481829 | −15.000000 | SILUV | 1.560970 | 1.561002 | 1.560938 | 110.44 |
| 27 | −132.968653 | −256.566566 | | | | | 96.82 |
| 28 | 270.468969 | −37.038090 | SILUV | 1.560970 | 1.561002 | 1.560938 | 97.63 |
| 29 | 182.765783 | −85.913921 | | | | | 101.05 |
| 30 | 0.000000 | 311.681393 | REFL | | | | 91.90 |
| 31 | 656.566486 | 67.767675 | SILUV | 1.560970 | 1.561002 | 1.560938 | 180.55 |
| 32 | −534.059599 | 320.553507 | | | | | 182.16 |
| 33 | 0.000000 | −163.969104 | REFL | | | | 186.76 |
| 34 | −412.837655 | −20.149859 | SILUV | 1.560970 | 1.561002 | 1.560938 | 188.23 |
| 35 | −437.633787 | −265.361720 | | | | | 185.71 |
| 36 | 65149.881439 | −15.000656 | SILUV | 1.560970 | 1.561002 | 1.560938 | 184.46 |
| 37 | −755.920567 | −55.241726 | | | | | 184.35 |
| 38 | −260.564291 | −116.670207 | SILUV | 1.560970 | 1.561002 | 1.560938 | 200.00 |
| 39 | 630.278556 | −10.219729 | | | | | 198.65 |
| 40 | −327.209185 | −37.605725 | SILUV | 1.560970 | 1.561002 | 1.560938 | 176.46 |
| 41 | −669.696572 | −36.565446 | | | | | 170.69 |
| 42 | 0.000000 | 29.001434 | | | | | 167.06 |
| 43 | −165.547677 | −63.180776 | SILUV | 1.560970 | 1.561002 | 1.560938 | 146.94 |
| 44 | −167.784782 | −2.293143 | | | | | 136.01 |
| 45 | −123.725228 | −62.869032 | SILUV | 1.560970 | 1.561002 | 1.560938 | 109.25 |
| 46 | −284.548687 | −1.182389 | | | | | 91.28 |
| 47 | −75.467233 | −56.683957 | SILUV | 1.560970 | 1.561002 | 1.560938 | 63.08 |
| 48 | 0.000000 | −3.000000 | WATER | 1.437418 | 1.437461 | 1.437375 | 23.65 |
| 49 | 0.000000 | 0.000000 | | | | | 15.25 |

TABLE 10A

Aspheric constants

| | SRF | | | | |
|---|---|---|---|---|---|
| | 1 | 3 | 8 | 13 | 17 |
| C1 | −3.208468E−09 | −5.995470E−09 | 2.155556E−07 | −1.336890E−08 | 1.904211E−09 |
| C2 | −9.664049E−13 | −5.353202E−13 | 3.755641E−12 | 2.404868E−14 | −1.583552E−14 |
| C3 | 5.216948E−17 | −8.902447E−18 | −4.795241E−15 | −1.176986E−18 | 1.588154E−18 |
| C4 | −4.499829E−21 | −1.243240E−21 | 6.472142E−19 | −4.925717E−24 | 2.147709E−22 |
| C5 | 3.762746E−25 | 3.089894E−27 | −3.934877E−23 | 2.193556E−28 | −1.652193E−26 |
| C6 | −1.869933E−29 | −2.336155E−30 | −5.845054E−26 | −8.934241E−33 | 5.742982E−31 |

| | SRF | | | | |
|---|---|---|---|---|---|
| | 20 | 22 | 24 | 26 | 29 |
| C1 | −1.567465E−08 | −6.400260E−09 | −6.400260E−09 | −1.567465E−08 | 1.904211E−09 |
| C2 | −4.141370E−13 | 1.523114E−13 | 1.523114E−13 | −4.141370E−13 | −1.583552E−14 |
| C3 | 1.696788E−17 | −3.667544E−18 | −3.667544E−18 | 1.696788E−17 | 1.588154E−18 |
| C4 | −3.264151E−21 | 7.704431E−23 | 7.704431E−23 | −3.264151E−21 | 2.147709E−22 |
| C5 | 1.719384E−25 | −9.338178E−28 | −9.338178E−28 | 1.719384E−25 | −1.652193E−26 |
| C6 | −6.584348E−30 | 3.813376E−33 | 3.813376E−33 | −6.584348E−30 | 5.742982E−31 |

| | SRF | | | | |
|---|---|---|---|---|---|
| | 31 | 32 | 34 | 37 | 38 |
| C1 | −2.693548E−09 | 1.267848E−09 | −1.586619E−09 | −1.942311E−08 | −1.069077E−08 |
| C2 | 6.551545E−15 | −2.728053E−15 | 1.668248E−14 | 6.506226E−13 | 7.640246E−13 |
| C3 | −3.957545E−20 | 1.946836E−20 | −7.193781E−21 | −1.045823E−17 | −1.413139E−17 |
| C4 | −7.692099E−25 | −8.517953E−25 | 3.361023E−24 | 8.468774E−23 | 3.335572E−22 |
| C5 | −1.029260E−29 | −1.290982E−29 | 6.092465E−30 | 1.082042E−27 | −5.354325E−27 |
| C6 | 1.052646E−34 | 2.270319E−35 | −5.511009E−34 | −1.854115E−32 | 5.366681E−32 |

TABLE 10A-continued

| | Aspheric constants | | | | |
|---|---|---|---|---|---|
| | SRF | | | | |
| | 39 | 41 | 44 | 45 | 46 |
| C1 | −5.728434E−09 | −2.889546E−08 | 9.185602E−08 | 1.721819E−10 | −3.162199E−08 |
| C2 | 6.662746E−14 | 8.287224E−13 | −3.031909E−12 | −1.258722E−12 | −5.792501E−12 |
| C3 | −1.074791E−18 | −2.581551E−17 | 2.584596E−16 | 3.819302E−17 | 1.414724E−16 |
| C4 | −1.888757E−23 | 1.669941E−21 | −8.517664E−21 | −6.090485E−22 | −3.284042E−20 |
| C5 | 7.119354E−28 | −4.166613E−26 | 7.076316E−26 | 7.014114E−27 | 2.183062E−24 |
| C6 | −5.496252E−33 | 3.436315E−31 | 2.065429E−30 | −3.407312E−29 | 7.780273E−29 |

TABLE 11

Reference System - NA = 1.35; OBH = 61 mm

| SURF | RADIUS | THICKNESS | MATERIAL | INDEX | SEMIDIAM. |
|---|---|---|---|---|---|
| 0 | 0 | 31.001832 | | | 62.5 |
| 1 | 289.822264 | 27.504877 | SILUV | 1.56097018 | 77.067 |
| 2 | −512.603762 | 69.206761 | | | 78.698 |
| 3 | 468.726558 | 70.000161 | SILUV | 1.56097018 | 88.236 |
| 4 | −146.708663 | 28.109515 | | | 93.092 |
| 5 | 66.49692 | 37.758684 | SILUV | 1.56097018 | 63.192 |
| 6 | 79.829464 | 79.194653 | | | 53.243 |
| 7 | −52.324817 | 11.99989 | SILUV | 1.56097018 | 48.295 |
| 8 | −194.603712 | 5.129327 | | | 72.901 |
| 9 | −178.897937 | 48.93002 | SILUV | 1.56097018 | 79.328 |
| 10 | −99.404004 | 1.000065 | | | 87.626 |
| 11 | −368.754052 | 37.314413 | SILUV | 1.56097018 | 101.088 |
| 12 | −138.717755 | 19.897985 | | | 106.451 |
| 13 | 5530.73558 | 49.666523 | SILUV | 1.56097018 | 123.564 |
| 14 | −195.832885 | 4.562265 | | | 124.394 |
| 15 | −500 | 0 | SILUV | 1.56097018 | 117.605 |
| 16 | −500 | 89.999712 | | | 117.605 |
| 17 | 0 | 120.111966 | | | 170.788 |
| 18 | 0 | 32.204739 | | | 100.267 |
| 19 | 228.815121 | 55.000025 | SILUV | 1.56097018 | 112.092 |
| 20 | 1410.97419 | 325.424597 | | | 110.216 |
| 21 | −110.704457 | 11.999767 | SILUV | 1.56097018 | 89.907 |
| 22 | −304.4088 | 57.739174 | | | 104.068 |
| 23 | −110.319775 | 11.9995 | SILUV | 1.56097018 | 105.702 |
| 24 | −433.253872 | 58.507302 | | | 160 |
| 25 | 0 | 0 | REFL | | 305.679 |
| 26 | 196.051749 | 58.507302 | REFL | | 162.996 |
| 27 | 433.253872 | 11.9995 | SILUV | 1.56097018 | 160 |
| 28 | 110.319775 | 57.739174 | | | 105.888 |
| 29 | 304.4088 | 11.999767 | SILUV | 1.56097018 | 104.825 |
| 30 | 110.704457 | 325.424597 | | | 91.836 |
| −31 | 1410.97419 | 55.000025 | SILUV | 1.56097018 | 132.433 |
| 32 | −228.815121 | 32.204739 | | | 134.317 |
| 33 | 0 | 120.111966 | | | 120.794 |
| 34 | 0 | 89.999712 | | | 158.714 |
| 35 | 500 | 0 | SILUV | 1.56097018 | 110.573 |
| 36 | 500 | 0.999786 | | | 110.573 |
| 37 | 178.869519 | 73.788704 | SILUV | 1.56097018 | 115.938 |
| 38 | −369.175557 | 0.999715 | | | 111.786 |
| 39 | 183.826374 | 24.783296 | SILUV | 1.56097018 | 98.266 |
| 40 | 209.811546 | 40.616913 | | | 93.735 |
| 41 | −557.116103 | 11.999509 | SILUV | 1.56097018 | 82.539 |
| 42 | 173.500302 | 67.566192 | | | 72.514 |
| 43 | −132.26303 | 13.958306 | SILUV | 1.56097018 | 76.662 |
| 44 | 1098.93058 | 44.374854 | | | 86.969 |
| 45 | −173.947994 | 67.346468 | SILUV | 1.56097018 | 87.915 |
| 46 | −142.027055 | 0.999386 | | | 122.01 |
| 47 | −284.96815 | 41.384889 | SILUV | 1.56097018 | 131.096 |
| 48 | −166.347702 | 0.999604 | | | 138.006 |
| −49 | 1311.96238 | 43.885279 | SILUV | 1.56097018 | 152.416 |
| 50 | −306.323067 | 1.00024 | | | 155.027 |
| 51 | 503.881757 | 41.585763 | SILUV | 1.56097018 | 156.633 |
| −52 | 1932.63991 | 15.669146 | | | 155.417 |
| 53 | 211.353318 | 69.201389 | SILUV | 1.56097018 | 143.216 |
| 54 | 448.541659 | 26.411783 | | | 135.421 |
| 55 | 0 | −15.404879 | | | 123.379 |
| 56 | 133.731819 | 47.526115 | SILUV | 1.56097018 | 110.108 |
| 57 | 200.982073 | 1.210901 | | | 102.181 |

TABLE 11-continued

Reference System - NA = 1.35; OBH = 61 mm

| SURF | RADIUS | THICKNESS | MATERIAL | INDEX | SEMIDIAM. |
|---|---|---|---|---|---|
| 58 | 97.816234 | 31.699603 | SILUV | 1.56097018 | 77.782 |
| 59 | 129.512158 | 0.997501 | | | 64.569 |
| 60 | 50.813292 | 42.123282 | SILUV | 1.56097018 | 46.151 |
| 61 | 0 | 3 | H2OV193B | 1.43741799 | 24.13 |
| 62 | 0 | 0 | | | 15.628 |

TABLE 11A

Aspheric constants

| | | SRF | | | | |
|---|---|---|---|---|---|---|
| | | 1 | 3 | 6 | 9 | 11 |
| K | | 0 | 0 | 0 | 0 | 0 |
| C1 | −1 | 8.09E−09 | −9.70E−08 | 1.09E+007 | 1.717038E−07 | −7.90E−08 |
| C2 | −2 | 9.87E−15 | −6.21E−12 | −3.34E−011 | −9.936855E−12 | 2.82E−13 |
| C3 | 1 | 6.82E−17 | 4.93E−16 | −1.83E−015 | −2.441560E−16 | −4.21E−17 |
| C4 | −3 | 4.35E−21 | −3.31E−21 | −5.63E−018 | 1.098289E−19 | −4.91E−21 |
| C5 | 4 | 9.62E−27 | −2.52E−24 | 1.83E−021 | −1.215310E−23 | 4.75E−25 |
| C6 | −4 | 9.18E−32 | 1.85E−28 | −1.59E−025 | 7.294426E−28 | −3.60E−29 |
| C7 | 1 | 6.44E−33 | −3.92E−33 | −9.70E−033 | −2.015587E−32 | 1.22E−33 |

| | | SRF | | | | |
|---|---|---|---|---|---|---|
| | | 13 | 24 | 29 | 31 | 32 |
| K | | 0 | 0 | 0 | 0 | 0 |
| C1 | −2 | 5.72E−10 | −4.64E−09 | 4.21E+008 | 1.989937E−09 | 5.32E−09 |
| C2 | −4 | 6.36E−15 | 3.75E−13 | 1.06E−012 | 5.203204E−13 | 3.08E−13 |
| C3 | −1 | 7.99E−18 | −1.21E−17 | 6.56E−017 | −1.558394E−17 | −9.37E−19 |
| C4 | 9 | 6.74E−23 | 3.15E−22 | −1.79E−021 | 1.361977E−22 | −2.37E−23 |
| C5 | −2 | 5.21E−27 | −8.19E−27 | 7.97E−025 | 1.046262E−27 | 2.43E−27 |
| C6 | 4 | 1.77E−33 | 1.41E−31 | −6.01E−029 | −1.571368E−32 | −1.99E−31 |
| C7 | −3 | 9.57E−37 | −1.11E−36 | 2.87E−033 | 4.841297E−36 | 1.00E−35 |

| | | SRF | | | | |
|---|---|---|---|---|---|---|
| | | 37 | 38 | 40 | 42 | 44 |
| K | | 0 | 0 | 0 | 0 | 0 |
| C1 | −1 | 1.42E−09 | 6.49E−08 | −1.13E+007 | 1.674837E−07 | −1.91E−07 |
| C2 | 5 | 7.21E−14 | −2.76E−12 | −1.40E−012 | 1.728854E−11 | −6.52E−12 |
| C3 | −1 | 6.98E−18 | 2.25E−16 | 2.15E−016 | −3.890778E−16 | 2.31E−16 |
| C4 | 2 | 2.54E−22 | −1.58E−20 | 1.90E−020 | 1.459432E−19 | −1.14E−19 |
| C5 | −1 | 5.07E−26 | 9.14E−25 | −1.44E−024 | −7.985336E−24 | 6.55E−24 |
| C6 | 9 | 8.81E−31 | −3.70E−29 | 2.33E−029 | 2.042799E−27 | −1.76E−28 |
| C7 | −2 | 7.80E−35 | 6.33E−34 | 1.69E−033 | 4.402307E−34 | −2.36E−32 |

| | | SRF | | | | |
|---|---|---|---|---|---|---|
| | | 45 | 47 | 49 | 52 | 54 |
| K | | 0 | 0 | 0 | 0 | 0 |
| C1 | −2 | 5.74E−08 | −3.67E−08 | 1.67E+008 | −5.427508E−09 | −1.35E−07 |
| C2 | −1 | 2.03E−12 | 1.19E−12 | −6.30E−013 | 8.597444E−13 | 9.77E−12 |
| C3 | −6 | 6.88E−17 | 2.67E−17 | −9.86E−017 | −8.082996E−17 | −5.10E−16 |
| C4 | −8 | 4.17E−21 | −1.09E−20 | 7.72E−021 | 5.192349E−21 | 2.30E−20 |
| C5 | −3 | 9.09E−25 | 2.68E−25 | −2.02E−025 | −1.311126E−25 | −7.54E−25 |
| C6 | −4 | 4.21E−30 | 4.86E−30 | 8.63E−031 | −1.248769E−31 | 1.65E−29 |
| C7 | 1 | 2.73E−34 | −3.19E−34 | 3.16E−035 | 3.579634E−35 | −1.92E−34 |

| | | SRF | | | |
|---|---|---|---|---|---|
| | | 54 | 56 | 57 | 59 |
| K | | 0 | 0 | 0 | 0 |
| C1 | −1 | 3.53E−08 | −1.03E−07 | −2.20E+007 | 2.471864E−07 |
| C2 | 9 | 7.67E−13 | 6.16E−12 | 8.65E−012 | −4.891278E−11 |

TABLE 11A-continued

| | | Aspheric constants | | | |
|---|---|---|---|---|---|
| C3 | −5 | 9.92E−18 | −4.28E−16 | 1.55E−015 | 9.274846E−16 |
| C4 | 2 | 3.01E−21 | 2.21E−20 | −3.20E−019 | 4.275433E−19 |
| C5 | −7 | 5.41E−26 | 1.53E−24 | 2.89E−023 | 9.972259E−23 |
| C6 | 1 | 6.52E−30 | −1.96E−28 | −1.36E−027 | −2.427200E−26 |
| C7 | −1 | 9.21E−35 | 7.05E−33 | 2.73E−032 | −4.596124E−32 |

| | NA = 1.35; OBH = 60 mm | | | | |
|---|---|---|---|---|---|
| SURF | RADIUS | THICKNESS | MATERIAL | INDEX | SEMIDIAM. |
| 0 | 0 | 30.968761 | | | 60 |
| 1 | 251.540859 | 29.245098 | SILUV | 1.56097018 | 74.55 |
| 2 | −377.993241 | 74.058106 | | | 76.22 |
| 3 | 339.39859 | 41.47621 | SILUV | 1.56097018 | 85.231 |
| 4 | −169.602442 | 21.951392 | | | 85.761 |
| 5 | 61.283817 | 39.731002 | SILUV | 1.56097018 | 59.114 |
| 6 | 82.875924 | 69.153776 | | | 48.432 |
| 7 | −48.998574 | 13.080396 | SILUV | 1.56097018 | 44.253 |
| 8 | −143.286141 | 15.352187 | | | 64.777 |
| 9 | −109.022758 | 41.911185 | SILUV | 1.56097018 | 75.068 |
| 10 | −98.211842 | 43.64927 | | | 85.636 |
| 11 | −278.31897 | 46.743356 | SILUV | 1.56097018 | 118.458 |
| 12 | −173.266857 | 1.950206 | | | 128.463 |
| 13 | −5371.16002 | 46.024634 | SILUV | 1.56097018 | 143.485 |
| 14 | −287.904207 | 0.98988 | | | 147.837 |
| 15 | 419.115287 | 68.443086 | SILUV | 1.56097018 | 158.974 |
| 16 | −563.347518 | 641.006297 | | | 158.385 |
| 17 | −122.648119 | 11.986236 | SILUV | 1.56097018 | 95.897 |
| 18 | −302.274077 | 64.543106 | | | 108.804 |
| 19 | −117.947661 | 14.97169 | SILUV | 1.56097018 | 112.626 |
| 20 | −303.184268 | 45.473706 | | | 165.285 |
| 21 | 0 | 0 | REFL | | 290.145 |
| 22 | 215.349724 | 45.473706 | REFL | | 169.647 |
| 23 | 303.184268 | 14.97169 | SILUV | 1.56097018 | 165.671 |
| 24 | 117.947661 | 64.543106 | | | 113.971 |
| 25 | 302.274077 | 11.986236 | SILUV | 1.56097018 | 112.298 |
| 26 | 122.648119 | 636.019129 | | | 99.924 |
| 27 | 530.599442 | 56.051595 | SILUV | 1.56097018 | 146.24 |
| 28 | −394.991398 | 0.993816 | | | 148.071 |
| 29 | 595.469241 | 39.199947 | SILUV | 1.56097018 | 147.094 |
| 30 | −1412.43947 | 0.995004 | | | 146.355 |
| 31 | 271.028828 | 49.590095 | SILUV | 1.56097018 | 136.837 |
| 32 | 13456.5116 | 8.149202 | | | 132.572 |
| 33 | 218.067027 | 41.802172 | SILUV | 1.56097018 | 111.852 |
| 34 | 556.297844 | 19.14666 | | | 101.877 |
| 35 | 457.060629 | 8.000323 | SILUV | 1.56097018 | 84.459 |
| 36 | 82.678937 | 43.356483 | | | 66.11 |
| 37 | 2104.67462 | 7.990736 | SILUV | 1.56097018 | 65.291 |
| 38 | 111.602867 | 55.938283 | | | 63.727 |
| 39 | −88.471078 | 20.004608 | SILUV | 1.56097018 | 66.719 |
| 40 | −333.079126 | 27.577901 | | | 82.777 |
| 41 | −225.561578 | 50.004227 | SILUV | 1.56097018 | 90.784 |
| 42 | −157.672108 | 0.99687 | | | 108.929 |
| 43 | −2328.93024 | 50.002502 | SILUV | 1.56097018 | 121.999 |
| 44 | −197.106935 | 9.770323 | | | 128.644 |
| 45 | 707.863881 | 51.402253 | SILUV | 1.56097018 | 139.922 |
| 46 | −336.122089 | 1.174097 | | | 140.309 |
| 47 | 215.072871 | 62.731627 | SILUV | 1.56097018 | 135.562 |
| 48 | 1691.01219 | 31.891991 | | | 130.879 |
| 49 | 0 | −30.781556 | | | 116.654 |
| 50 | 157.604961 | 60.326743 | SILUV | 1.56097018 | 111.663 |
| 51 | 494.928219 | 0.91848 | | | 103.103 |
| 52 | 103.952902 | 28.02429 | SILUV | 1.56097018 | 75.881 |
| 53 | 133.443942 | 0.832436 | | | 64.182 |
| 54 | 47.599034 | 41.235106 | SILUV | 1.56097018 | 44.012 |
| 55 | 0 | 3 | H2OV193B | 1.43741799 | 23.458 |
| 56 | 0 | 0 | | | 15.001 |

TABLE 12 A

Aspheric constants

| | SRF | | | | |
|---|---|---|---|---|---|
| | 1 | 3 | 6 | 9 | 11 |
| K  | 0 | 0 | 0 | 0 | 0 |
| C1 | −5.19E−08 | −9.92E−08 | 1.75E−07 | 2.18E−07 | −1.28E−08 |
| C2 | −5.74E−13 | −3.95E−13 | 1.25E−10 | 1.65E−11 | −6.22E−13 |
| C3 | −5.42E−18 | 6.64E−16 | −8.26E−14 | −9.32E−16 | 7.92E−17 |
| C4 | −3.94E−20 | −9.87E−20 | 3.51E−17 | −2.10E−19 | −4.50E−21 |
| C5 | 5.22E−24 | 7.50E−24 | −5.35E−21 | 3.72E−23 | 1.66E−25 |
| C6 | −2.94E−28 | −2.25E−28 | 2.21E−25 | −1.42E−27 | −2.93E−30 |

| | SRF | | | | |
|---|---|---|---|---|---|
| | 13 | 16 | 23 | 25 | 27 |
| K  | 0 | 0 | 0 | 0 | 0 |
| C1 | −1.74E−08 | −5.70E−09 | −1.15E−08 | 4.92E−08 | −2.45E−08 |
| C2 | 2.36E−13 | 1.08E−13 | −2.19E−13 | 1.34E−12 | 5.87E−13 |
| C3 | −2.66E−17 | −4.72E−18 | 1.01E−17 | −3.31E−17 | −2.24E−18 |
| C4 | 1.04E−21 | 1.94E−22 | 6.29E−24 | 7.57E−21 | −1.13E−21 |
| C5 | −2.68E−26 | −3.23E−27 | −4.86E−27 | −3.73E−25 | 4.63E−26 |
| C6 | 3.25E−31 | 2.07E−32 | 6.14E−32 | 1.54E−29 | −5.89E−31 |

| | SRF | | | | |
|---|---|---|---|---|---|
| | 29 | 30 | 34 | 36 | 38 |
| K  | 0 | 0 | 0 | 0 | 0 |
| C1 | 1.32E−08 | 1.43E−08 | −4.06E−08 | 6.41E−08 | −1.93E−07 |
| C2 | −9.66E−13 | −1.07E−12 | 4.67E−12 | −2.20E−12 | 5.96E−12 |
| C3 | −7.61E−18 | 5.85E−18 | −5.00E−16 | 7.04E−16 | 1.04E−15 |
| C4 | 4.98E−22 | 4.61E−22 | 3.27E−20 | −1.25E−19 | 6.01E−20 |
| C5 | 4.54E−26 | 1.85E−26 | −1.03E−24 | 5.31E−23 | −1.65E−23 |
| C6 | −1.73E−30 | −1.10E−30 | 1.09E−29 | −3.85E−27 | 6.65E−27 |

| | SRF | | | | |
|---|---|---|---|---|---|
| | 39 | 41 | 43 | 46 | 48 |
| K  | 0 | 0 | 0 | 0 | 0 |
| C1 | 5.09E−08 | −3.33E−08 | −8.52E−08 | 1.10E−08 | −8.71E−08 |
| C2 | 2.46E−11 | −6.61E−12 | 1.89E−12 | 2.30E−13 | 8.14E−12 |
| C3 | 5.26E−16 | 5.36E−16 | −6.31E−17 | 3.54E−17 | −4.49E−16 |
| C4 | 2.30E−19 | −4.16E−20 | 8.65E−21 | −1.09E−22 | 2.14E−20 |
| C5 | −6.65E−23 | 1.04E−24 | −2.36E−25 | −8.19E−26 | −6.78E−25 |
| C6 | 9.87E−27 | 3.09E−29 | 7.46E−31 | 1.77E−30 | 9.58E−30 |

| | SRF | | | |
|---|---|---|---|---|
| | 48 | 50 | 51 | 53 |
| K  | 0 | 0 | 0 | 0 |
| C1 | −8.71E−08 | −2.34E−08 | −2.05E−07 | 2.69E−07 |
| C2 | 8.14E−12 | 4.51E−12 | 3.12E−11 | −7.71E−11 |
| C3 | −4.49E−16 | −3.24E−16 | −3.07E−15 | −1.05E−16 |
| C4 | 2.14E−20 | 3.39E−20 | 2.28E−19 | 8.37E−19 |
| C5 | −6.78E−25 | −1.53E−24 | −1.05E−23 | 1.17E−22 |
| C6 | 9.58E−30 | 4.99E−29 | 2.13E−28 | −2.28E−26 |

TABLE 13

NA = 1.35; OBH = 62.5 mm

| SURF | RADIUS | THICKNESS | MATERIAL | INDEX | SEMIDIAM. |
|---|---|---|---|---|---|
| 0 | 0 | 39.903192 | | | 62.5 |
| 1 | −1971.9226 | 9.953146 | SILUV | 1.56097018 | 75.309 |
| 2 | 444.553104 | 16.503948 | | | 81.673 |
| 3 | 249.844526 | 31.125288 | SILUV | 1.56097018 | 98.578 |
| 4 | −1557.84292 | 0.987411 | | | 101.9 |
| 5 | 408.708332 | 41.168089 | SILUV | 1.56097018 | 109.829 |
| 6 | −445.52073 | 0.979085 | | | 111.42 |
| 7 | 1053.23092 | 45.696131 | SILUV | 1.56097018 | 112.771 |
| 8 | −243.715875 | 57.260085 | | | 112.794 |

TABLE 13-continued

| | NA = 1.35; OBH = 62.5 mm | | | | |
|---|---|---|---|---|---|
| SURF | RADIUS | THICKNESS | MATERIAL | INDEX | SEMIDIAM. |
| 9 | 82.219268 | 70.032216 | SILUV | 1.56097018 | 70.884 |
| 10 | 117.15643 | 66.794883 | | | 43.787 |
| 11 | −49.25988 | 13.395557 | SILUV | 1.56097018 | 48.486 |
| 12 | −88.561445 | 1.493564 | | | 71.395 |
| 13 | −89.521124 | 45.025044 | SILUV | 1.56097018 | 76.295 |
| 14 | −99.292529 | 0.972731 | | | 93.244 |
| 15 | −634.066946 | 53.301686 | SILUV | 1.56097018 | 129.275 |
| 16 | −197.012588 | 0.987238 | | | 140.38 |
| 17 | −809.290808 | 75.955261 | SILUV | 1.56097018 | 154.623 |
| 18 | −186.169473 | 0.999328 | | | 160.656 |
| 19 | 2554.01888 | 60.456799 | SILUV | 1.56097018 | 163.517 |
| 20 | −330.685446 | 99.941184 | | | 163.464 |
| 21 | 0 | 79.510887 | | | 133.207 |
| 22 | 0 | 272.30894 | | | 91.095 |
| 23 | −5281.58148 | 45.112393 | SILUV | 1.56097018 | 112.97 |
| 24 | −435.463055 | 205.380325 | | | 109.564 |
| 25 | −130.956594 | 9.98407 | SILUV | 1.56097018 | 102.428 |
| 26 | −658.349143 | 53.544357 | | | 118.599 |
| 27 | −135.923612 | 9.964338 | SILUV | 1.56097018 | 120.638 |
| 28 | −566.572237 | 62.871286 | | | 167.907 |
| 29 | 0 | 0 | REFL | | 297.663 |
| 30 | 216.425204 | 62.871286 | REFL | | 170.434 |
| 31 | 566.572237 | 9.964338 | SILUV | 1.56097018 | 168.185 |
| 32 | 135.923612 | 53.544357 | | | 123.048 |
| 33 | 658.349143 | 9.98407 | SILUV | 1.56097018 | 122.372 |
| 34 | 130.956594 | 205.380325 | | | 107.487 |
| 35 | 435.463055 | 45.112393 | SILUV | 1.56097018 | 118.989 |
| 36 | 5281.58148 | 272.30894 | | | 123.866 |
| 37 | 0 | 79.510887 | | | 104.877 |
| 38 | 0 | 99.847876 | | | 119.878 |
| 39 | 234.248703 | 76.013777 | SILUV | 1.56097018 | 151.812 |
| 40 | −1024.80871 | 90.440215 | | | 150.799 |
| 41 | −218.865751 | 11.822321 | SILUV | 1.56097018 | 139.284 |
| 42 | −300.841186 | 0.95214 | | | 143.617 |
| 43 | 867.867085 | 30.428229 | SILUV | 1.56097018 | 140.245 |
| 44 | −1371.27957 | 0.974026 | | | 138.997 |
| 45 | 248.243018 | 53.602423 | SILUV | 1.56097018 | 128.995 |
| 46 | 5950.92449 | 47.235285 | | | 124.735 |
| 47 | −260.858866 | 9.977395 | SILUV | 1.56097018 | 102.413 |
| 48 | 239.600617 | 57.949257 | | | 92.222 |
| 49 | −177.737708 | 42.652077 | SILUV | 1.56097018 | 93.301 |
| 50 | −539.914747 | 3.973123 | | | 118.423 |
| 51 | −3289.44223 | 53.489078 | SILUV | 1.56097018 | 122.405 |
| 52 | 357.142097 | 44.745684 | | | 146.808 |
| 53 | −475.713826 | 59.340894 | SILUV | 1.56097018 | 149.75 |
| 54 | −195.47202 | 0.974297 | | | 155.798 |
| 55 | −2070.47014 | 63.022633 | SILUV | 1.56097018 | 166.561 |
| 56 | −255.568472 | 0.934722 | | | 170.106 |
| 57 | 467.88137 | 35.220955 | SILUV | 1.56097018 | 170.107 |
| 58 | −820.5772 | 0.955152 | | | 169.801 |
| 59 | 280.404901 | 69.733961 | SILUV | 1.56097018 | 159.755 |
| 60 | −2402.28003 | 0.976013 | | | 155.818 |
| 61 | 245.474816 | 52.935723 | SILUV | 1.56097018 | 135.563 |
| 62 | 373.452239 | 9.576955 | | | 129.359 |
| 63 | 0 | 5.226408 | | | 119.72 |
| 64 | 171.688623 | 17.73359 | SILUV | 1.56097018 | 102.278 |
| 65 | 131.089455 | 0.940892 | | | 93.939 |
| 66 | 81.995468 | 37.148648 | SILUV | 1.56097018 | 71.436 |
| 67 | 93.01453 | 0.873071 | | | 57.862 |
| 68 | 52.300712 | 34.504008 | SILUV | 1.56097018 | 43.471 |
| 69 | 0 | 3 | H2OV193B | 1.43741799 | 23.927 |
| 70 | 0 | 0 | | | 15.627 |

TABLE 13A

| Aspheric constants | | | | | |
|---|---|---|---|---|---|
| SRF | | | | | |
| | 1 | 3 | 10 | 13 | 15 |
| K | 0 | 0 | 0 | 0 | 0 |
| C1 | −7.96E−08 | −3.95E−08 | 1.16E+007 | 3.229936E−07 | −7.91E−08 |

TABLE 13A-continued

| | Aspheric constants | | | | |
|---|---|---|---|---|---|
| C2 | −3.22E−12 | 8.33E−13 | 1.52E−010 | 8.133011E−13 | 2.28E−12 |
| C3 | 3.03E−16 | −3.32E−16 | −2.66E−014 | −3.085889E−15 | −9.79E−18 |
| C4 | 2.25E−20 | 2.77E−20 | −8.18E−018 | 3.933210E−20 | 6.79E−21 |
| C5 | −6.49E−24 | −1.30E−24 | 1.08E−020 | 7.605196E−23 | −4.09E−25 |
| C6 | 6.88E−28 | 1.93E−29 | −2.43E−024 | −8.027971E−27 | 6.48E−30 |

| | SRF | | | | |
|---|---|---|---|---|---|
| | 17 | 31 | 33 | 35 | 36 |
| K | 0 | 0 | 0 | 0 | 0 |
| C1 | −2.47E−08 | −2.34E−10 | 5.38E+008 | −6.119656E−08 | −5.27E−08 |
| C2 | 8.41E−13 | −3.04E−13 | 1.43E−012 | −1.955358E−12 | −2.19E−12 |
| C3 | −6.38E−17 | −9.10E−19 | −4.68E−017 | 7.190984E−18 | 3.92E−17 |
| C4 | 2.18E−21 | 5.63E−22 | 5.05E−021 | 1.714304E−21 | 2.58E−21 |
| C5 | −4.01E−26 | −1.58E−26 | −1.94E−025 | 1.963920E−25 | −1.10E−25 |
| C6 | 1.63E−31 | 1.43E−31 | 5.94E−030 | −1.434888E−29 | −2.32E−30 |

| | SRF | | | | |
|---|---|---|---|---|---|
| | 39 | 42 | 46 | 48 | 50 |
| K | 0 | 0 | 0 | 0 | 0 |
| C1 | −3.77E−09 | 1.82E−08 | −5.32E+008 | 2.843250E−08 | 1.26E−07 |
| C2 | −7.23E−14 | −9.04E−13 | 1.14E−012 | 1.253837E−11 | −6.86E−12 |
| C3 | −1.49E−19 | 2.08E−17 | 2.91E−017 | −2.439247E−16 | −2.97E−16 |
| C4 | 2.67E−23 | −3.88E−22 | 2.87E−021 | 1.629228E−20 | 4.35E−20 |
| C5 | −1.29E−27 | −2.06E−26 | −2.92E−025 | 3.656255E−24 | −1.51E−24 |
| C6 | −2.89E−33 | 6.11E−31 | 7.38E−030 | −4.631949E−28 | 1.78E−29 |

| | SRF | | | | |
|---|---|---|---|---|---|
| | 52 | 53 | 55 | 57 | 60 |
| K | 0 | 0 | 0 | 0 | 0 |
| C1 | −3.86E−08 | 2.49E−08 | 7.51E+009 | −6.788217E−08 | −6.06E−08 |
| C2 | −3.74E−12 | −5.75E−12 | −2.95E−013 | 4.657771E−13 | 4.50E−12 |
| C3 | 3.43E−16 | 2.91E−16 | 3.77E−017 | −7.739674E−18 | −1.99E−16 |
| C4 | −1.55E−20 | −1.02E−20 | −4.72E−021 | 9.795183E−22 | 7.15E−21 |
| C5 | 4.71E−25 | 4.53E−25 | 1.61E−025 | 5.905730E−27 | −1.56E−25 |
| C6 | −7.38E−30 | −9.44E−30 | −1.97E−030 | −4.053550E−31 | 1.85E−30 |

| | SRF | | | | |
|---|---|---|---|---|---|
| | 60 | 62 | 64 | 65 | 67 |
| K | 0 | 0 | 0 | 0 | 0 |
| C1 | −6.06E−08 | −2.71E−07 | −3.03E+007 | −3.557733E−07 | −2.57E−07 |
| C2 | 4.50E−12 | 2.89E−11 | 3.29E−011 | 1.799009E−11 | 1.23E−11 |
| C3 | −1.99E−16 | −2.06E−15 | −6.94E−016 | −2.257853E−15 | −2.19E−14 |
| C4 | 7.15E−21 | 9.42E−20 | −2.63E−019 | 1.524878E−19 | 2.67E−18 |
| C5 | −1.56E−25 | −2.55E−24 | 2.42E−023 | −3.694197E−25 | 4.38E−22 |
| C6 | 1.85E−30 | 3.23E−29 | −5.75E−028 | −2.243742E−28 | −5.92E−26 |

What is claimed is:

1. An objective comprising:
a plurality of optical elements arranged to image a pattern from an object field in an object surface of the objective to an image field in an image surface region of the objective at an image-side numerical aperture NA>0.8 with electromagnetic radiation from a wavelength band around a wavelength λ, the optical elements including a number N of dioptric optical elements, each dioptric optical element i made from a transparent material having a normalized optical dispersion $$\Delta n_i = n_i(\lambda_0) - n_i(\lambda_0 + 1 \text{ pm})$$

for a wavelength variation of 1 pm from a wavelength $\lambda_0$, wherein the objective satisfies:

$$\frac{\left|\sum_{i=1}^{N} \Delta n_i (s_i - d_i)\right|}{\lambda_0 NA^4} \leq A$$

for any ray of an axial ray bundle originating from a field point on an optical axis in the object field;

where $s_i$ is a geometrical path length of a ray in an ith dioptric optical element having axial thickness $d_i$ and the sum $$\sum_{i=1}^{N} \Delta n_i (s_i - d_i)$$

extends on all dioptric optical elements of the objective, and where $$A=0.2.$$

2. The objective according to claim 1, wherein A=0.1.

3. The objective according to claim 1, wherein dioptric optical elements in an image-side end portion of the objective adjacent to the image surface have a substantially aplanatic construction.

4. The objective according to claim 1, wherein the optical elements form:
   a first objective part configured to image the pattern from the object surface into a first intermediate image, and having a first pupil surface;
   a second objective part configured to image the first intermediate image into a second intermediate image, and having a second pupil surface optically conjugate to the first pupil surface,
   a third objective part configured to image the second intermediate image into the image surface, and having a third pupil surface optically conjugate to the first and second pupil surface.

5. The objective according to claim 4, wherein a maximum value of pupil distortion, $PD_{MAX}=\text{Max}(D_P)$ within the third objective part is less than 20%, where a normalized pupil distortion $D_P=V/NA^3$ and where V is a pupil distortion at a maximum value of image-side NA for which the objective is sufficiently corrected, where V at a given position is given by a difference between an actual ray height RH and a paraxial ray height PRH, normalized by the paraxial ray height PRH according to V=(RH−PRH)/PRH.

6. The objective according to claim 4, wherein the plurality of optical elements are arranged along an optical axis, the second objective part includes a single concave mirror optically close to the second pupil surface, a first folding mirror is arranged optically close to the first intermediate image to reflect radiation coming from the object surface toward the concave mirror, a second folding mirror is arranged optically close to the second intermediate image to reflect radiation coming from the concave mirror toward the image surface, L1 is a first length measured along the optical axis between the object surface and an intersection of the optical axis with the first deflecting mirror, L3 is a third length measured along the optical axis between an intersection of the optical axis with the second deflecting mirror and the image surface, and a length ratio L1/L3 between the first length and the third length is smaller than 0.8.

7. The objective according to claim 4, wherein the second objective part includes a concave mirror having a reflective mirror surface positioned at or close to the second pupil surface, and a lens group with negative refracting power immediately in front of the concave mirror and coaxial with the concave mirror and passed twice by radiation.

8. The objective according to claim 4, wherein an aperture stop defining an effective image side numerical aperture NA of the objective is arranged at the first pupil surface or at the second pupil surface.

9. The objective according to claim 1, wherein the objective includes a concave mirror arranged at or optically close to a pupil surface of the objective and a negative group comprising at least one negative lens arranged in front of the concave mirror on a reflecting side thereof in a double pass region such that radiation passes at least twice in opposite directions through the negative group.

10. The objective according to claim 1, wherein the objective is configured as an immersion objective with image-side numerical aperture NA≧1 when used in conjunction with an immersion liquid in an image-side working space between an exit surface of the objective and the image surface during operation.

11. The objective according to claim 1, wherein the objective has an immersion lens group having a convex object-side entry surface bounding at a gas or vacuum and an image-side exit surface in contact with an immersion liquid in operation, wherein the immersion lens group is at least partly made of a high-index material with refractive index n≧1.6 at the wavelength λ.

12. The objective according to claim 11, wherein the immersion lens group is a monolithic plano-convex lens made of the high-index material.

13. The objective according to claim 12, wherein the high-index material is chosen from the group consisting of aluminum oxide ($Al_2O_3$), beryllium oxide (BeO), magnesium aluminum oxide ($MgAlO_4$, spinel), yttrium aluminium oxide ($Y_3Al_5O_{12}$), yttrium oxide ($Y_2O_3$), lanthanum fluoride ($LaF_3$), lutetium aluminium garnet (LuAG), magnesium oxide (MgO), calcium oxide (CaO), lithium barium fluoride ($LiBaF_3$).

14. The objective according to claim 1, wherein $NA/n_I>0.8$, where NA is the image-side numerical aperture and $n_I$ is the refractive index of the image space.

15. The objective according to claim 1, wherein the objective has an image-side numerical aperture NA≧1.35.

16. The objective according to claim 1, wherein a maximum angle of incidence on an optical surface of an imaging objective part imaging a last intermediate image onto the image surface fulfils:

$$\sin(i_{MAX})<E*NA/n_I,$$

wherein NA is the image-side numerical aperture, $n_I$ is the refractive index in an image space, and E=0.95.

17. The objective according to claim 1, wherein the objective is a projection objective for microlithography.

18. An objective comprising:
    a plurality of optical elements arranged to image a pattern from an object field in an object surface of the objective to an image field in an image surface region of the objective at an image-side numerical aperture NA>0.8 with electromagnetic radiation from a wavelength band around a wavelength λ,
    the optical elements including optical elements forming a focussing lens group imaging a field surface closest to the image surface onto the image surface,
    wherein a maximum value of pupil distortion, $PD_{MAX}=\text{Max}(D_P)$ within the focusing lens group is less than 20%, where a normalized pupil distortion $D_P=V/NA^3$ and where V is a pupil distortion at a maximum value of image-side NA for which the objective is sufficiently corrected, where V at a given position is given by a difference between an actual ray height RH and a paraxial ray height PRH, normalized by the paraxial ray height PRH according to V=(RH−PRH)/PRH.

19. The objective according to claim 18, wherein $PD_{MAX}<15\%$.

20. The objective according to claim 18, wherein the optical elements include a number N of dioptric optical elements, each dioptric optical element i made from a transparent material having a normalized optical dispersion $$\Delta n_i = n_i(\lambda_0) - n_i(\lambda_0 + 1 \text{ pm})$$

for a wavelength variation of 1 pm from a wavelength $\lambda_0$, wherein the objective satisfies:

$$\frac{\left|\sum_{i=1}^{N} \Delta n_i(s_i - d_i)\right|}{\lambda_0 NA^4} \leq A$$

for any ray of an axial ray bundle originating from a field point on an optical axis in the object field;

where $s_i$ is a geometrical path length of a ray in an ith dioptric optical element having axial thickness $d_i$ and the sum $$\sum_{i=1}^{N} \Delta n_i(s_i - d_i)$$

extends on all dioptric optical elements of the objective, and where $A = 0.2$.

21. The objective according to claim 20, where $A=0.1$.

22. The objective according to claim 18, wherein dioptric optical elements in an image-side end portion of the objective adjacent to the image surface have a substantially aplanatic construction.

23. The objective according to claim 18, wherein the optical elements form:
a first objective part configured to image the pattern from the object surface into a first intermediate image, and having a first pupil surface;
a second objective part configured to image the first intermediate image into a second intermediate image, and having a second pupil surface optically conjugate to the first pupil surface,
a third objective part configured to image the second intermediate image into the image surface, and having a third pupil surface optically conjugate to the first and second pupil surface.

24. The objective according to claim 23, wherein the second objective part includes a concave mirror having a reflective mirror surface positioned at or close to the second pupil surface, and a lens group with negative refracting power immediately in front of the concave mirror and coaxial with the concave mirror and passed twice by radiation.

25. The objective according to claim 23, wherein an aperture stop defining an effective image side numerical aperture NA of the objective is arranged at the first pupil surface or at the second pupil surface.

26. The objective according to claim 18, wherein the objective includes a concave mirror arranged at or optically close to a pupil surface of the objective and a negative group comprising at least one negative lens arranged in front of the concave mirror on a reflecting side thereof in a double pass region such that radiation passes at least twice in opposite directions through the negative group.

27. The objective according to claim 18, wherein the objective is configured as an immersion objective with image-side numerical aperture $NA \geq 1$ when used in conjunction with an immersion liquid in an image-side working space between an exit surface of the objective and the image surface during operation.

28. The objective according to claim 18, wherein the objective has an immersion lens group having a convex object-side entry surface bounding at a gas or vacuum and an image-side exit surface in contact with an immersion liquid in operation, wherein the immersion lens group is at least partly made of a high-index material with refractive index $n \geq 1.6$ at the wavelength $\lambda$.

29. The objective according to claim 28, wherein the immersion lens group is a monolithic plano-convex lens made of the high-index material.

30. The objective according to claim 29, wherein the high-index material is chosen from the group consisting of aluminum oxide ($Al_2O_3$), beryllium oxide (BeO), magnesium aluminum oxide ($MgAlO_4$, spinel), yttrium aluminium oxide ($Y_3Al_5O_{12}$), yttrium oxide ($Y_2O_3$), lanthanum fluoride ($LaF_3$), lutetium aluminium garnet (LuAG), magnesium oxide (MgO), calcium oxide (CaO), lithium barium fluoride ($LiBaF_3$).

31. The objective according to claim 18, wherein $NA/n_I > 0.8$, where NA is the image-side numerical aperture and $n_I$ is the refractive index of the image space.

32. The objective according to claim 18, wherein the objective has an image-side numerical aperture $NA \geq 1.35$.

33. The objective according to claim 18, wherein a maximum angle of incidence on an optical surface of the focussing lens group fulfils:

$\sin(i_{MAX}) < E^*NA/n_I$, wherein NA is the image-side numerical aperture, $n_I$ is the refractive index in an image space, and $E=0.95$.

34. The objective according to claim 18, wherein the objective is a projection objective for microlithography.

35. A projection exposure apparatus configured to expose a radiation-sensitive substrate arranged in a region of an image surface of a projection objective with at least one image of a pattern of a mask that is arranged in a region of an object surface of the projection objective, comprising:
a radiation source emitting ultraviolet radiation from a wavelength band around a wavelength $\lambda$;
an illumination system receiving the radiation from the radiation source and shaping illumination radiation directed onto the pattern of the mask; and
a projection objective according to claim 1.

36. The projection exposure apparatus according to claim 35, wherein $\lambda < 260$ nm and wherein a value Full Width at Half Maximum FWHM of the radiation source is greater than 0.5 pm.

37. The projection exposure apparatus according to claim 36, wherein the radiation source is a laser emitting at about $\lambda = 193$ nm.

38. The projection exposure apparatus according to claim 37, wherein $FWHM \geq 1$ pm.

39. A projection exposure apparatus configured to expose a radiation-sensitive substrate arranged in a region of an image surface of a projection objective with at least one image of a pattern of a mask that is arranged in a region of an object surface of the projection objective, comprising:
a radiation source emitting ultraviolet radiation from a wavelength band around a wavelength $\lambda$;
an illumination system receiving the radiation from the radiation source and shaping illumination radiation directed onto the pattern of the mask; and
a projection objective according to claim 18.

40. The projection exposure apparatus according to claim 39, wherein $\lambda < 260$ nm and wherein a value Full Width at Half Maximum FWHM of the radiation source is greater than 0.5 pm.

41. The projection exposure apparatus according to claim 40, wherein the radiation source is a laser emitting at about $\lambda = 193$ nm.

42. The projection exposure apparatus according to claim 41, wherein $FWHM \geq 1$ pm.

* * * * *

UNITED STATES PATENT AND TRADEMARK OFFICE
CERTIFICATE OF CORRECTION

PATENT NO. : 8,345,350 B2  Page 1 of 1
APPLICATION NO. : 12/621239
DATED : January 1, 2013
INVENTOR(S) : Epple et al.

It is certified that error appears in the above-identified patent and that said Letters Patent is hereby corrected as shown below:

In the Drawings

Drawing Sheet 21 of 25, Fig. 10D: delete "(SpheroChromatizm)" and insert -- (SpheroChromatism) --

In the Specification

Column 2, Line 66: delete "correaction" and insert -- correction --
Column 5, Line 16: delete "correaction" and insert -- correction --
Column 13, Line 17: delete "linerarily" and insert -- linearly --
Column 16, Lines 32-33: delete "correaction" and insert -- correction --
Column 18, Line 29: delete "correaction" and insert -- correction --
Column 22, Line 31: delete "spinell)," and insert -- spinel), --
Column 27, Line 35: delete "correaction" and insert -- correction --
Column 28, Line 56: delete "my" and insert -- may --
Column 39, Line 5: delete "SPINELL" and insert -- SPINEL --

Signed and Sealed this
Eighteenth Day of March, 2014

Michelle K. Lee
*Deputy Director of the United States Patent and Trademark Office*